US012748056B2

(12) United States Patent
Onose et al.

(10) Patent No.: US 12,748,056 B2
(45) Date of Patent: Sep. 29, 2026

(54) MODULAR AUTOENCODER MODEL FOR MANUFACTURING PROCESS PARAMETER ESTIMATION

(71) Applicant: ASML Netherlands B.V., Veldhoven (NL)

(72) Inventors: Alexandru Onose, Eindhoven (NL); Bart Jacobus Martinus Tiemersma, Maasbracht (NL); Nick Verheul, Den Bosch (NL); Remco Dirks, Deurne (NL)

(73) Assignee: ASML Netherlands B.V., Veldhoven (NL)

( * ) Notice: Subject to any disclaimer, the term of this patent is extended or adjusted under 35 U.S.C. 154(b) by 593 days.

(21) Appl. No.: 18/259,354

(22) PCT Filed: Dec. 20, 2021

(86) PCT No.: PCT/EP2021/086776
§ 371 (c)(1),
(2) Date: Jun. 26, 2023

(87) PCT Pub. No.: WO2022/144203
PCT Pub. Date: Jul. 7, 2022

(65) Prior Publication Data

US 2024/0061347 A1 Feb. 22, 2024

(30) Foreign Application Priority Data

Dec. 30, 2020 (EP) .................................... 20217883
Dec. 30, 2020 (EP) .................................... 20217886
(Continued)

(51) Int. Cl.
*G01N 21/95* (2006.01)
*G03F 7/00* (2006.01)
(Continued)

(52) U.S. Cl.
CPC ..... *G01N 21/9501* (2013.01); *G03F 7/70616* (2013.01); *G03F 7/70625* (2013.01);
(Continued)

(58) Field of Classification Search
USPC .......................................................... 702/40
See application file for complete search history.

(56) References Cited

U.S. PATENT DOCUMENTS 6,952,253 B2 10/2005 Lof et al.
7,701,577 B2 4/2010 Straaijer et al.
(Continued)

FOREIGN PATENT DOCUMENTS

CN 111582468 A 8/2020
CN 111615676 A 9/2020
(Continued)

OTHER PUBLICATIONS

International Search Report and Written Opinion of the International Searching Authority directed to International Patent Application No. PCT/EP2021/086776, mailed Apr. 7, 2022; 10 pages.
(Continued)

*Primary Examiner* — Paul D Lee
(74) *Attorney, Agent, or Firm* — FINNEGAN, HENDERSON, FARABOW, GARRETT & DUNNER LLP

(57) ABSTRACT

A modular autoencoder model is described. The modular autoencoder model comprises input models configured to process one or more inputs to a first level of dimensionality suitable for combination with other inputs; a common model configured to: reduce a dimensionality of combined processed inputs to generate low dimensional data in a latent space; and expand the low dimensional data in the latent space into one or more expanded versions of the one or more inputs suitable for generating one or more different outputs;
(Continued)

output models configured to use the one or more expanded versions of the one or more inputs to generate the one or more different outputs, the one or more different outputs being approximations of the one or more inputs; and a prediction model configured to estimate one or more parameters based on the low dimensional data in the latent space.

15 Claims, 18 Drawing Sheets

(30) Foreign Application Priority Data

| | | | |
|---|---|---|---|
| Dec. 30, 2020 | (EP) | ..................................... | 20217888 |
| Apr. 15, 2021 | (EP) | ..................................... | 21168585 |
| Apr. 15, 2021 | (EP) | ..................................... | 21168592 |
| Apr. 18, 2021 | (EP) | ..................................... | 21169035 |
| Jul. 27, 2021 | (EP) | ..................................... | 21187893 |

(51) Int. Cl.

| | |
|---|---|
| ***G06N 3/0455*** | (2023.01) |
| ***G06N 3/08*** | (2023.01) |
| ***G06N 3/0895*** | (2023.01) |
| *G06N 3/045* | (2023.01) |
| *G06N 3/088* | (2023.01) |

(52) U.S. Cl.

CPC ..... *G03F 7/706839* (2023.05); *G06N 3/0455* (2023.01); *G06N 3/08* (2013.01); *G06N 3/0895* (2023.01); *G06N 3/045* (2023.01); *G06N 3/088* (2013.01)

(56) References Cited

U.S. PATENT DOCUMENTS

| | | | |
|---|---|---|---|
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaljer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 10,346,740 | B2 | 7/2019 | Zhang et al. |
| 11,086,299 | B2 | 8/2021 | Kolouri et al. |
| 11,556,060 | B2 | 1/2023 | Mossavat et al. |
| 2004/0207824 | A1 | 10/2004 | Lof et al. |
| 2007/0296960 | A1 | 12/2007 | Den Boef et al. |
| 2008/0198380 | A1 | 8/2008 | Straaljer et al. |
| 2009/0168062 | A1 | 7/2009 | Straaljer |
| 2010/0007863 | A1 | 1/2010 | Jordanoska |
| 2010/0328655 | A1 | 12/2010 | Den Boef |
| 2011/0026032 | A1 | 2/2011 | Den Boef et al. |
| 2011/0032500 | A1 | 2/2011 | Straaijer |
| 2011/0102753 | A1 | 5/2011 | Van De Kerkhof et al. |
| 2011/0102793 | A1 | 5/2011 | Straaljer |
| 2011/0188020 | A1 | 8/2011 | Den Boef |
| 2011/0249244 | A1 | 10/2011 | Leewis et al. |
| 2012/0044470 | A1 | 2/2012 | Smilde et al. |
| 2012/0044495 | A1 | 2/2012 | Straaijer |
| 2013/0162996 | A1 | 6/2013 | Straaijer et al. |
| 2013/0308142 | A1 | 11/2013 | Straaijer |
| 2016/0161863 | A1 | 6/2016 | Den Boef et al. |
| 2016/0370717 | A1 | 12/2016 | Den Boef et al. |
| 2019/0294149 | A1* | 9/2019 | Kolouri ................ G06V 10/764 |
| 2020/0110341 | A1 | 4/2020 | Mossavat et al. |
| 2020/0151538 | A1 | 5/2020 | Sha et al. |
| 2022/0198280 | A1* | 6/2022 | Yoon ...................... G06N 3/047 |
| 2022/0309292 | A1* | 9/2022 | Albrecht ............... G06F 18/241 |
| 2022/0318623 | A1* | 10/2022 | Dehaene ................ G06N 3/047 |

FOREIGN PATENT DOCUMENTS

| | | | |
|---|---|---|---|
| EP | 1628164 | B1 | 10/2010 |
| TW | 202026859 | A | 7/2020 |
| WO | 2011012624 | A1 | 2/2011 |
| WO | 2020182468 | A1 | 9/2020 |
| WO | 2021043551 | A1 | 3/2021 |
| WO | 2022144203 | A1 | 7/2022 |
| WO | 2022144204 | A1 | 7/2022 |

OTHER PUBLICATIONS

International Preliminary Report on Patentability directed to International Patent Application No. PCT/EP2021/086776, issued Jul. 4, 2023; 8 pages.

International Search Report and Written Opinion of the International Searching Authority directed to International Patent Application No. PCT/EP2021/086783, mailed Apr. 4, 2022; 11 pages.

International Preliminary Report on Patentability directed to International Patent Application No. PCT/EP2021/086783, issued Jul. 4, 2023; 9 pages.

International Search Report and Written Opinion of the International Searching Authority directed to International Patent Application No. PCT/EP2021/086782, mailed Apr. 7, 2022; 12 pages.

International Preliminary Report on Patentability directed to International Patent Application No. PCT/EP2021/086782, issued Jul. 4, 2023; 10 pages.

McInnes et al., "UMAP: Uniform Manifold Approximation and Projection for Dimension Reduction," Journal of Open Source Software, vol. 3, No. 29, Sep. 21, 2020; 63 pages.

Van Der Maaten et al., "Visualizing Data using t-SNE," Journal of Machine Learning Research, vol. 9, Nov. 2008; pp. 2579-2605.

Visschers et al., "Rapid parameter estimation of discrete decaying signals using autoencoder networks," Machine Learning: Science and Technology, vol. 2, No. 4. Sep. 21, 2021; pp. 1-12.

Tonolini et al., "Variational Inference for Computational Imaging Inverse Problems," Journal of Machine Learning Research, vol. 21, No. 1, Jan. 1, 2020; pp. 1-46.

Pakravan et al., "Solving Inverse-PDE Problems with Physics-Aware Neural Networks," Journal of Computational Physics, vol. 440, Sep. 1, 2021; pp. 1-39.

Takeishi et al., "Knowledge-Based Regularization in Generative Modeling," IJCAI'20: Proceedings of the Twenty-Ninth International Joint Conference on Artificial Intelligence, No. 331, Jan. 7, 2021; 12 pages.

* cited by examiner $$\arg\min \sum_k \left\| I_{ch_k} - \left(\hat{I}_{ch_k}\right)_r \right\|_2^2 + \lambda_1 \| o - (\hat{o})_r \|_p^p + g((c)_r)$$

$$\arg\min \sum_k \| I_{ch_k} - \hat{I}_{ch_k} \|_2^2 + \lambda_1 \| o - \hat{o} \|_p^p + g(c) + \sum_k \left\| \left(\hat{I}_{ch_k}\right)_r - \hat{I}_{ch_k} \right\|_2^2 + \lambda_1 \| (\hat{o})_r - \hat{o} \|_p^p + \lambda_2 \| (\hat{c})_r - \hat{c} \|_p^p + g((c)_r).$$

MODULAR AUTOENCODER MODEL FOR MANUFACTURING PROCESS PARAMETER ESTIMATION

CROSS-REFERENCE TO RELATED APPLICATIONS

This application claims priority of EP application 20217886.9 which was filed on Dec. 30, 2020, EP application 21168585.4 which was filed on Apr. 15, 2021, EP application 20217883.6 which was filed on 30 Dec. 2020, EP application 21169035.9 which was filed on Apr. 18, 2021, EP application 21187893.9 which was filed on Jul. 27, 2021, EP application 20217888.5 which was filed on Dec. 30, 2020, and EP application 21168592.0 which was filed on Apr. 15, 2021 which are incorporated herein in its entirety by reference.

TECHNICAL FIELD

This description relates to methods and systems for estimating manufacturing process parameters with a modular autoencoder model.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance.

To overcome these difficulties, sophisticated fine-tuning steps may be applied to the lithographic projection apparatus and/or design layout. These include, for example, but are not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

SUMMARY

Autoencoders can be configured for use in metrology and/or other solutions for parameter inference and/or for other purposes. This deep learning model architecture is generic and scalable to an arbitrary size and complexity. Autoencoders are configured to compress a high dimensional signal (e.g. pupil images in a semiconductor manufacturing process) to an efficient low dimensional representation of the same signal. Next, parameter inference (i.e. regression) is performed from the low-dimensional representation towards a set of known labels. By first compressing the signal, the inference problem is significantly simplified compared to performing regression on the high dimensional signal directly.

However, it is often difficult to understand the flow of information inside a typical autoencoder. One can reason about the information at the input, at the level of the compressed low dimensional representation, and at the output. One cannot readily interpret the information between these points.

The present modular autoencoder model is less rigid compared to traditional monolithic autoencoder models. The present modular autoencoder model has a greater number of trainable and/or otherwise adjustable components. The modularity of the present model makes it easier to interpret, define, and extend. The complexity of the present model is easily adjusted, and is high enough to model a process that generates the data provided to the model, but low enough to avoid modelling noise or other unwanted characteristics (e.g., the present model is configured to avoid overfitting provided data). As the process (or at least aspects of the process) generating the data is often unknown, choosing an appropriate network complexity usually involves some intuition and trial-and-error. For this reason, it is highly desirable to provide a model architecture that is modular, easy to comprehend, and easy to scale in complexity up and down.

Note that the term autoencoder used in association with the present modular autoencoder model may generally refer to one or more autoencoders configured for partial supervised learning using a latent space for parameter estimation, and/or other autoencoders. This may also include a single autoencoder, which is trained using semi-supervised learning, for example.

According to an embodiment, there is provided a non-transitory computer readable medium having instructions thereon. The instructions are configured to cause a computer to execute a modular autoencoder model for parameter estimation. The modular autoencoder model comprises one or more input models configured to process one or more inputs to a first level of dimensionality suitable for combination with other inputs. The modular autoencoder model comprises a common model configured to: combine the processed inputs and reduce a dimensionality of the combined processed inputs to generate low dimensional data in a latent space, the low dimensional data in the latent space having a second level of resulting reduced dimensionality that is less than the first level; and expand the low dimensional data in the latent space into one or more expanded versions of the one or more inputs, the one or more expanded versions of the one or more inputs having increased dimensionality compared to the low dimensional data in the latent space, the one or more expanded versions of the one or more inputs suitable for generating one or more different outputs. (Note that the expanded versions do not necessarily approximate the inputs to the common model, as the approximation is enforced on the final output.) The modular autoencoder model comprises one or more output models configured to use the one or more expanded versions of the one or more inputs to generate the one or more different outputs, the one or more different outputs being approximations of the one or more inputs, the one or more different outputs having the same or increased dimensionality compared to the expanded versions of the one or more inputs. The modular autoencoder model comprises a prediction model configured to estimate one or more parameters based on the low dimensional data in the latent space and/or the one or more different outputs. In some embodiments, the modular autoencoder model (and/or any of the individual components of the model described herein) may be configured before and/or after seeing training data.

In some embodiments, individual input models and/or output models comprise two or more sub-models, the two or more sub-models associated with different portions of a sensing operation and/or a manufacturing process. In some embodiments, an individual output model comprises the two or more sub-models, and the two or more sub-models comprise a sensor model and a stack model for a semiconductor sensor operation.

In some embodiments, the one or more input models, the common model, and the one or more output models are separate from each other and correspond to process physics differences in different parts of a manufacturing process and/or a sensing operation such that each of the one or more input models, the common model, and/or the one or more output models can be trained together and/or separately, but individually configured based on the process physics for a corresponding part of the manufacturing process and/or sensing operation, apart from other models in the modular autoencoder model.

In some embodiments, a quantity of the one or more input models, and a quantity of the one or more output models are determined based on process physics differences in different parts of a manufacturing process and/or a sensing operation.

In some embodiments, the quantity of input models is different than the quantity of output models.

In some embodiments, the common model comprises encoder-decoder architecture and/or variational encoder-decoder architecture; processing the one or more inputs to the first level of dimensionality, and reducing the dimensionality of the combined processed inputs comprises encoding; and expanding the low dimensional data in the latent space into the one or more expanded versions of the one or more inputs comprises decoding.

In some embodiments, the modular autoencoder model is trained by comparing the one or more different outputs to corresponding inputs, and adjusting a parameterization of the one or more input models, the common model, and/or the one or more output models to reduce or minimize a difference between an output and a corresponding input.

In some embodiments, the common model comprises an encoder and a decoder, and the modular autoencoder model is trained by: applying variation to the low dimensional data in the latent space such that the common model decodes a relatively more continuous latent space to generate a decoder signal; recursively providing the decoder signal to the encoder to generate new low dimensional data; comparing the new low dimensional data to the low dimensional data; and adjusting one or more components of the modular autoencoder model based on the comparison to reduce or minimize a difference between the new low dimensional data and the low dimensional data.

In some embodiments, the one or more parameters are semiconductor manufacturing process parameters; the one or more input models and/or the one or more output models may comprise (as merely non-limiting examples) dense feed-forward layers, convolutional layers, and/or residual network architecture of the modular autoencoder model; the common model may comprise (as merely non-limiting examples) feed forward and/or residual layers; and the prediction model may comprise (as merely non-limiting examples) feed forward and/or residual layers.

According to another embodiment, there is provided a method for parameter estimation. The method comprises processing, with one or more input models of a modular autoencoder model, one or more inputs to a first level of dimensionality suitable for combination with other inputs; combining, with a common model of the modular autoencoder model, the processed inputs and reducing a dimensionality of the combined processed inputs to generate low dimensional data in a latent space, the low dimensional data in the latent space having a second level of resulting reduced dimensionality that is less than the first level; expanding, with the common model, the low dimensional data in the latent space into one or more expanded versions of the one or more inputs, the one or more expanded versions of the one or more inputs having increased dimensionality compared to the low dimensional data in the latent space, the one or more expanded versions of the one or more inputs suitable for generating one or more different outputs; using, with one or more output models of the modular autoencoder model, the one or more expanded versions of the one or more inputs to generate the one or more different outputs, the one or more different outputs being approximations of the one or more inputs, the one or more different outputs having the same or increased dimensionality compared to the expanded versions of the one or more inputs; and estimating, with a prediction model of the modular autoencoder model, one or more parameters based on the low dimensional data in the latent space and/or the one or more outputs. In some embodiments, individual input models and/or output models comprise two or more sub-models, the two or more sub-models associated with different portions of a sensing operation and/or a manufacturing process.

In some embodiments, an individual output model comprises the two or more sub-models, and the two or more sub-models comprise a sensor model and a stack model for a semiconductor sensor operation.

In some embodiments, the one or more input models, the common model, and the one or more output models are separate from each other and correspond to process physics differences in different parts of a manufacturing process and/or a sensing operation such that each of the one or more input models, the common model, and/or the one or more output models can be trained together and/or separately, but individually configured based on the process physics for a corresponding part of the manufacturing process and/or sensing operation, apart from other models in the modular autoencoder model.

In some embodiments, the method further comprises determining a quantity of the one or more input models, and/or a quantity of the one or more output models, based on process physics differences in different parts of a manufacturing process and/or a sensing operation.

In some embodiments, the quantity of input models is different than the quantity of output models.

In some embodiments, the common model comprises encoder-decoder architecture and/or variational encoder-decoder architecture; processing the one or more inputs to the first level of dimensionality, and reducing the dimensionality of the combined processed inputs comprises encoding; and expanding the low dimensional data in the latent space into the one or more expanded versions of the one or more inputs comprises decoding.

In some embodiments, the method further comprises training the modular autoencoder model by comparing the one or more different outputs to corresponding inputs, and adjusting a parameterization of the one or more input models, the common model, and/or the one or more output models to reduce or minimize a difference between an output and a corresponding input.

In some embodiments, the common model comprises an encoder and a decoder, and the method further comprises training the modular autoencoder model by: applying variation to the low dimensional data in the latent space such that the common model decodes a relatively more continuous latent space to generate a decoder signal; recursively providing the decoder signal to the encoder to generate new low dimensional data; comparing the new low dimensional data to the low dimensional data; and adjusting one or more components of the modular autoencoder model based on the comparison to reduce or minimize a difference between the new low dimensional data and the low dimensional data.

In some embodiments, the one or more parameters are semiconductor manufacturing process parameters; the one or more input models and/or the one or more output models may comprise (as merely non-limiting examples) dense feed-forward layers, convolutional layers, and/or residual network architecture of the modular autoencoder model; the common model may comprise (as merely non-limiting examples) feed forward and/or residual layers; and the prediction model may comprise (as merely non-limiting examples) feed forward and/or residual layers.

According to another embodiment, there is provided a system comprising: one or more input models of a modular autoencoder model configured to process one or more inputs to a first level of dimensionality suitable for combination with other inputs; a common model of the modular autoencoder model configured to: combine the processed inputs and reduce a dimensionality of the combined processed inputs to generate low dimensional data in a latent space, the low dimensional data in the latent space having a second level of resulting reduced dimensionality that is less than the first level; and expand the low dimensional data in the latent space into one or more expanded versions of the one or more inputs, the one or more expanded versions of the one or more inputs having increased dimensionality compared to the low dimensional data in the latent space, the one or more expanded versions of the one or more inputs suitable for generating one or more different outputs; one or more output models of the modular autoencoder model configured to use the one or more expanded versions of the one or more inputs to generate the one or more different outputs, the one or more different outputs being approximations of the one or more inputs, the one or more different outputs having the same or increased dimensionality compared to the expanded versions of the one or more inputs; and a prediction model of the modular autoencoder model configured to estimate one or more parameters based on the low dimensional data in the latent space and/or the one or more outputs.

In some embodiments, individual input models and/or output models comprise two or more sub-models, the two or more sub-models associated with different portions of a sensing operation and/or a manufacturing process. In some embodiments, an individual output model comprises the two or more sub-models, and the two or more sub-models comprise a sensor model and a stack model for a semiconductor sensor operation. In some embodiments, the one or more input models, the common model, and the one or more output models are separate from each other and correspond to process physics differences in different parts of a manufacturing process and/or a sensing operation such that each of the one or more input models, the common model, and/or the one or more output models can be trained together and/or separately, but individually configured based on the process physics for a corresponding part of the manufacturing process and/or sensing operation, apart from other models in the modular autoencoder model.

In some embodiments, a quantity of the one or more input models, and a quantity of the one or more output models are determined based on process physics differences in different parts of a manufacturing process and/or a sensing operation.

In some embodiments, the quantity of input models is different than the quantity of output models.

In some embodiments, the common model comprises encoder-decoder architecture and/or variational encoder-decoder architecture; processing the one or more inputs to the first level of dimensionality, and reducing the dimensionality of the combined processed inputs comprises encoding; and expanding the low dimensional data in the latent space into the one or more expanded versions of the one or more inputs comprises decoding.

In some embodiments, the modular autoencoder model is trained by comparing the one or more different outputs to corresponding inputs, and adjusting a parameterization of the one or more input models, the common model, and/or the one or more output models to reduce or minimize a difference between an output and a corresponding input.

In some embodiments, the common model comprises an encoder and a decoder, and the modular autoencoder model is trained by: applying variation to the low dimensional data in the latent space such that the common model decodes a relatively more continuous latent space to generate a decoder signal; recursively providing the decoder signal to the encoder to generate new low dimensional data; comparing the new low dimensional data to the low dimensional data; and adjusting one or more components of the modular autoencoder model based on the comparison to reduce or minimize a difference between the new low dimensional data and the low dimensional data.

In some embodiments, the one or more parameters are semiconductor manufacturing process parameters; the one or more input models and/or the one or more output models may comprise (as merely non-limiting examples) dense feed-forward layers, convolutional layers, and/or residual network architecture of the modular autoencoder model; the common model may comprise (as merely non-limiting examples) feed forward and/or residual layers; and the prediction model may comprise (as merely non-limiting examples) feed forward and/or residual layers.

According to another embodiment, there is provided a non-transitory computer readable medium having instructions thereon. The instructions configured to cause a computer to execute a machine-learning model for parameter estimation. The machine-learning model comprises: one or more first models configured to process one or more inputs to a first level of dimensionality suitable for combination with other inputs; a second model configured to: combine the processed one or more inputs and reduce a dimensionality of the combined processed one or more inputs; expand the combined processed one or more inputs into one or more recovered versions of the one or more inputs, the one or more recovered versions of the one or more inputs suitable for generating one or more different outputs; one or more third models configured to use the one or more recovered versions of the one or more inputs to generate the one or more different outputs; and a fourth model configured to estimate a parameter based on the reduced dimensionality combined compressed inputs and the one or more different outputs. In some embodiments, individual models of the one or more third models comprise two or more sub-models, the two or more sub-models associated with different portions of a manufacturing process and/or sensing operation.

In some embodiments, the two or more sub-models comprise a sensor model and a stack model for a semiconductor manufacturing process.

In some embodiments, the one or more first models, the second model, and the one or more third models are separate from each other and correspond to process physics differences in different parts of a manufacturing process and/or sensing operation such that each of the one or more first models, the second model, and/or the one or more third models can be trained together and/or separately, but individually configured based on the process physics for a corresponding part of the manufacturing process and/or sensing operation, apart from other models in the machine-learning model.

In some embodiments, a quantity of the one or more first models, and a quantity of the one or more third models are determined based on process physics differences in different parts of a manufacturing process and/or sensing operation.

In some embodiments, the number of first models is different that the number of second models.

In some embodiments, the second model comprises encoder-decoder architecture and/or variational encoder-decoder architecture; compressing the one or more inputs comprises encoding; and expanding the combined compressed one or more inputs into one or more recovered versions of the one or more inputs comprises decoding.

In some embodiments, the machine learning model is trained by comparing the one or more different outputs to corresponding inputs, and adjusting the one or more first models, the second model, and/or the one or more third models to reduce or minimize a difference between an output and a corresponding input.

In some embodiments, the second model comprises an encoder and a decoder, and the second model is trained by: applying variation low dimensional data in a latent space such that the second model decodes a relatively more continuous latent space to generate a decoder signal; recursively providing the decoder signal to the encoder to generate new low dimensional data; comparing the new low dimensional data to the low dimensional data; and adjusting the second model based on the comparison to reduce or minimize a difference between the new low dimensional data and the low dimensional data.

In some embodiments, the parameter is a semiconductor manufacturing process parameter; the one or more first models and/or the one or more third models comprise dense feed-forward layers, convolutional layers, and/or residual network architecture of the machine-learning model; the second model comprises feed forward and/or residual layers; and the fourth model comprises feed forward and/or residual layers.

Data driven inference approaches have been proposed for semiconductor metrology operations and used for the task of parameter estimation. They rely on a significant amount of gathered measurements and models that map measured features to parameters of interest, with labels for these parameters obtained via carefully designed targets on a wafer or from third party measurements. Current approaches have the capability to measure a significant number of channels (multiple wavelengths, observations under multiple wafer rotations, four light polarization schemes, etc.). However, due to practical timing constraints, the number of channels needs to be limited to a subset of those available ones for production measurements. For the selection of the best channels, a brute force approach is often used that tests all possible channel combinations. This is time consuming, resulting in long measurement and/or process recipe creation times. Additionally, a brute force approach can be prone to overfitting, introducing a different bias per channel, and/or other disadvantages.

Advantageously, the present modular autoencoder model is configured for estimating parameters of interest from a combination of available channels of measurement data from an optical metrology platform by estimating retrievable quantities of information content using a subset of a plurality of input models based on the available channels. The present model is configured to be trained by randomly or otherwise iteratively varying (e.g., sub-selecting) a number of channels that are used to approximate inputs during iterative training steps. This iterative varying/sub-selection ensures that the model remains predictive/consistent for any combination of input channels. Furthermore, since the information content present in the inputs represents all channels (e.g., because each channel was part of the subset of selected channels for at least one training iteration), the resulting model will not include a bias specific to one particular channel.

Note that the term autoencoder used in association with the present modular autoencoder model may generally refer to one or more autoencoders configured for partial supervised learning using a latent space for parameter estimation, and/or other autoencoders.

According to an embodiment, there is provided a non-transitory computer readable medium having instructions thereon. The instructions are configured to cause a computer to execute a modular autoencoder model for estimating parameters of interest from a combination of available channels of measurement data from an optical metrology platform by estimating retrievable quantities of information content using a subset of a plurality of input models based on the available channels. The instructions cause operations comprising: causing the plurality of input models to compress a plurality of inputs based on the available channels such that the plurality of inputs are suitable for combination with each other; and causing a common model to combine the compressed inputs and generate low dimensional data in a latent space based on the combined compressed inputs, the low dimensional data estimates the retrievable quantities, and the low dimensional data in the latent space is configured to be used by one or more additional models to generate approximations of the plurality of inputs and/or estimate a parameter based on the low dimensional data.

In some embodiments, the instructions cause further operations comprising training the modular autoencoder model by: iteratively varying a subset of compressed inputs to be combined by the common model and used to generate training low dimensional data; comparing one or more training approximations and/or a training parameter generated or predicted based on the training low dimensional data to a corresponding reference; and adjusting one or more of the plurality of input models, the common model, and/or one or more of the additional models based on the comparison to reduce or minimize a difference between the one or more training approximations and/or the training parameter and the reference; such that the common model is configured to combine the compressed inputs and generate the low dimensional data for generating the approximations and/or estimated parameter regardless of which ones of the plurality of inputs are combined by the common model.

In some embodiments, variation for individual iterations is random, or variation for individual iterations is varied in a statistically meaningful way.

In some embodiments, variation for individual iterations is configured such that after a target number of iterations, each of the compressed inputs has been included in the subset of compressed inputs at least once.

In some embodiments, iteratively varying a subset of compressed inputs combined by the common model and used to generate training low dimensional data comprises channel selection from among a set of possible available channels, the set of possible available channels associated with the optical metrology platform.

In some embodiments, the iteratively varying, the comparing, and the adjusting, are repeated until an objective converges.

In some embodiments, the iteratively varying, the comparing, and the adjusting are configured to reduce or eliminate bias that can occur for a combinatorial search across channels.

In some embodiments, the one or more additional models comprise one or more output models configured to generate approximations of the one or more inputs, and a prediction model configured to estimate the parameter based on the low dimensional data, and one or more of the plurality of input models, the common model, and/or the additional models are configured to be adjusted to reduce or minimize a difference between one or more training approximations, and/or a training manufacturing process parameter, and a corresponding reference.

In some embodiments, the plurality of input models, the common model, and the one or more output models are separate from each other and correspond to process physics differences in different parts of a manufacturing process and/or sensing operation such that each of the plurality of input models, the common model, and/or the one or more output models can be trained together and/or separately, but individually configured based on the process physics for a corresponding part of the manufacturing process and/or sensing operation, apart from other models in the modular autoencoder model.

In some embodiments, individual input models comprise a neural network block comprising dense feed-forward layers, convolutional layers, and/or residual network architecture of the modular autoencoder model; and the common model comprises a neural network block comprising feed forward and/or residual layers.

According to another embodiment, there is provided a method for estimating parameters of interest from a combination of available channels of measurement data from an optical metrology platform by estimating retrievable quantities of information content using a subset of a plurality of input models of a modular autoencoder model based on the available channels. The method comprises: causing the plurality of input models to compress a plurality of inputs based on the available channels such that the plurality of inputs are suitable for combination with each other; and causing a common model of the modular autoencoder model to combine the compressed inputs and generate low dimensional data in a latent space based on the combined compressed inputs, the low dimensional data estimates the retrievable quantities, and the low dimensional data in the latent space is configured to be used by one or more additional models to generate approximations of the plurality of inputs and/or estimate a parameter based on the low dimensional data.

In some embodiments, the method further comprises training the modular autoencoder model by: iteratively varying a subset of compressed inputs to be combined by the common model and used to generate training low dimensional data; comparing one or more training approximations and/or a training parameter generated or predicted based on the training low dimensional data to a corresponding reference; and adjusting one or more of the plurality of input models, the common model, and/or one or more of the additional models based on the comparison to reduce or minimize a difference between the one or more training approximations and/or the training parameter and the reference; such that the common model is configured to combine the compressed inputs and generate the low dimensional data for generating the approximations and/or estimated parameter regardless of which ones of the plurality of inputs are combined by the common model.

In some embodiments, variation for individual iterations is random, or variation for individual iterations is varied in a statistically meaningful way.

In some embodiments, variation for individual iterations is configured such that after a target number of iterations, each of the compressed inputs has been included in the subset of compressed inputs at least once.

In some embodiments, iteratively varying a subset of compressed inputs combined by the common model and used to generate training low dimensional data comprises channel selection from among a set of possible available channels, the set of possible available channels associated with the optical metrology platform.

In some embodiments, the iteratively varying, the comparing, and the adjusting, are repeated until an objective converges.

In some embodiments, the iteratively varying, the comparing, and the adjusting are configured to reduce or eliminate bias that can occur for a combinatorial search across channels.

In some embodiments, the one or more additional models comprises one or more output models configured to generate approximations of the one or more inputs, and a prediction model configured to estimate the parameter based on the low dimensional data, and one or more of the plurality of input models, the common model, and/or the additional models are configured to be adjusted to reduce or minimize a difference between one or more training approximations, and/or a training manufacturing process parameter, and a corresponding reference.

In some embodiments, the plurality of input models, the common model, and the one or more output models are separate from each other and correspond to process physics differences in different parts of a manufacturing process and/or sensing operation such that each of the plurality of input models, the common model, and/or the one or more output models can be trained together and/or separately, but individually configured based on the process physics for a corresponding part of the manufacturing process and/or sensing operation, apart from other models in the modular autoencoder model.

In some embodiments, individual input models comprise a neural network block comprising dense feed-forward layers, convolutional layers, and/or residual network architecture of the modular autoencoder model; and the common model comprises a neural network block comprising feed forward and/or residual layers.

According to another embodiment, there is provided a system for estimating parameters of interest from a combination of available channels of measurement data from an optical metrology platform by estimating retrievable quantities of information content using a subset of a plurality of input models of a modular autoencoder model based on the available channels. The system comprises: the plurality of input models, the plurality of input models configured to compress a plurality of inputs based on the available channels such that the plurality of inputs are suitable for combination with each other; and a common model of the modular autoencoder model configured to combine the compressed inputs and generate low dimensional data in a latent space based on the combined compressed inputs, the low dimensional data estimates the retrievable quantities, and the low dimensional data in the latent space is configured to be used by one or more additional models to generate approximations of the plurality of inputs and/or estimate a parameter based on the low dimensional data.

In some embodiments, the modular autoencoder model is configured to be trained by: iteratively varying a subset of compressed inputs to be combined by the common model and used to generate training low dimensional data; comparing one or more training approximations and/or a training parameter generated or predicted based on the training low dimensional data to a corresponding reference; and adjusting one or more of the plurality of input models, the common model, and/or one or more of the additional models based on the comparison to reduce or minimize a difference between the one or more training approximations and/or the training parameter and the reference; such that the common model is configured to combine the compressed inputs and generate the low dimensional data for generating the approximations and/or estimated parameter regardless of which ones of the plurality of inputs are combined by the common model.

In some embodiments, variation for individual iterations is random, or variation for individual iterations is varied in a statistically meaningful way.

In some embodiments, variation for individual iterations is configured such that after a target number of iterations, each of the compressed inputs has been included in the subset of compressed inputs at least once.

In some embodiments, iteratively varying a subset of compressed inputs combined by the common model and used to generate training low dimensional data comprises channel selection from among a set of possible available channels, the set of possible available channels associated with the optical metrology platform.

In some embodiments, the iteratively varying, the comparing, and the adjusting, are repeated until an objective converges.

In some embodiments, the iteratively varying, the comparing, and the adjusting are configured to reduce or eliminate bias that can occur for a combinatorial search across channels.

In some embodiments, the one or more additional models comprise one or more output models configured to generate approximations of the one or more inputs, and a prediction model configured to estimate the parameter based on the low dimensional data, and one or more of the plurality of input models, the common model, and/or the additional models are configured to be adjusted to reduce or minimize a difference between one or more training approximations, and/or a training manufacturing process parameter, and a corresponding reference.

In some embodiments, the plurality of input models, the common model, and the one or more output models are separate from each other and correspond to process physics differences in different parts of a manufacturing process and/or sensing operation such that each of the plurality of input models, the common model, and/or the one or more output models can be trained together and/or separately, but individually configured based on the process physics for a corresponding part of the manufacturing process and/or sensing operation, apart from other models in the modular autoencoder model.

In some embodiments, individual input models comprise a neural network block comprising dense feed-forward layers, convolutional layers, and/or residual network architecture of the modular autoencoder model; and the common model comprises a neural network block comprising feed forward and/or residual layers.

According to another embodiment, there is provided a non-transitory computer readable medium having instructions thereon, the instructions configured to cause a computer to execute a modular autoencoder model for parameter estimation. The instructions cause operations comprising: causing a plurality of input models to compress a plurality of inputs such that the plurality of inputs are suitable for combination with each other; and causing a common model to combine the compressed inputs and generate low dimensional data in a latent space based on the combined compressed inputs, the low dimensional data in the latent space configured to be used by one or more additional models to generate approximations of the one or more inputs and/or predict the parameter based on the low dimensional data, where the common model is configured to combine the compressed inputs and generate the low dimensional data regardless of which ones of the plurality of inputs are combined by the common model.

In some embodiments, the instructions cause further operations comprising training the modular autoencoder by: iteratively varying a subset of compressed inputs to be combined by the common model and used to generate training low dimensional data; comparing one or more training approximations and/or a training parameter generated or estimated based on the training low dimensional data to a corresponding reference; and adjusting one or more of the plurality of input models, the common model, and/or the additional models based on the comparison to reduce or minimize a difference between the one or more training approximations, and/or the training parameter, and the reference; such that the common model is configured to combine the compressed inputs and generate the low dimensional data for generating the approximations and/or estimating a process parameter regardless of which ones of the plurality of inputs are combined by the common model.

In some embodiments, variation for individual iterations is random, or variation for individual iterations is varied in a statistically meaningful way. In some embodiments, variation for individual iterations is configured such that after a target number of iterations, each of the compressed inputs has been included in the subset of compressed inputs at least once.

In some embodiments, the one or more additional models comprises one or more output models configured to generate approximations of the one or more inputs, and a prediction model configured to estimate a parameter based on the low dimensional data, and adjusting one or more of the plurality of input models, the common model, and/or the additional models based on the comparison to reduce or minimize a difference between the one or more training approximations and/or the training parameter, and the reference, comprises adjusting at least one output model and/or the prediction model.

In some embodiments, the plurality of input models, the common model, and the one or more output models are separate from each other and correspond to process physics differences in different parts of a manufacturing process and/or sensing operation such that each of the plurality of input models, the common model, and/or the one or more output models can be trained together and/or separately, but individually configured based on the process physics for a corresponding part of the manufacturing process and/or sensing operation, apart from other models in the modular autoencoder model.

In some embodiments, iteratively varying a subset of compressed inputs combined by the common model and used to generate training low dimensional data comprises channel selection from among a set of possible channels, the set of possible channels associated with one or more aspects of a semiconductor manufacturing process and/or sensing operation.

In some embodiments, the iteratively varying, the comparing, and the adjusting are repeated until an objective converges.

In some embodiments, the iteratively varying, the comparing, and the adjusting are configured to reduce or eliminate bias relative to a bias that can occur for a combinatorial search across channels.

In some embodiments, the parameter is a semiconductor manufacturing process parameter; individual input models comprise a neural network block comprising dense feed-forward layers, convolutional layers, and/or residual network architecture of the modular autoencoder model; and the common model comprises a neural network block comprising feed forward and/or residual layers.

In semiconductor manufacturing, optical metrology may be used to measure critical stack parameters directly on product (e.g., patterned wafer) structures. Machine-learning methods are often applied on top of optical scatterometry data acquired using a metrology platform. These machine-learning methods conceptually amount to supervised learning approaches, i.e. learning from labeled datasets. The success of such methods is strongly dependent on the quality of the labels. Often, labeled datasets are created by measuring and labelling known targets on a wafer.

One of the primary challenges of using targets in this way is the fact that they only provide very accurate relative labels. This means that within one cluster of targets, there is some unknown cluster bias, on top of which accurate labels are known. Determining this unknown cluster bias, and hence obtaining absolute labels, is important to the accuracy of target-based recipes. The procedure of estimating the cluster bias is usually referred to as label correction.

Advantageously, the present modular autoencoder model is configured such that known properties of inputs (e.g., domain knowledge) can be embedded into the model during the training phase, which reduces or eliminates any such bias in subsequent inferences made by the model. In other words, the present modular autoencoder is configured such that known (e.g., symmetry) properties of inputs are embedded into the decoding part of the model, and these embedded known properties allow the model to make bias free inferences.

Note that the term autoencoder used in association with the present modular autoencoder model may generally refer to one or more autoencoders configured for partial supervised learning using a latent space for parameter estimation, and/or other autoencoders.

According to an embodiment, there is provided a non-transitory computer readable medium having instructions thereon. The instructions are configured to cause a computer to execute a modular autoencoder model with an extended range of applicability for estimating parameters of interest for optical metrology operations by enforcing known properties of inputs to the modular autoencoder model in a decoder of the modular autoencoder model. The instructions cause operations comprising: causing an encoder of the modular autoencoder model to encode an input to generate a low dimensional representation of the input in a latent space; and causing the decoder of the modular autoencoder model to generate an output corresponding to the input by decoding the low dimensional representation. The decoder is configured to enforce, during decoding, a known property of the encoded input to generate the output. The known property is associated with a known physical relationship between the low dimensional representation in the latent space and the output. A parameter of interest is estimated based on the output and/or the low dimensional representation of the input in the latent space.

In some embodiments, enforcing comprises penalizing differences between the output and an output that should be generated according to the known property using a penalty term in a cost function associated with the decoder.

In some embodiments, the penalty term comprises a difference between decoded versions of the low dimensional representation of the input which are related to each other through physical priors.

In some embodiments, the known property is a known symmetry property, and the penalty term comprises a difference between decoded versions of the low dimensional representation of the input which are reflected across, or rotated around, a point of symmetry, relative to each other.

In some embodiments, the encoder and/or the decoder are configured to be adjusted based on any differences between the decoded versions of the low dimensional representation, and adjusting comprises adjusting at least one weight associated with a layer of the encoder and/or the decoder.

In some embodiments, the input comprises a sensor signal associated with a sensing operation in a semiconductor manufacturing process, the low dimensional representation of the input is a compressed representation of the sensor signal, and the output is an approximation of the input sensor signal.

In some embodiments, the sensor signal comprises a pupil image, and an encoded representation of the pupil image is configured to be used to estimate overlay (as one example of many possible parameters of interest).

In some embodiments, the instructions cause further operations comprising: processing, with an input model of the modular autoencoder model, the input to a first level of dimensionality suitable for combination with other inputs, and providing the processed input to the encoder; receiving, with an output model of the modular autoencoder model, an expanded version of the input from the decoder and generating an approximation of the input based on the expanded version; and estimating, with a prediction model of the modular autoencoder model, the parameter of interest based on the low dimensional representation of the input in the latent space and/or the output (the output comprising and/or being related to the approximation of the input).

In some embodiments, the input model, the encoder/decoder, and the output model are separate from each other and correspond to process physics differences in different parts of a manufacturing process and/or a sensing operation such that each of the input model, the encoder/decoder, and/or the output model can be trained together and/or separately, but individually configured based on the process physics for a corresponding part of the manufacturing process and/or sensing operation, apart from other models in the modular autoencoder model.

In some embodiments, the decoder is configured to enforce a known symmetry property of the encoded input during a training phase, such that the modular autoencoder model obeys the enforced known symmetry property during an inference phase.

In some embodiments, there is provided a method for estimating, with a modular autoencoder model having an extended range of applicability, parameters of interest for optical metrology operations by enforcing known properties of inputs to the modular autoencoder model in a decoder of the modular autoencoder model. The method comprises: causing an encoder of the modular autoencoder model to encode an input to generate a low dimensional representation of the input in a latent space; and causing the decoder of the modular autoencoder model to generate an output corresponding to the input by decoding the low dimensional representation. The decoder is configured to enforce, during decoding, a known property of the encoded input to generate the output. The known property is associated with a known physical relationship between the low dimensional representation in the latent space and the output. A parameter of interest is estimated based on the output and/or the low dimensional representation of the input in the latent space.

In some embodiments, enforcing comprises penalizing differences between the output and an output that should be generated according to the known property using a penalty term in a cost function associated with the decoder.

In some embodiments, the penalty term comprises a difference between decoded versions of the low dimensional representation of the input which are related to each other through physical priors.

In some embodiments, the known property is a known symmetry property, and the penalty term comprises a difference between decoded versions of the low dimensional representation of the input which are reflected across, or rotated around, a point of symmetry, relative to each other.

In some embodiments, the encoder and/or the decoder are configured to be adjusted based on any differences between the decoded versions of the low dimensional representation, and adjusting comprises adjusting at least one weight associated with a layer of the encoder and/or the decoder.

In some embodiments, the input comprises a sensor signal associated with a sensing operation in a semiconductor manufacturing process, the low dimensional representation of the input is a compressed representation of the sensor signal, and the output is an approximation of the input sensor signal.

In some embodiments, the sensor signal comprises a pupil image, and an encoded representation of the pupil image is configured to be used to estimate overlay (as one example of many possible parameters of interest).

In some embodiments, the method further comprises processing, with an input model of the modular autoencoder model, the input to a first level of dimensionality suitable for combination with other inputs, and providing the processed input to the encoder; receiving, with an output model of the modular autoencoder model, an expanded version of the input from the decoder and generating an approximation of the input based on the expanded version; and estimating, with a prediction model of the modular autoencoder model, the parameter of interest based on the low dimensional representation of the input in the latent space and/or the output (the output comprising and/or being related to the approximation of the input).

In some embodiments, the input model, the encoder/decoder, and the output model are separate from each other and correspond to process physics differences in different parts of a manufacturing process and/or a sensing operation such that each of the input model, the encoder/decoder, and/or the output model can be trained together and/or separately, but individually configured based on the process physics for a corresponding part of the manufacturing process and/or sensing operation, apart from other models in the modular autoencoder model.

In some embodiments, the decoder is configured to enforce a known symmetry property of the encoded input during a training phase, such that the modular autoencoder model obeys the enforced known symmetry property during an inference phase.

According to another embodiment, there is provided a system configured to execute a modular autoencoder model with an extended range of applicability for estimating parameters of interest for optical metrology operations by enforcing known properties of inputs to the modular autoencoder model in a decoder of the modular autoencoder model. The system comprises: an encoder of the modular autoencoder model configured to encode an input to generate a low dimensional representation of the input in a latent space; and the decoder of the modular autoencoder model, the decoder configured to generate an output corresponding to the input by decoding the low dimensional representation. The decoder is configured to enforce, during decoding, a known property of the encoded input to generate the output. The known property is associated with a known physical relationship between the low dimensional representation in the latent space and the output. A parameter of interest is estimated based on the output and/or the low dimensional representation of the input in the latent space.

In some embodiments, enforcing comprises penalizing differences between the output and an output that should be generated according to the known property using a penalty term in a cost function associated with the decoder.

In some embodiments, the penalty term comprises a difference between decoded versions of the low dimensional representation of the input which are related to each other through physical priors.

In some embodiments, the known property is a known symmetry property, and the penalty term comprises a difference between decoded versions of the low dimensional representation of the input which are reflected across, or rotated around, a point of symmetry, relative to each other.

In some embodiments, the encoder and/or the decoder are configured to be adjusted based on any differences between the decoded versions of the low dimensional representation, and adjusting comprises adjusting at least one weight associated with a layer of the encoder and/or the decoder.

In some embodiments, the input comprises a sensor signal associated with a sensing operation in a semiconductor manufacturing process, the low dimensional representation of the input is a compressed representation of the sensor signal, and the output is an approximation of the input sensor signal.

In some embodiments, the sensor signal comprises a pupil image, and an encoded representation of the pupil image is configured to be used to estimate overlay (as one example of many possible parameters of interest).

In some embodiments, the system further comprises: an input model of the modular autoencoder model configured to process the input to a first level of dimensionality suitable for combination with other inputs, and provide the processed input to the encoder; an output model of the modular autoencoder model configured to receive an expanded version of the input from the decoder and generate an approximation of the input based on the expanded version; and a prediction model of the modular autoencoder model configured to estimate the parameter of interest based on the low dimensional representation of the input in the latent space.

In some embodiments, the input model, the encoder/decoder, and the output model are separate from each other and correspond to process physics differences in different parts of a manufacturing process and/or a sensing operation such that each of the input model, the encoder/decoder, and/or the output model can be trained together and/or separately, but individually configured based on the process physics for a corresponding part of the manufacturing process and/or sensing operation, apart from other models in the modular autoencoder model.

In some embodiments, the decoder is configured to enforce a known symmetry property of the encoded input during a training phase, such that the modular autoencoder model obeys the enforced known symmetry property during an inference phase.

In some embodiments, there is provided a non-transitory computer readable medium having instructions thereon, the instructions configured to cause a computer to execute a modular autoencoder model, the modular autoencoder model configured to generate an output based on an input. The instructions cause operations comprising: causing an encoder of the modular autoencoder model to encode the input to generate a low dimensional representation of the input in a latent space; and causing a decoder of the modular autoencoder model to generate the output by decoding the low dimensional representation. The decoder is configured to enforce, during decoding, a known property of the encoded input to generate the output, the known property associated with a known physical relationship between the low dimensional representation in the latent space and the output.

In some embodiments, enforcing comprises penalizing differences between the output and an output that should be generated according to the known property using a penalty term in a cost function associated with the decoder.

In some embodiments, the penalty term comprises a difference between decoded versions of the low dimensional representation of the input which are which are related to each other through physical priors.

In some embodiments, the encoder and/or the decoder are configured to be adjusted based on any differences between the decoded versions of the low dimensional representation, and adjusting comprises adjusting at least one weight associated with a layer of the encoder and/or the decoder.

In some embodiments, the input comprises a sensor signal associated with a sensing operation in a semiconductor manufacturing process, the low dimensional representation of the input is a compressed representation of the sensor signal, and the output is an approximation of the input sensor signal.

In some embodiments, the sensor signal comprises a pupil image, and an encoded representation of the pupil image is configured to be used to estimate overlay (as one example of many possible parameters of interest).

In some embodiments, the modular autoencoder model further comprises: an input model configured to process the input to a first level of dimensionality suitable for combination with other inputs, and provide the processed input to the encoder; an output model configured to receive an expanded version of the input from the decoder and generate the approximation of the input based on the expanded version; and a prediction model configured to estimate a manufacturing process parameter based on the low dimensional representation of the input in the latent space.

In some embodiments, the parameter is a semiconductor manufacturing process parameter; the input model comprises a neural network block comprising dense feed-forward layers, convolutional layers, and/or residual network architecture of the modular autoencoder model; the encoder and/or decoder comprises a neural network block comprising feed forward and/or residual layers; and the prediction model comprises a neural network block comprising feed forward and/or residual layers.

In some embodiments, the input model, the encoder/decoder, and the output model are separate from each other and correspond to process physics differences in different parts of a manufacturing process and/or a sensing operation such that each of the input model, the encoder/decoder, and/or the output model can be trained together and/or separately, but individually configured based on the process physics for a corresponding part of the manufacturing process and/or sensing operation, apart from other models in the modular autoencoder model.

In some embodiments, the decoder is configured to enforce a known symmetry property of the encoded input during a training phase, such that the modular autoencoder model obeys the enforced known symmetry property during an inference phase.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which.

DETAILED DESCRIPTION

Figure 1:
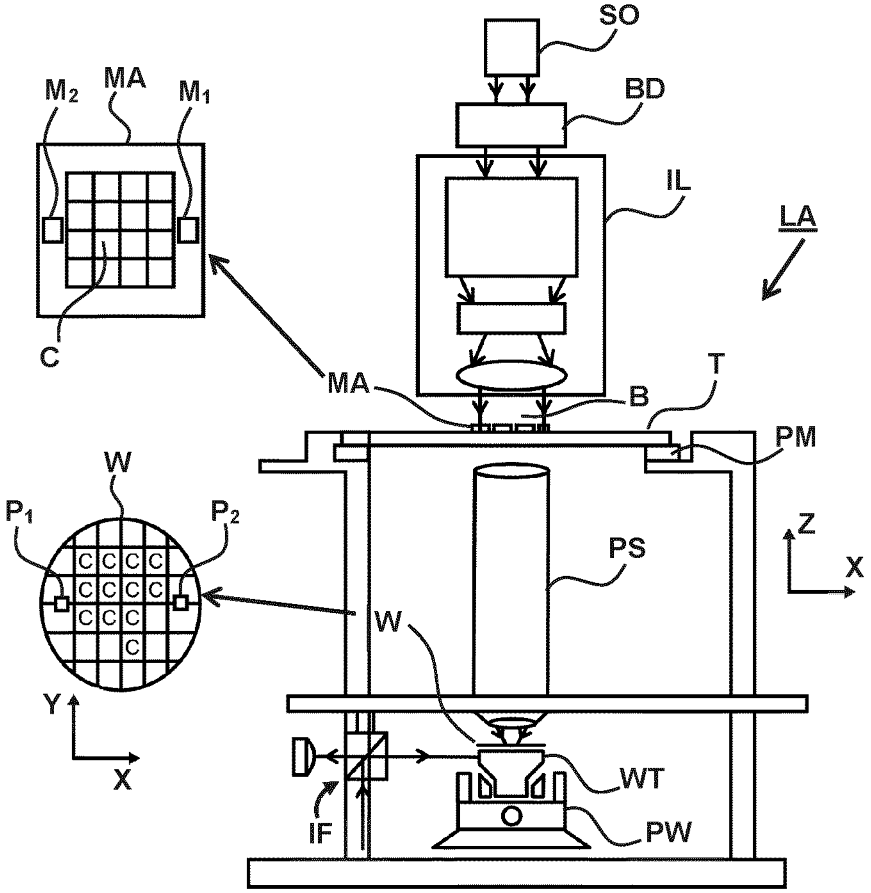
FIG. 1 depicts a schematic overview of a lithographic apparatus, according to an embodiment.

As described above, autoencoders can be configured for use in metrology and/or other solutions for parameter inference and/or for other purposes. This deep learning model architecture is generic and scalable to an arbitrary size and complexity. Autoencoders are configured to compress a high dimensional signal (e.g. pupil images in a semiconductor metrology platform) to an efficient low dimensional representation of the same signal. Next, parameter inference (i.e. regression) is performed from the low-dimensional representation towards a set of known labels. By first compressing the signal, the inference problem is significantly simplified compared to performing regression on the high dimensional signal directly.

However, it is often difficult to understand the flow of information inside a typical autoencoder. One can reason about the information at the input, at the level of the compressed low dimensional representation, and at the output. One cannot readily interpret the information between these points.

Data driven inference approaches have also been proposed for semiconductor metrology operations and used for the task of parameter estimation. They rely on a significant amount of gathered measurements and models that map measured features to parameters of interest, with labels for these parameters obtained via carefully designed targets on a wafer or from third party measurements. Current approaches have the capability to measure a significant number of channels (multiple wavelengths, observations under multiple wafer rotations, four light polarization schemes, etc.). However, due to practical timing constraints, the number of channels needs to be limited to a subset of those available ones for production measurements. For the selection of the best channels, a brute force approach is often used that tests all possible channel combinations. This is time consuming, resulting in long measurement and/or process recipe creation times. Additionally, a brute force approach can be prone to overfitting, introducing a different bias per channel, and/or other disadvantages.

In semiconductor manufacturing, optical metrology may be used to measure critical stack parameters directly on product (e.g., patterned wafer) structures. Machine-learning methods are often applied on top of optical scatterometry data acquired using a metrology platform. These machine-learning methods conceptually amount to supervised learning approaches, i.e. learning from labeled datasets. The success of such methods is strongly dependent on the quality of the labels. Often, labeled datasets are created by measuring and labelling known targets in a wafer. One of the primary challenges of using targets in this way is the fact that they only provide very accurate relative labels. This means that within one cluster of targets, there is some unknown cluster bias, on top of which accurate labels are known. Determining this unknown cluster bias, and hence obtaining absolute labels, is important to the accuracy of target-based recipes. The procedure of estimating the cluster bias is usually referred to as label correction.

The present modular autoencoder model is less rigid compared to traditional monolithic autoencoder models. The present modular autoencoder model has a greater number of trainable and/or otherwise adjustable components. The modularity of the present model makes it easier to interpret, define, and extend. The complexity of the present model is high enough to model a process that generates the data provided to the model, but low enough to avoid modelling noise or other unwanted characteristics (e.g., the present model is configured to avoid overfitting provided data). As the process (or at least aspects of the process) generating the data is often unknown, choosing an appropriate network complexity usually involves some intuition and trial-and-error. For this reason, it is highly desirable to provide a model architecture that is modular, easy to comprehend, and easy to scale in complexity up and down.

In addition, the present modular autoencoder model is configured for estimating parameters of interest from a combination of available channels of measurement data from an optical metrology platform by estimating retrievable quantities of information content using a subset of a plurality of input models based on the available channels. The present model is configured to be trained by randomly or otherwise iteratively varying (e.g., sub-selecting) a number of channels that are used to approximate inputs during iterative training steps. This iterative variation/sub-selection ensures that the model remains predictive/consistent for any combination of input channels. Furthermore, since the information content present in the inputs represents all channels (e.g., because each channel was part of the subset of selected channels for at least one training iteration), the resulting model will not include a bias specific to one particular channel.

The present modular autoencoder model is also configured such that known properties of inputs (e.g., domain knowledge) can be embedded into the model during the training phase, which reduces or eliminates (e.g., cluster) bias in subsequent inferences made by the model. In other words, the present modular autoencoder is configured such that known (e.g., symmetry) properties of inputs are embedded into the decoding part of the model, and these embedded known properties allow the model to make bias free inferences.

Note that the term autoencoder used in association with the present modular autoencoder model may generally refer to one or more autoencoders, or one or more parts of an autoencoder, configured for partial supervised learning using a latent space for parameter estimation, and/or other operations. In addition, the various drawbacks (e.g., of prior systems) and advantages (of the present modular autoencoder model) described above are examples of many other possible drawbacks and advantages, and should not be considered limiting.

Finally, although specific reference may be made in this text to the manufacture of integrated circuits, the description herein has many other possible applications. For example, it may be employed in the manufacture of integrated optical systems, guidance and detection patterns for magnetic domain memories, liquid-crystal display panels, thin-film magnetic heads, etc. In these alternative applications, the skilled artisan will appreciate that, in the context of such alternative applications, any use of the terms "reticle", "wafer" or "die" in this text should be considered as interchangeable with the more general terms "mask", "substrate" and "target portion", respectively. In addition, it should be noted that the method described herein may have many other possible applications in diverse fields such as language processing systems, self-driving cars, medical imaging and diagnosis, semantic segmentation, denoising, chip design, electronic design automation, etc. The present method may be applied in any fields where quantifying uncertainty in machine learning model predictions is advantageous.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

A patterning device may comprise, or may form, one or more design layouts. The design layout may be generated utilizing CAD (computer-aided design) programs. This process is often referred to as EDA (electronic design automation). Most CAD programs follow a set of predetermined design rules in order to create functional design layouts/patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device. One of the goals in device fabrication is to faithfully reproduce the original design intent on the substrate (via the patterning device).

The term "reticle," "mask," or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array.

As a brief introduction, FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT configured to hold a substrate (e.g., a resist coated wafer) W and coupled to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
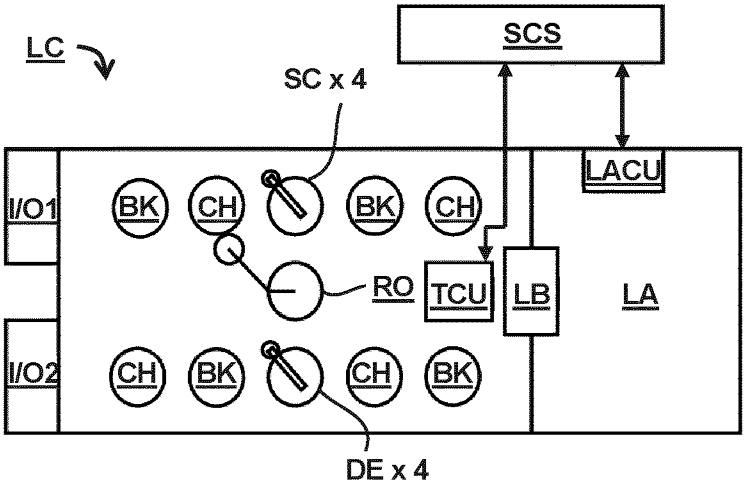
FIG. 2 depicts a schematic overview of a lithographic cell, according to an embodiment.

FIG. 2 depicts a schematic overview of a lithographic cell LC. As shown in FIG. 2 the lithographic apparatus LA may form part of lithographic cell LC, also sometimes referred to as a lithocell or (litho)cluster, which often also includes apparatus to perform pre- and post-exposure processes on a substrate W. Conventionally, these include spin coaters SC configured to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W (FIG. 1) exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W (FIG. 1), and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
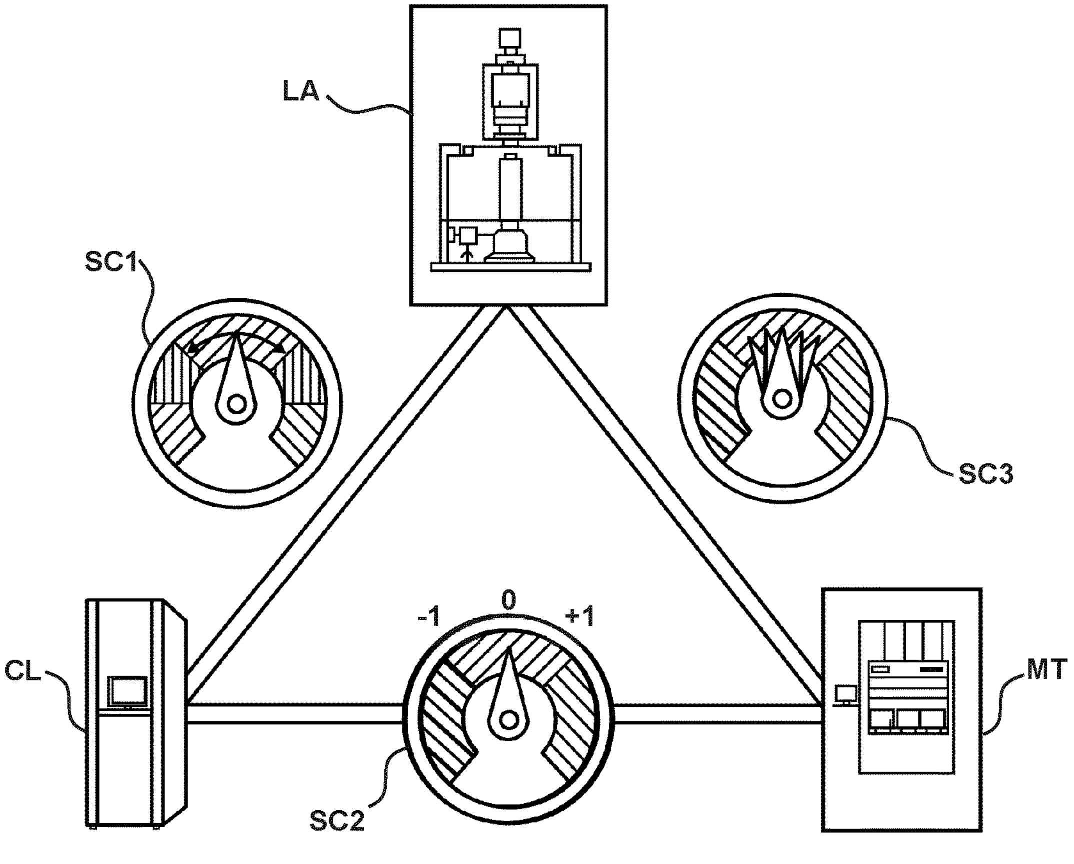
FIG. 3 depicts a schematic representation of holistic lithography, representing a cooperation between three technologies to optimize semiconductor manufacturing, according to an embodiment.

FIG. 3 depicts a schematic representation of holistic lithography, representing a cooperation between three technologies to optimize semiconductor manufacturing. Typically, the patterning process in a lithographic apparatus LA is one of the most critical steps in the processing which requires high accuracy of dimensioning and placement of structures on the substrate W (FIG. 1). To ensure this high accuracy, three systems (in this example) may be combined in a so called "holistic" control environment as schematically depicted in FIG. 3. One of these systems is the lithographic apparatus LA which is (virtually) connected to a metrology apparatus (e.g., a metrology tool) MT (a second system), and to a computer system CL (a third system). A "holistic" environment may be configured to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device) —typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology apparatus (tool) MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequent measurements of the structures created, e.g., for process control and verification. Tools to make such measurements include metrology tool (apparatus) MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure features of a substrate such as gratings using light from soft x-ray and visible to near-IR wavelength range, for example.

In some embodiments, a scatterometer MT is an angular resolved scatterometer. In these embodiments, scatterometer reconstruction methods may be applied to the measured signal to reconstruct or calculate properties of a grating and/or other features in a substrate. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In some embodiments, scatterometer MT is a spectroscopic scatterometer MT. In these embodiments, spectroscopic scatterometer MT may be configured such that the radiation emitted by a radiation source is directed onto target features of a substrate and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In some embodiments, scatterometer MT is a ellipsometric scatterometer. The ellipsometric scatterometer allows for determining parameters of a lithographic process by measuring scattered radiation for each polarization states. Such a metrology apparatus (MT) emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In some embodiments, scatterometer MT is adapted to measure the overlay of two misaligned gratings or periodic structures (and/or other target features of a substrate) by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in patent application EP1,628,164A, such that any asymmetry is clearly distinguishable. This provides a way to measure misalignment in gratings. Further examples for measuring overlay may be found in PCT patent application publication no. WO 2011/012624 or US patent application US 20160161863, incorporated herein by reference in their entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure (e.g., feature in a substrate) may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings and/or other features in a substrate, formed by a lithographic process, commonly in resist, but also after etch processes, for example. In some embodiments, one or more groups of targets may be clustered in different locations around a wafer. Typically the pitch and line-width of the structures in the gratings depend on the measurement optics (in particular the NA of the optics) to be able to capture diffraction orders coming from the metrology targets. A diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 4:
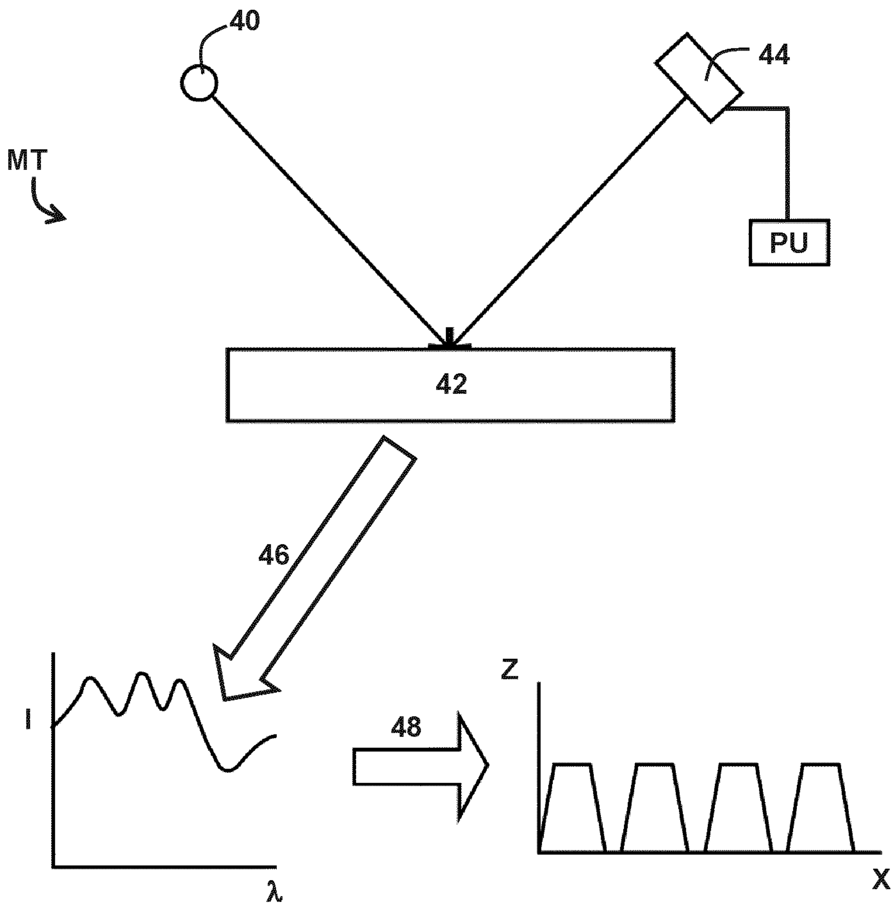
FIG. 4 illustrates an example metrology apparatus, such as a scatterometer, according to an embodiment.

FIG. 4 illustrates an example metrology apparatus (tool or platform) MT, such as a scatterometer. MT comprises a broadband (white light) radiation projector 40 which projects radiation onto a substrate 42. The reflected or scattered radiation is passed to a spectrometer detector 44, which measures a spectrum 46 (i.e. a measurement of intensity as a function of wavelength) of the specular reflected radiation. From this data, the structure or profile giving rise to the detected spectrum may be reconstructed 48 by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer, for example.

It is often desirable to be able computationally determine how a patterning process would produce a desired pattern on a substrate. Computational determination may comprise simulation and/or modeling, for example. Models and/or simulations may be provided for one or more parts of the manufacturing process. For example, it is desirable to be able to simulate the lithography process of transferring the patterning device pattern onto a resist layer of a substrate as well as the yielded pattern in that resist layer after development of the resist, simulate metrology operations such as the determination of overlay, and/or perform other simulations. The objective of a simulation may be to accurately predict, for example, metrology metrics (e.g., overlay, a critical dimension, a reconstruction of a three dimensional profile of features of a substrate, a dose or focus of a lithography apparatus at a moment when the features of the substrate were printed with the lithography apparatus, etc), manufacturing process parameters (e.g., edge placements, aerial image intensity slopes, sub resolution assist features (SRAF), etc.), and/or other information which can then be used to determine whether an intended or target design has been achieved. The intended design is generally defined as a pre-optical proximity correction design layout which can be provided in a standardized digital file format such as GDSII, OASIS or another file format.

Simulation and/or modeling can be used to determine one or more metrology metrics (e.g., performing overlay and/or other metrology measurements), configure one or more features of the patterning device pattern (e.g., performing optical proximity correction), configure one or more features of the illumination (e.g., changing one or more characteristics of a spatial/angular intensity distribution of the illumination, such as change a shape), configure one or more features of the projection optics (e.g., numerical aperture, etc.), and/or for other purposes. Such determination and/or configuration can be generally referred to as mask optimization, source optimization, and/or projection optimization, for example. Such optimizations can be performed on their own, or combined in different combinations. One such example is source-mask optimization (SMO), which involves the configuring of one or more features of the patterning device pattern together with one or more features of the illumination. The optimizations may use the parameterized model described herein to predict values of various parameters (including images, etc.), for example.

In some embodiments, an optimization process of a system may be represented as a cost function. The optimization process may comprise finding a set of parameters (design variables, process variables, inspection operation variables, etc.) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics. The cost function can also be the maximum of these deviations (i.e., worst deviation). The term "evaluation points" should be interpreted broadly to include any characteristics of the system or fabrication method. The design and/or process variables of the system can be confined to finite ranges and/or be interdependent due to practicalities of implementations of the system and/or method. In the case of a lithographic projection and/or an inspection apparatus, the constraints are often associated with physical properties and characteristics of the hardware such as tunable ranges, and/or patterning device manufacturability design rules. The evaluation points can include physical points on a resist image on a substrate, as well as non-physical characteristics such as dose and focus, for example.

In some embodiments, the present system(s) and method(s) may include an empirical model that performs one or more of the operations described herein. The empirical model may predict outputs based on correlations between various inputs (e.g., one or more characteristics of a pupil image, one or more characteristics of a complex electric field image, one or more characteristics of a design layout, one or more characteristics of the patterning device, one or more characteristics of the illumination used in the lithographic process such as the wavelength, etc.).

As an example, the empirical model may be a parameterized model and/or other models. The parameterized model may be a machine learning model and/or any other parameterized model. In some embodiments, a machine learning model (for example) may be and/or include mathematical equations, algorithms, plots, charts, networks (e.g., neural networks), and/or other tools and machine learning model components. For example, a machine learning model may be and/or include one or more neural networks (e.g., neural network blocks) having an input layer, an output layer, and one or more intermediate or hidden layers. In some embodiments, the one or more neural networks may be and/or include deep neural networks (e.g., neural networks that have one or more intermediate or hidden layers between the input and output layers).

As an example, the one or more neural networks may be based on a large collection of neural units (or artificial neurons). The one or more neural networks may loosely mimic the manner in which a biological brain works (e.g., via large clusters of biological neurons connected by axons). Each neural unit of a neural network may be connected with many other neural units of the neural network. Such connections can be enforcing or inhibitory in their effect on the activation state of connected neural units. In some embodiments, each individual neural unit may have a summation function that combines the values of all its inputs together. In some embodiments, each connection (or the neural unit itself) may have a threshold function such that a signal must surpass the threshold before it is allowed to propagate to other neural units. These neural network systems may be self-learning and trained, rather than explicitly programmed, and can perform significantly better in certain areas of problem solving, as compared to traditional computer programs. In some embodiments, the one or more neural networks may include multiple layers (e.g., where a signal path traverses from front layers to back layers). In some embodiments, back propagation techniques may be utilized by the neural networks, where forward stimulation is used to reset weights on the "front" neural units. In some embodiments, stimulation and inhibition for the one or more neural networks may be freer flowing, with connections interacting in a more chaotic and complex fashion. In some embodiments, the intermediate layers of the one or more neural networks include one or more convolutional layers, one or more recurrent layers, and/or other layers.

The one or more neural networks may be trained (i.e., whose parameters are determined) using a set of training data (e.g., ground truths). The training data may include a set of training samples. Each sample may be a pair comprising an input object (typically an image, a measurement, a tensor or vector which may be called a feature tensor or vector) and a desired output value (also called the supervisory signal). A training algorithm analyzes the training data and adjusts the behavior of the neural network by adjusting the parameters (e.g., weights of one or more layers) of the neural network based on the training data. For example, given a set of N training samples of the form $\{(x_1,y_1), (x_2,y_2), \ldots, (x_N,y_N)\}$ such that $x_i$ is the feature tensor/vector of the i-th example and $y_i$ is its supervisory signal, a training algorithm seeks a neural network $g: X \rightarrow Y$, where X is the input space and Y is the output space. A feature tensor/vector is an n-dimensional tensor/vector of numerical features that represent some object (e.g., a complex electric field image). The tensor/vector space associated with these vectors is often called the feature or latent space. After training, the neural network may be used for making predictions using new samples.

As described herein, the present modular autoencoder model includes one or more parameterized models (e.g., machine learning models such as a neural network) that use an encoder-decoder architecture, and/or other models. In the middle (e.g., middle layers) of the model (e.g., a neural network), the present model formulates a low-dimensional encoding (e.g., in a latent space) that encapsulates information in an input (e.g., a pupil image and/or other input associated with a pattern or other features of a semiconductor manufacturing and/or metrology (and/or other sensing) process) to the model. The present modular autoencoder model leverages the low dimensionality and compactness of the latent space to make parameter estimations and/or predictions.

Figure 5:
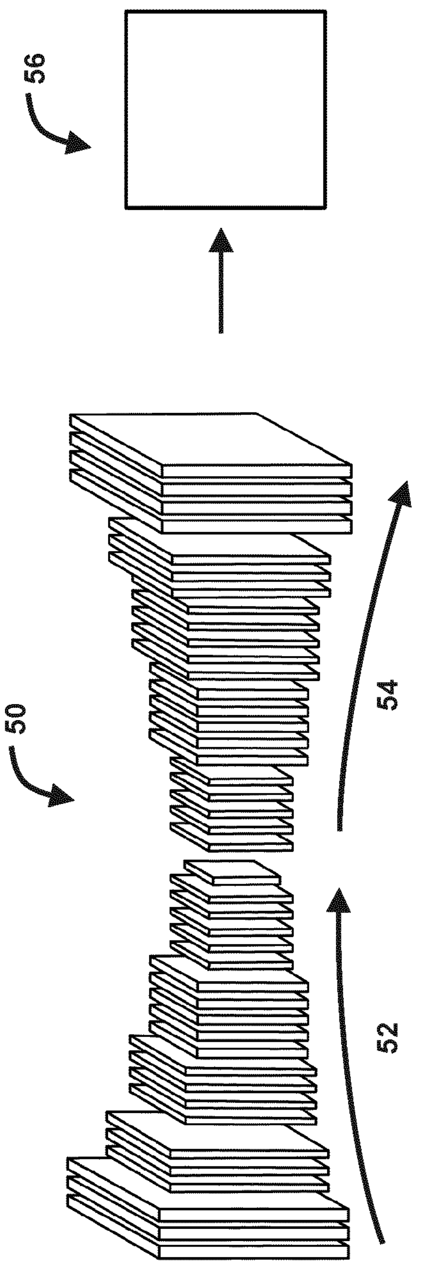
FIG. 5 illustrates encoder-decoder architecture, according to an embodiment.

By way of a non-limiting example, FIG. 5 illustrates general encoder-decoder architecture 50. Encoder-decoder architecture 50 has an encoding portion 52 (an encoder) and a decoding portion 54 (a decoder). In the example shown in FIG. 5, encoder-decoder architecture 50 may output predicted pupil images 56 and/or other outputs, for example.

Figure 6:
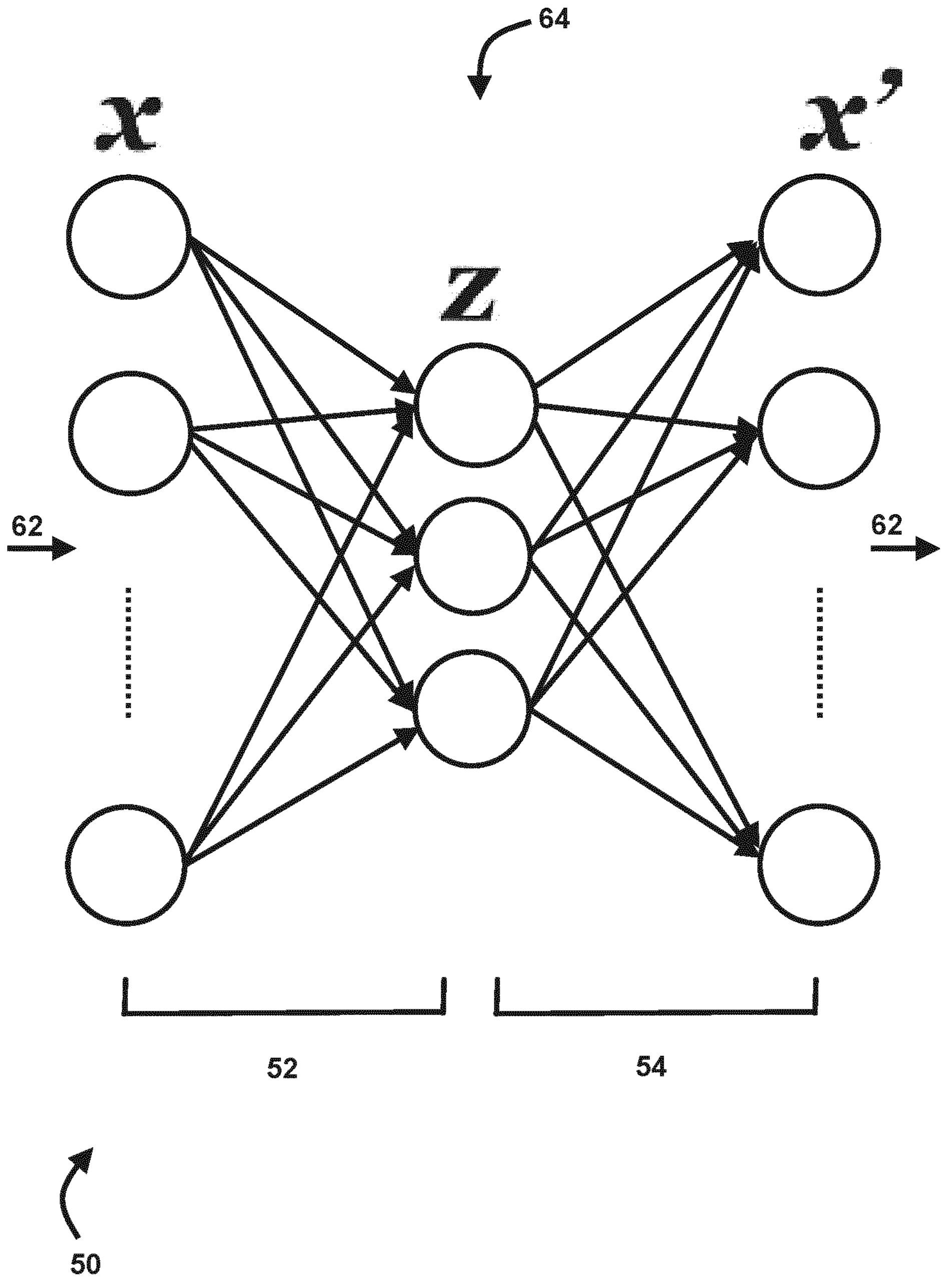
FIG. 6 illustrates encoder-decoder architecture within a neural network, according to an embodiment.

By way of another non-limiting example, FIG. 6 illustrates encoder-decoder architecture 50 within a neural network 62. Encoder-decoder architecture 50 includes encoding portion 52 and decoding portion 54. In FIG. 6, x represents encoder input (e.g., an input pupil image and/or extracted features of the input pupil image) and x' represents decoder output (e.g., a predicted output image and/or predicted features of an output image). In some embodiments, x' may represent an output from an intermediate layer of neural network (in comparison to a final output of the overall model), for example, and/or other outputs. In FIG. 6, z represents the latent space 64 and/or a low dimensional encoding (tensor/vector). In some embodiments, z is or is related to a latent variable.

In some embodiments, the low dimensional encoding z represents one or more features of an input (e.g., a pupil image). The one or more features of the input may be considered key or critical features of the input. Features may be considered key or critical features of an input because they are relatively more predictive than other features of a desired output and/or have other characteristics, for example. The one or more features (dimensions) represented in the low dimensional encoding may be predetermined (e.g., by a programmer at the creation of the present modular autoencoder model), determined by prior layers of a neural network, adjusted by a user via a user interface associated with a system described herein, and/or may be determined in by other methods. In some embodiments, a quantity of features (dimensions) represented by the low dimensional encoding may be predetermined (e.g., by the programmer at the creation of the present modular autoencoder model), determined based on output from prior layers of the neural network, adjusted by the user via the user interface associated with a system described herein, and/or determined by other methods.

It should be noted that even though a machine learning model, a neural network, and/or encoder-decoder architecture are mentioned throughout this specification, a machine learning model, a neural network, and encoder-decoder architecture are just examples, and the operations described herein may be applied to different parameterized models.

As described above, process information (e.g., images, measurements, process parameters, metrology metrics, etc.) may be used to guide various manufacturing operations. Utilizing the relatively lower dimensionality of a latent space to predict and/or otherwise determine the process information may be faster, more efficient, require fewer computing resources, and/or have other advantages over prior methods for determining process information.

Figure 7:
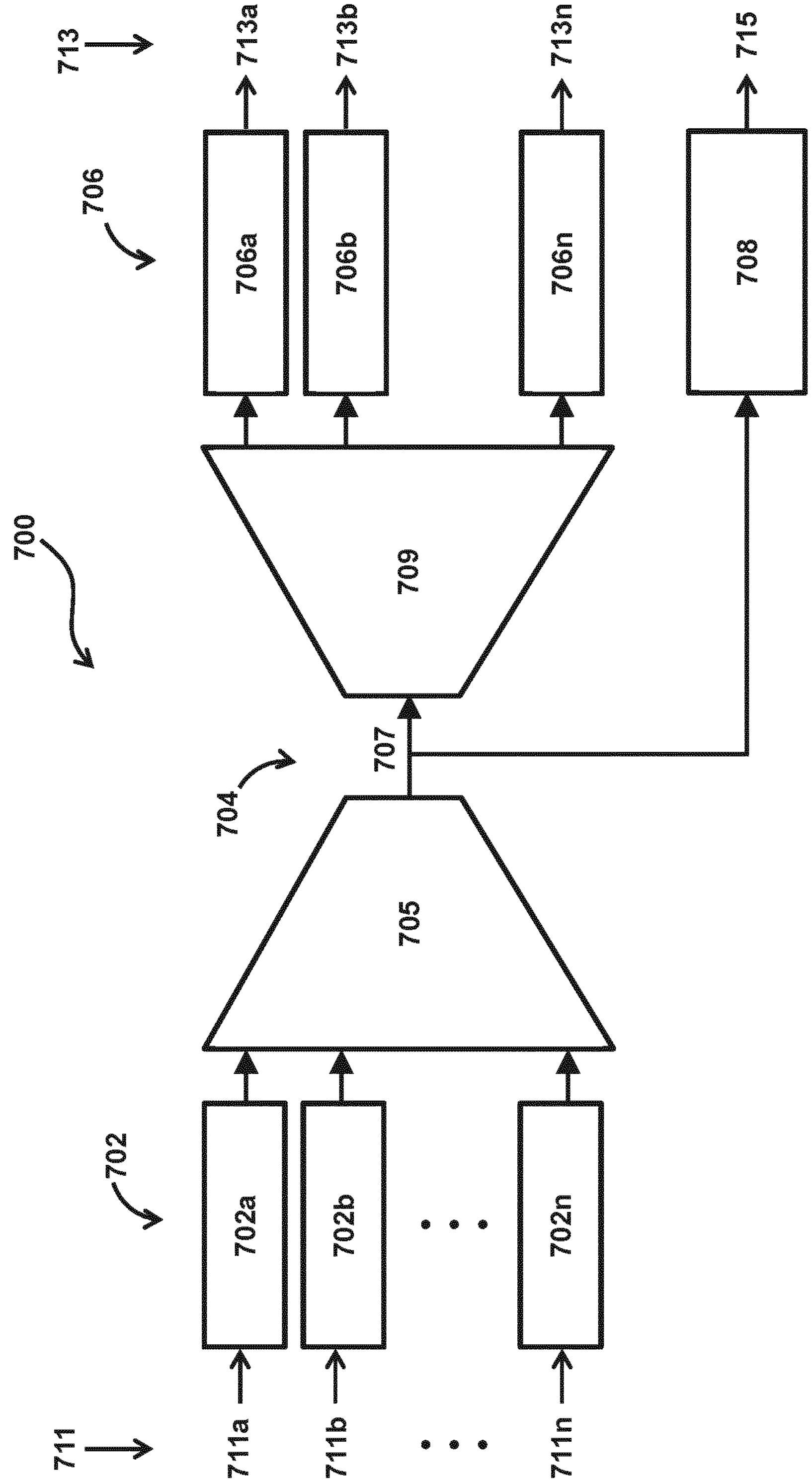
FIG. 7 illustrates an embodiment of the present modular autoencoder model, according to an embodiment.

FIG. 7 illustrates an embodiment of the present modular autoencoder model 700. In general, autoencoder models can be adapted for use in metrology and/or other solutions for parameter inference and/or for other purposes. Inference may comprise estimating parameters of interest from data and/or other operations. For example, this may comprise finding a latent representation in a forward way by evaluating an encoder, or in an inverse way, by solving the inverse problem using a decoder (as described herein). After finding the latent representation, parameters of interest may be found by evaluating a prediction/estimation model (also as described herein). Additionally, the latent representation provides a set of outputs (because one can evaluate a decoder, given a latent representation), which can be compared to the data, for example. In essence, within the present context, inference and estimation (of parameters of interest) can be used interchangeably. Autoencoder model architecture is generic and scalable to an arbitrary size and complexity. Autoencoder models are configured to compress a high-dimensional signal (input) to an efficient low-dimensional representation of the same signal. Parameter inference (e.g., which can include regression and/or other operations) is performed from the low-dimensional representation, one or more outputs, and/or other information, towards a set of known labels. Labels may be the "references" used in supervised learning. Within this context, this may mean either external references one would like to reproduce, or a design of carefully crafted metrology targets. Measuring carefully crafted metrology target may include measuring know targets that have known (absolute/relative) properties (e.g. overlay and/or other properties, for example). By first compressing the (input) signal, the inference problem is significantly simplified compared to performing regression and/or other operations on the high dimensional signal directly.

However, it is difficult to understand the flow of information inside a typical autoencoder. Its architecture is often opaque and/or non-transparent, and one can usually only reason about information at a model input, at the model output, and at the point of compression (i.e., in the latent space). Information is not easy to interpret between these points. In practice, one might have auxiliary information (in addition to the input), such as physical properties of a target on a wafer and a corresponding sensor in a semiconductor manufacturing process. This auxiliary information can be used as prior knowledge (e.g., "a prior") to ensure the model predictions match a physical reality, to improve the autoencoder model's performance, or to extend the autoencoder model's applicability. However, in a typical autoencoder model having rigid architecture comprising an input, a point of compression, and an output, it is unclear how to incorporate any such information (e.g., it is not clear where or how any such information could be inserted into or used by the model).

Modular autoencoder model 700 has a modular structure. This allows construction of intermediate levels of abstraction that can be used to exploit auxiliary information. Instructions stored on a non-transitory computer readable medium may cause a computer (e.g., one or more processors) to execute (e.g., train and/or evaluate) model 700 for parameter estimation and/or prediction, for example. In some embodiments, model 700 (and/or any of the individual components of model 700 described below) may be configured a priori, before seeing training data. In some embodiments, the estimated and/or predicted parameters comprise one or more of an image (e.g., a pupil image, an electric field image, etc.), a process measurement (e.g., a metric value), and/or other information. In some embodiments, a process measurement comprises one or more of a metrology metric, an intensity, an xyz position, a dimension, an electric field, a wavelength, an illumination and/or detection pupil, a bandwidth, an illumination and/or detection polarization angle, an illumination and/or a detection retardance angle, and/or other process measurements. Modular autoencoder model 700 is configured for partial supervised learning using a latent space for parameter estimation (as further described below).

As shown in FIG. 7, modular autoencoder model 700 is formed with four types of sub-models: input models 702, a common model 704, output models 706, and a prediction model 708 (though any number, type, and/or arrangement of sub-models is possible). Input models 702 are configured for processing input data to a higher level of abstraction, suitable for combination with other inputs. Common model 704 joins the inputs, compresses the information to a bottleneck (e.g., the point of compression or latent space in model 700), and expands the information again to a level suitable for splitting into multiple outputs. Output models 706 process the information from this common abstraction level to multiple outputs that approximate the respective inputs. Prediction model 708 is used to estimate parameters of interest from the information passing through the bottleneck. Finally, note that modular autoencoder model 700 is configured for several different inputs and several different outputs, contrary to typical autoencoder models.

In some embodiments, modular autoencoder model 700 comprises one or more input models 702 (a, b, . . . , n), a common model 704, one or more output models 706 (a, b, . . . , n), a prediction model 708, and/or other components. Generally, modular autoencoder model 700 may be more complex (in terms of number of free parameters) than typical monolithic models discussed above. However, in exchange, this more complex model is easier to interpret, define, and extend. For any neural network, the complexity of the network must be chosen. This complexity should be high enough to model the process that underlies the data, but low enough not to model the noise realization (this is commonly interpreted as a form of overfitting). The model may be configured to model the way a sensor views an outcome of a manufacturing process on a wafer, for example. As the process generating the data is often unknown (or has unknown aspects), choosing an appropriate network complexity usually involves some intuition and trial-and-error. For this reason, it is desirable to provide, by way of modular autoencoder model 700, a model architecture that is easy to comprehend and in which it is clear how to scale the model complexity up and down.

Here, one or more input models 702, common model 704, one or more output models 706, and/or prediction model 708 are separate from each other and can be configured to correspond to process physics differences in different parts of a manufacturing process and/or a sensing operation. Model 700 is configured in this way so that each of the one or more input models 702, common model 704, the one or more output models 706, and/or prediction model 708 can be trained together and/or separately, but individually configured based on the process physics for a corresponding part of the manufacturing process and/or sensing operation, apart from other models in modular autoencoder model 700. By way of a non-limiting example, physically, target and sensor contributions in optical metrology apparatuses (tools, platforms, etc.) are separable. In other words, different targets can be measured with the same sensor. Because of this, we can model the target and sensor contributions separately. Put another way, one or more input models 702, common model 704, one or more output models 706, and/or prediction model 708 may be associated with physics for light as it propagates through a sensor or a stack.

One or more input models 702 are configured to process one or more inputs 711 (e.g., 711*a*, 711*b*, . . . , 711*n*) to a first level of dimensionality suitable for combination with other inputs. Processing may include filtering and/or otherwise transforming an input into a model friendly format, compressing the input, projecting data onto a lower dimensional subspace to accelerate the training procedure, data normalization, processing out signal contributions coming from a sensor (e.g. source fluctuation, sensor dose configuration (amount of light produced), etc.) and/or other processing operations. Processing may be thought of as preprocessing, for example, to ensure an input, or data associated with an input, is suitable for model 700, suitable for combination with other inputs, etc. The first level of dimensionality may be the same as or less than a level of dimensionality of a given input 711. In some embodiments, one or more input models 702 comprise dense (e.g., linear layers and/or dense layers with different activation) feed-forward layers, convolutional layers, and/or residual network architecture of modular autoencoder model 700. These structures are examples only, and should not be considered limiting.

In some embodiments, inputs 711 are associated with a pupil, a target, and/or other components of a semiconductor manufacturing process, and received from one or more of a plurality of characterization apparatuses configured to generate input 711. The characterization apparatuses may include various sensors and/or tools configured to generate data about a target. In some embodiments, a characterization apparatus may include an optical metrology platform such as the one shown in FIG. 4, for example. The data may include images, values for various metrics, and/or other information. In some embodiments, input 711 comprises one or more of an input image, an input process measurement and/or series of process measurements, and/or other information. In some embodiments, an input 711 may be a signal associated with a channel of measurement data from one or more sensing (e.g., optical metrology and/or other sensing) platforms. A channel may be a mode in which one observes a stack, for example, a machine/physical configuration used when taking a measurement. By way of a non-limiting example, an input 711 may comprise an image (e.g., any image associated with or generated during semiconductor manufacturing). The image may be pre-processed by an input model 702, and encoded by encoder portion 705 (described below) of common model 704 into low dimensional data that represents the image in a latent space 707 (described below).

Note that in some embodiments, input model(s) 702 may be, or be thought of as, part of encoder portion 705. The low dimensional data may then be decoded, used to estimate and/or predict process information, and/or for other purposes.

Common model 704 comprises encoder-decoder architecture, variational encoder-decoder architecture, and/or other architecture. In some embodiments, common model 704 is configured to determine, in latent space 707 (where there are fewer degrees of freedom to analyze compared to the number of degrees of freedom for the raw input data from different sensors and/or tools), a latent space representation of a given input 711. Process information may be estimated and/or predicted, and/or other operation may be performed, based on the latent space representation of the given input 711.

In some embodiments, common model 704 comprises an encoder portion 705, a latent space 707, a decoder portion 709, and/or other components. Note that, in some embodiments, decoder portion 709 may include, or be thought of as including, output model(s) 706. In some embodiments, the common model comprises feed forward and/or residual layers, and/or other components, though these example structures should not be considered limiting. Encoder portion 705 of common model 704 is configured to combine the processed (e.g., by input models 702) inputs 711 and reduce a dimensionality of the combined processed inputs to generate low dimensional data in latent space 707. In some embodiments, input models 702 may perform at least some of the encoding. For example, encoding may include processing the one or more inputs 711 to the first level of dimensionality (e.g., by input models 702), and reducing the dimensionality of the combined processed inputs (e.g., by encoder portion 705). This can include reducing the dimensionality of an input 711 to form the low dimensional data in latent space 707, and/or any amount of dimensional reduction (e.g., by one or more layers of encoder portion 705) before actually reaching the low dimensional level in latent space 707. Note that this dimensionality reduction is not necessarily monotonic. For example, the combination (by means of concatenation) of inputs can be considered an increase in dimensionality.

The low dimensional data in latent space 707 has a second level of resulting reduced dimensionality that is less than the first level (e.g., the level of dimensionality of the processed input). In other words, the resulting dimensionality after reduction is less than it was before reduction. In some embodiments, the low dimensional data in the latent space may have one or more different forms, such as a tensor, a vector, and/or other latent space representations (e.g., something that has fewer dimensions than the number of dimensions associated with a given input 711).

Common model 704 is configured to expand the low dimensional data in the latent space into one or more expanded versions of the one or more inputs 711. Expanding the low dimensional data in latent space 707 into the one or more expanded versions of the one or more inputs 711 comprises decoding, generating a decoder signal, and/or other operations, for example. In general, the one or more expanded versions of the one or more inputs comprise the output from (e.g., a last layer of) common model 704, or input to output models 706. However, the one or more expanded versions of the one or more inputs 711 may include any expanded version from any layer of decoder portion 709 and/or any output that is passed from common model 704 to output models 706. The one or more expanded versions of the one or more inputs 711 have increased dimensionality compared to the low dimensional data in latent space 707. The one or more expanded versions of the one or more inputs 711 are configured to be suitable for generating one or more different outputs 713 (e.g., a, b, . . . n). Note that the inputs to common model 704 are not necessarily recovered as its outputs. This is intended to simply describe an interface. However, recovery may hold globally, input 711 to output 713.

One or more output models 706 are configured to use the one or more expanded versions of the one or more inputs 711 to generate the one or more different outputs 713. The one or more different outputs 713 comprise approximations of the one or more inputs 711, the one or more different outputs 713 have the same or increased dimensionality compared to the expanded versions (e.g., the output from common model 704) of the one or more inputs 711. In some embodiments, the one or more output models 706 comprise dense feed-forward layers, convolutional layers, and/or residual network architecture of the modular autoencoder model, though these example structures are not intended to be limiting. By way of a non-limiting example, an input 711 may comprise a sensor signal associated with a sensing operation in a semiconductor manufacturing process, a low dimensional representation of the input 711 may be a compressed representation of the sensor signal, and the corresponding output 713 may be an approximation of the input sensor signal.

Prediction model 708 is configured to estimate one or more parameters (parameters of interest) 715 based on the low dimensional data in latent space 707, the one or more different outputs 713, and/or other information. In some embodiments, for example, the one or more parameters may be semiconductor manufacturing process parameters (as described herein). In some embodiments, prediction model 708 comprises feed forward, residual layers, and/or other components, though these example structures are not intended to be limiting. By way of a non-limiting example, an input 711 sensor signal may comprise a pupil image, and an encoded representation of the pupil image may be configured to be used by prediction model 708 to estimate overlay and/or other parameters.

In some embodiments, modular autoencoder model 700 is trained by comparing the one or more different outputs 713 to corresponding inputs 711, and adjusting a parameterization of the one or more input models 702, common model 704, the one or more output models 706, and/or prediction model 708 to reduce or minimize a difference between an output 713 and a corresponding input 711. In some embodiments, training may include applying variation to the low dimensional data in latent space 707 such that common model 704 decodes a relatively more continuous latent space to generate a decoder signal (e.g., an output from common model 704), outputs 713 from the one or more output models 706, or both); recursively providing the decoder signal to the encoder (e.g., the one or more input models 702, encoder portion 705 of common model 704, or both) to generate new low dimensional data; comparing the new low dimensional data to the prior low dimensional data; and adjusting (e.g., changing weights, changing constants, changing an architecture, etc.) one or more components (702, 704, 706, 708) of modular autoencoder model 700 based on the comparison to reduce or minimize a difference between the new low dimensional data and the prior low dimensional data. The training is performed in a monolithic way across all sub-models 702-708 (although it may also be separate for each model). In other words, varying the data in latent space 707 impacts the other components of modular autoencoder model 700. In some embodiments, adjusting comprises adjusting at least one weight, a constant, and/or an architecture (e.g., a number of layers, etc.) associated with a layer of one or more input models 702, common model 704, one or more output models 706, prediction model 708, and/or other components of model 700. These and other aspects of training modular autoencoder model 700 are described in greater detail relative to other figures.

In some embodiments, a quantity of the one or more input models 702, a quantity of the one or more output models 706, and/or other characteristics of model 700 are determined based on data needs (e.g., preprocessing input data may be necessary to filter and/or otherwise transform the data into a model friendly format), process physics differences in different parts of a manufacturing process and/or a sensing operation, and/or other information. The quantity of input models may be the same as or different than the quantity of output models, for example. In some embodiments, individual input models 702 and/or output models 706 comprise two or more sub-models. The two or more sub-models are associated with different portions of a sensing operation and/or a manufacturing process.

For example, a number of available data channels may be linked to the possible configuration states for a sensor. The quantity of input models 702 and/or output models 706, whether a certain input model 702 and/or an output model 706 is used, and/or other characteristics of model 700 may be determined based on such information, and/or other manufacturing and/or sensing operation information.

Figure 8:
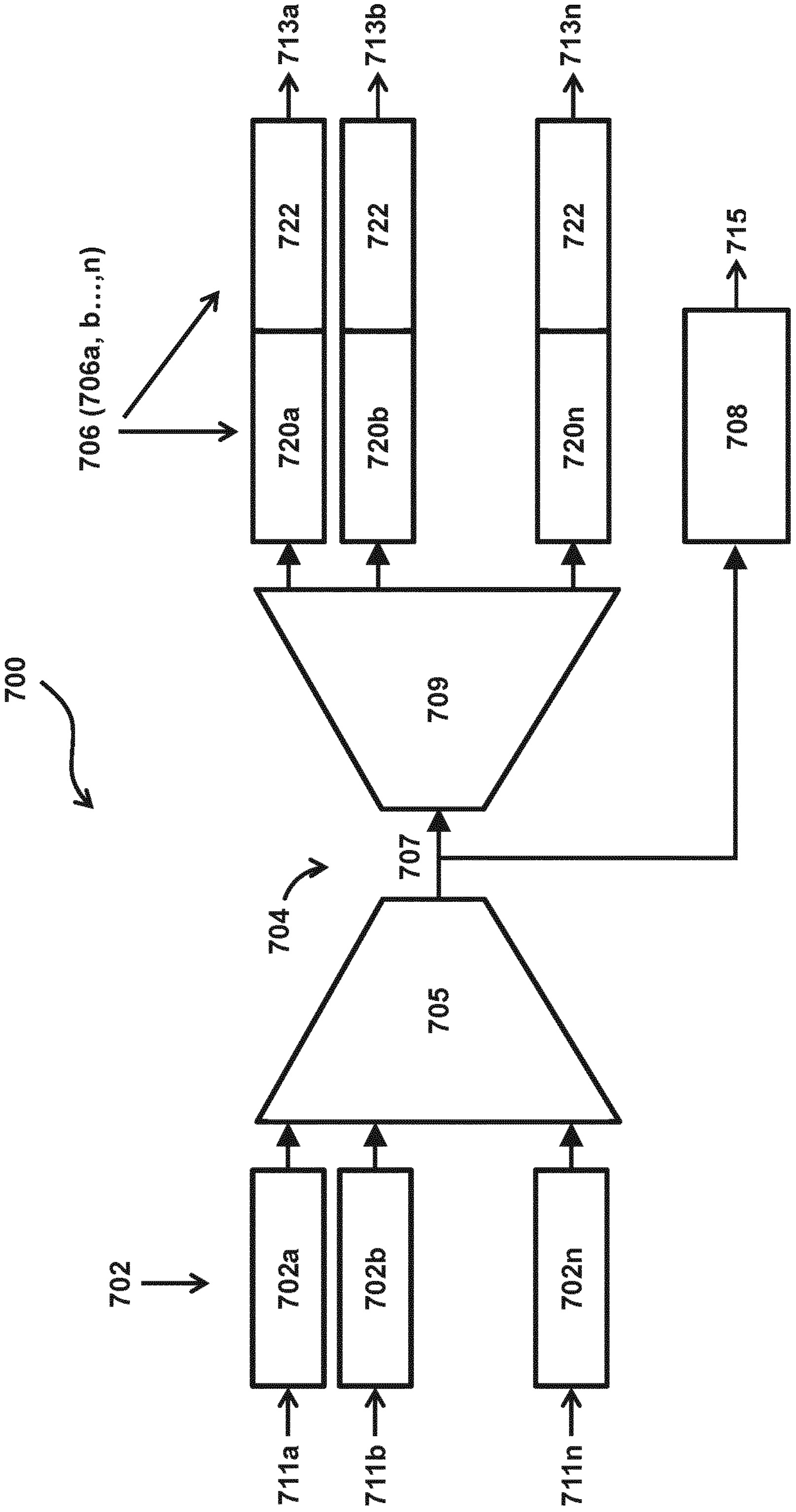
FIG. 8 illustrates output models of the modular autoencoder model comprising two or more sub-models, according to an embodiment.

By way of a non-limiting example, FIG. 8 illustrates output models 706 of modular autoencoder model 700 comprising two or more sub-models. In some embodiments, as shown in FIG. 8, an individual output model 706 comprises two or more sub-models 720*a, b, . . . , n*, and 722, etc. In some embodiments, for example, the two or more sub-models may comprise a stack model (e.g., 720*a, b, . . . , n*) and a sensor model (e.g., 722) for a semiconductor sensor operation. As described above, target and sensor contributions in metrology apparatuses are separable. Because of this, model 700 is configured to model the target and sensor contributions separately.

In FIG. 8, modular autoencoder model 700 is shown with an integrated sensor model 722 for a particular sensor. This example autoencoder model may be trained with data gathered using a sensor associated with sensor model 722. Note that this choice is made for simplicity of the discussion. The principles hold for any number of sensors. Also note that, even though not shown in FIG. 8, in some embodiments, an individual input model 702 (e.g., 702*a*) may comprise two or more sub-models. Input model 702 sub-models may be used for data preprocessing (e.g., on a singular value decomposition projection), and/or for other purposes, for example.

Figure 9:
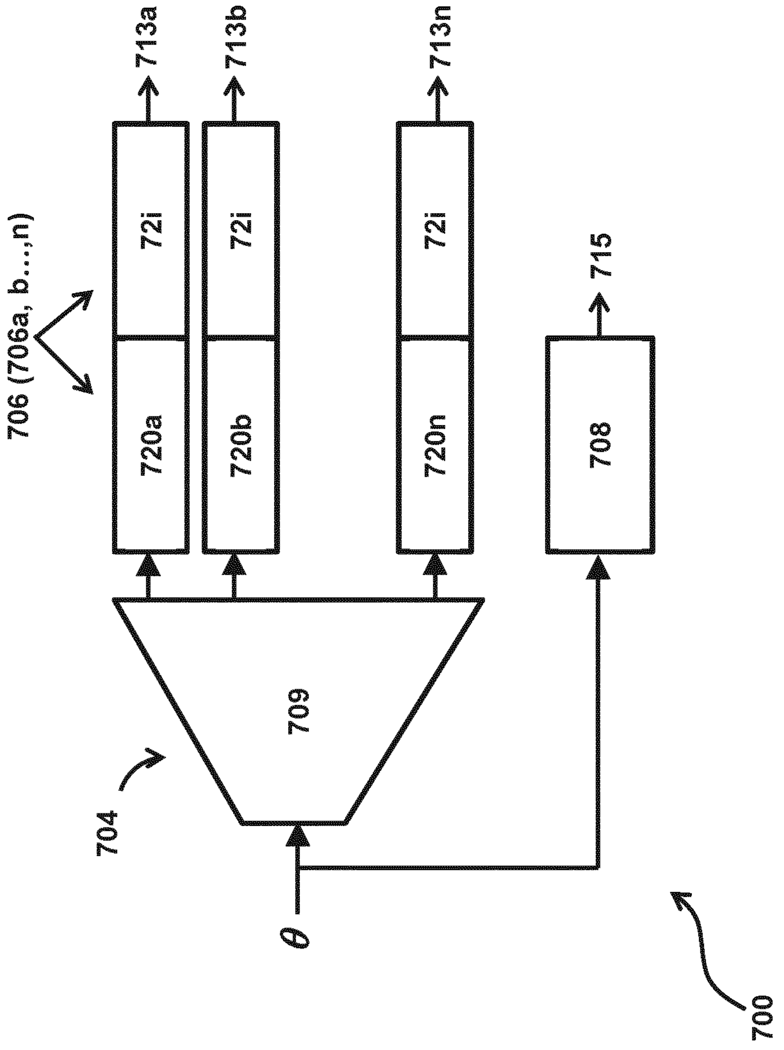
FIG. 9 illustrates an embodiment of the modular autoencoder model that may be used during parameter inference (e.g., estimation and/or prediction), according to an embodiment.

FIG. 9 illustrates an embodiment of modular autoencoder model 700 that may be used during parameter inference (e.g., estimation and/or prediction). During inference, the sensor associated with sensor model 722 can be swapped for any arbitrary sensor, modeled by sensor model "72i". This sub-model configuration is configured to be used to solve the problem:

$$\theta *= \arg\min_{\theta} \|\text{Input}-\text{Output}\, i(\theta)\|.$$

(This is a way to perform inference by solving the inverse problem.)

In this equation, θ represents a compressed low dimensional parameterization of an input in the latent space, and θ* represents a resulting target parameterization. From the resulting target parameterization, a corresponding parameter of interest 715 can be found using a forward evaluation of prediction model 708.

Figure 10:
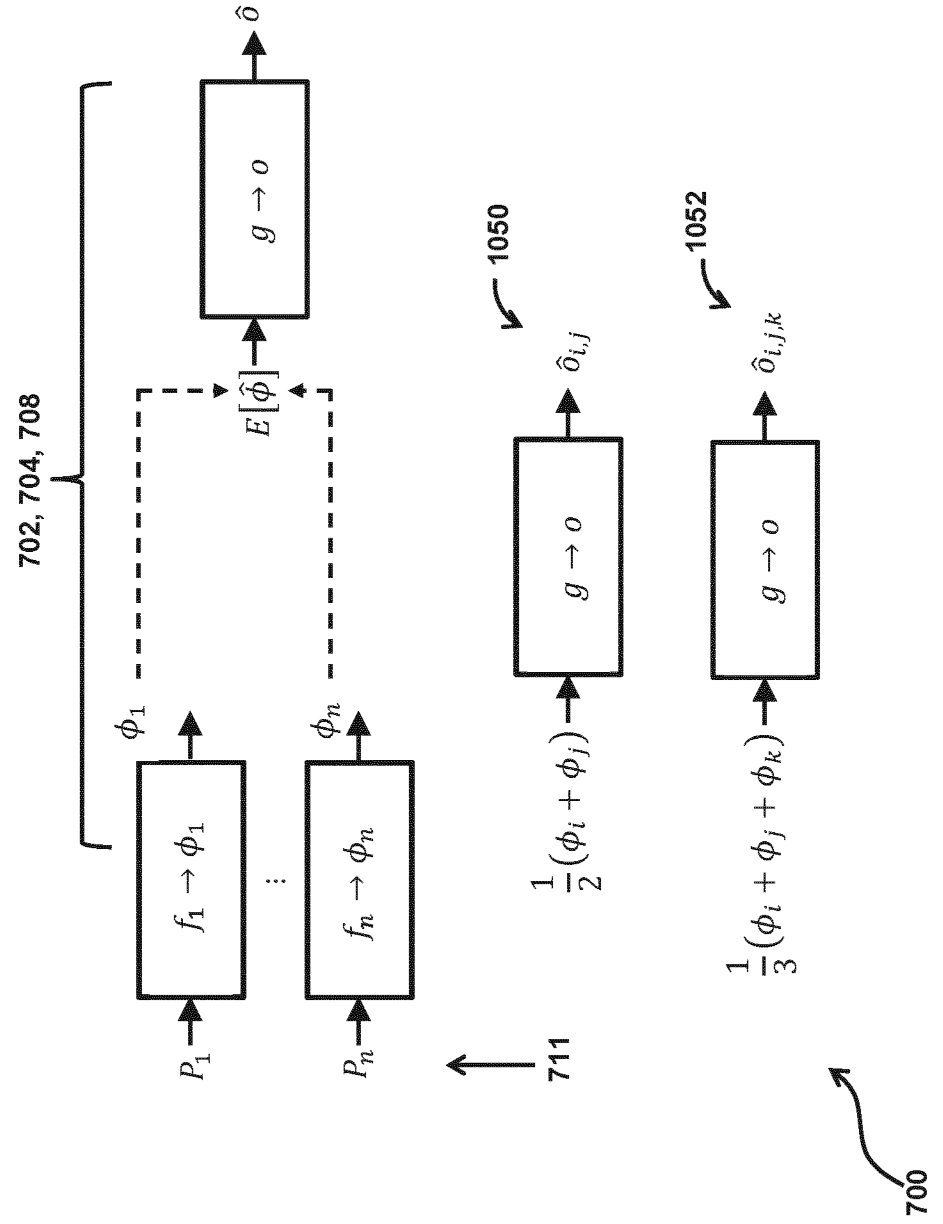
FIG. 10 illustrates how the modular autoencoder model is configured for estimating parameters of interest from a combination of available channels of measurement data from one or more sensing (e.g., optical metrology and/or other sensing) platforms by estimating retrievable quantities of information content using a subset of a plurality of input models based on the available channels, according to an embodiment.

As shown in FIG. 10, modular autoencoder model 700 (also see FIG. 7) is configured for estimating parameters of interest $\hat{o}$ from a combination of available channels P of measurement data from one or more sensing (e.g., optical metrology and/or other sensing apparatuses and/or tools) platforms by estimating retrievable quantities of information content using a subset of a plurality of input models 702 (FIG. 7) based on the available channels. In some embodiments, input models 702 are configured to process a plurality of inputs 711 based on the available channels such that the plurality of inputs are suitable for combination with each other. As described above, processing may include filtering and/or otherwise transforming an input into a model friendly format, compressing the input, and/or other processing operations. Processing may be thought of as preprocessing, for example, to ensure an input, or data associated with an input, is suitable for model 700, suitable for combination with other inputs, etc. Also as described above, common model 704 (e.g., encoder 705) is configured to combine the processed inputs and generate the low dimensional data in latent space 707 (FIG. 7) based on the combined processed inputs. The low dimensional data estimates the retrievable quantities, and the low dimensional data in the latent space is configured to be used by one or more additional models (e.g., the one or more output models 706 and/or prediction model 708) to generate approximations of the plurality of inputs 711 and/or estimate a parameter (of interest) 715 based on the low dimensional data (as described herein).

In some embodiments, modular autoencoder model 700 (FIG. 7) is trained by iteratively varying a subset of processed (e.g., compressed) inputs 711 (e.g., sub-selecting) to be combined by common model 704 and used (e.g., compressed) to generate training low dimensional data. In other words, inputs 711 (processed, compressed, or otherwise) are varied to a first layer of compression. One or more training approximations and/or a training parameter generated or predicted based on the training low dimensional data are compared to a corresponding reference (e.g., a known and/or otherwise predetermined reference approximation and/or parameter that the training approximation and/or training parameter is supposed to match); and one or more of the plurality of input models 702, common model 704, the one or more output models 706, and/or prediction model 708 are adjusted based on the comparison to reduce or minimize a difference between the one or more training approximations, and/or the training parameter, and a corresponding reference. To clarify, there are no reference values in the latent space. Instead, model 700 may be trained by iteratively dropping inputs and requiring the remainder of the network to generate all required outputs (i.e. both 713 and 715). Modular autoencoder model 700 is trained in this way so that common model 704 is configured to combine the processed inputs 711 and generate the low dimensional data for generating the approximations and/or estimated parameter(s) regardless of which ones of the plurality of inputs 711 are eventually combined by common model 704. To clarify, in FIG. 10, $P_i \rightarrow \phi_i$ represents the input models 702 and the expectation operator E is part of the common model 704, though it is not necessarily true that the output of the expectation operator produces the latent representation (as described herein).

In some embodiments, variation for individual iterations is random, or variation for individual iterations is varied in a statistically meaningful way. For example, the number of channels activated at any particular iteration is typically similar to the number of channels that will be available during actual inference, i.e. representative of typical use. Uniform sampling may be performed over the collection of channels with a probability that matches practical applications. In some embodiments, variation for individual iterations is configured such that after a target number of iterations, each of the processed inputs 711 has been included in the subset of processed inputs at least once. In some embodiments, iteratively varying a subset of processed inputs combined by the common model and used to generate training low dimensional data comprises channel selection from among a set of possible available channels. The set of possible available channels is associated with the sensing (e.g., optical metrology) platform, for example. The iteratively varying, the comparing, and the adjusting, are repeated until the model, and/or an objective (a cost function), converges. In some embodiments, the iteratively varying, the comparing, and the adjusting are configured to reduce or eliminate bias that can occur for a combinatorial search across channels.

By way of a non-limiting example, in optical metrology for semiconductor manufacturing, given features on a wafer are excited using polarized light and the response (raw scattered light intensity and/or phase) is used to infer/measure the parameters of interest of the given features. Data driven inference approaches have been used for the task of parameter estimation. They rely on a significant amount of gathered measurements and models that map measured pupils to the parameters of interest, with labels for these parameters obtained via carefully designed targets on the wafer and/or from third party measurements. However, these approaches have been shown to lack the ability to deal with process changes.

Optical metrology platforms (e.g., tools, apparatuses, etc.) have the capability to measure a significant number of channels (e.g., inputs 711 shown in FIG. 7 such as multiple wavelengths, observations under multiple wafer rotations, multiple light polarization schemes, etc.). However, due to practical timing constraints, the number of channels (inputs 711) that is actually used is often limited to a subset of the available ones (typically up to a maximum of two incoming light channels) when measuring in a production setting. Until now, for the selection of the best channels, a brute force approach is used that tests all possible channel combinations. This is time consuming, resulting in long recipe creation times. Additionally, it can be prone to overfitting, introducing different biases for different channels.

Modular autoencoder model 700 (e.g., input models 702 and/or common model 704) are configured to utilize a framework of statistical modeling, that combines pupil data (as one possible example of an input) from all available channels Pi, $i \in \mathcal{C}$ to provide a straightforward, fast, channel selection, relative to prior systems. As shown in FIG. 10, for a given target that has channels $P_1$ to $P_n$ measured (e.g., inputs 711 shown in FIG. 7), modular autoencoder model 700 is configured to be able to use all of the available data (all channels), but also be able to be evaluated with only a subset of those channels. Model 700 is configured to use of sub-models (e.g., 702) $f_i(P_i) \rightarrow \phi_i$ that extract the information content $\phi_i$ from each target's acquisition channel $P_i$ in a coherent manner across all channels such that the expected information content per channel is the same, i.e. $E[\phi_i]=E[\phi_j]$ for all channels i, j. From this, coherent parameterization (modular autoencoder) model 700 is configured to extract the information that can be used to predict the parameters of interest via another model $g(E[\hat{\phi}]) \rightarrow \hat{o}$, where $\hat{\phi}$ is the joint estimation of a hypothetical full information content description, as is measurable with all channels. Note that this information content may be spread over multiple channels, i.e. the full $\hat{\phi}$ may not be observed with a single channel/measurement.

Given a noisy/incomplete estimate per channel for each $\phi_i$, model 700 is configured to approximate the asymptotic information content that can be retrieved from the stack as:

$$E[\hat{\phi}] \approx \frac{1}{n}\sum_{i=1}^{n} \phi_i$$

by using the finite number of channels available. This states that model 700 is configured to search for a set of parameterizations $\hat{\phi}_i$ that obey $E[\hat{\phi}]=E[\phi_i]$, $\forall_i \in \mathcal{C}$. This quantity is later used to predict the parameters of interest o (e.g., 715 in FIG. 7). Since g (e.g., the encoding part 705 of the common model 704 and the prediction model 708 in FIG. 7 together, except for the expectation operator) takes the expected value of the information content $\hat{\phi}$ as an input, model 700 can use any subset and possible combinations of channels, denoted by $\mathcal{S} \subset \mathcal{C}$, to estimate the parameter of interest o. Note that o are the true labels and ô are the estimates produced by the prediction model. The estimation quality depends on the information quality provided by the channel via each $\phi_i$, $\forall_i \in \mathcal{S}$ that go into determining.

$$E[\hat{\phi}] \approx \frac{1}{|\mathcal{S}|}\sum_{i \in \mathcal{S}} \phi_i.$$

Here there are fewer available channels ($\mathcal{S} \subset \mathcal{C}$) and, as such, the approximation quality for $E[\hat{\phi}]$ is lower. Following the training of the models defined by $f$i, g model 700 evaluate the predicted parameters of interest for any combination of channels by estimating the quantity $E[\hat{\phi}]$ using a subset of the channels. An example for two (e.g., 1050) and three (e.g., 1052) input channels is presented in FIG. 10, but many other possible examples are contemplated.

In some embodiments, an input model (e.g., a neural network block) 702 (FIG. 7), is associated with each input channel. An input model 702 is configured to be trained and can represent the functions $f_c$ presented above. To ensure a good model performance, model 700 comprises common model 704 configured to combine the information content produced from each channel (by each input model 702) to produce the modular autoencoder structure shown in FIG. 7.

Figure 11:
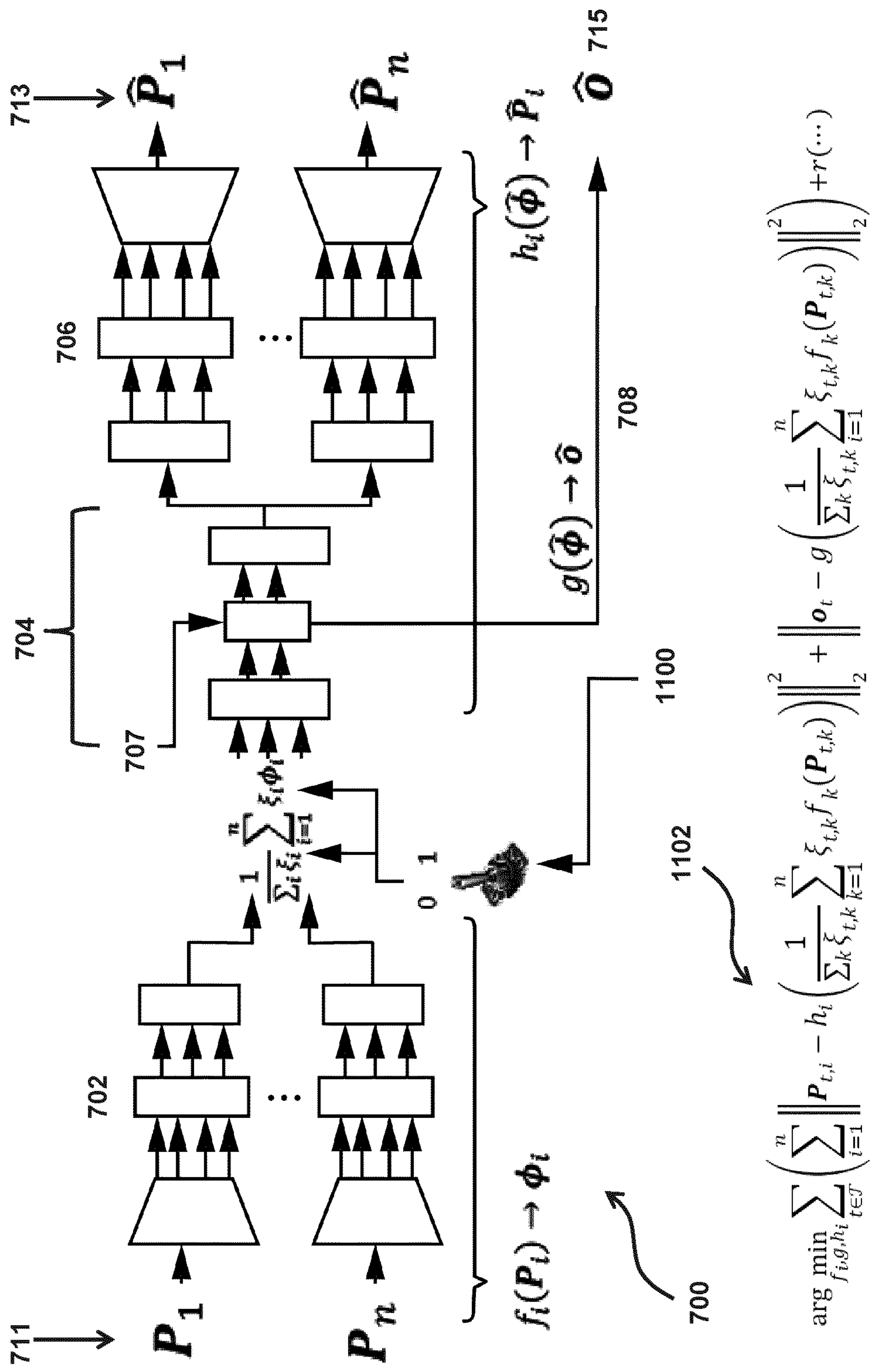
FIG. 11 illustrates a common model, output models (neural network blocks—corresponding to each input channel in this example), and other components of the modular autoencoder model, according to an embodiment.

FIG. 11 also illustrates modular autoencoder model 700, but with additional details related to the discussion of FIG. 10 above. FIG. 11 illustrates common model 704, output models 706 (neural network blocks—corresponding to each input channel in this example), and other components of model 700. In this example, model 700 is configured to be trained to estimate and/or predict both pupils (pupil images), for example, and parameters of interest. Model 700 shown in FIG. 11 (and FIG. 7) is configured to converge in terms of the information content expectation $E[\hat{\phi}]$ because model 700 is configured to iteratively vary/sub-select (e.g., randomly or in a statistically meaningful way) a number of channels that are used to approximate $\hat{\phi}$ during every step of the training (indicated by 1100 in FIG. 11). This iterative variation/sub-selection ensures that model 700 remains predictive/consistent for any combination of input channels. Furthermore, since the information content present in $\hat{\phi}$ needs to represent all channels (i.e., $\hat{P}i$), the resulting model will not reproduce a bias specific to one particular channel. Mathematically, the training can be stated as the minimization with respect to the definition of the function $f_k$, g, $h_i$, $\forall_i$, $k \in \mathcal{C}$ of the cost function 1102 shown in FIG. 11. In cost function 1102, the function r(•) acts as a regularization of the latent parametrization or other types of regularization, and the quantities $\xi_{t,i}$ are randomly (in this example) selected from the set $\{0, 1\}$, for a number of different measured targets $t \in \mathcal{T}$.

To reiterate, this approach allows for the training of a single model (e.g., 700) that uses all, or substantially all, available data instead of a brute force combinatorial search for the best model/channels. It decreases the time to recipe since the training computational complexity depends linearly on the number of channels as opposed to combinatorially in prior approaches. Also, the present methodology reduces the bias that can occur for the combinatorial search across channels since the present methodology ensures that, during training, all of the channel information is used. Because the whole model 700 is trained to account for all different sub-selections of channels, the resulting models produce results consistent with respect to channel selection.

Figure 12:
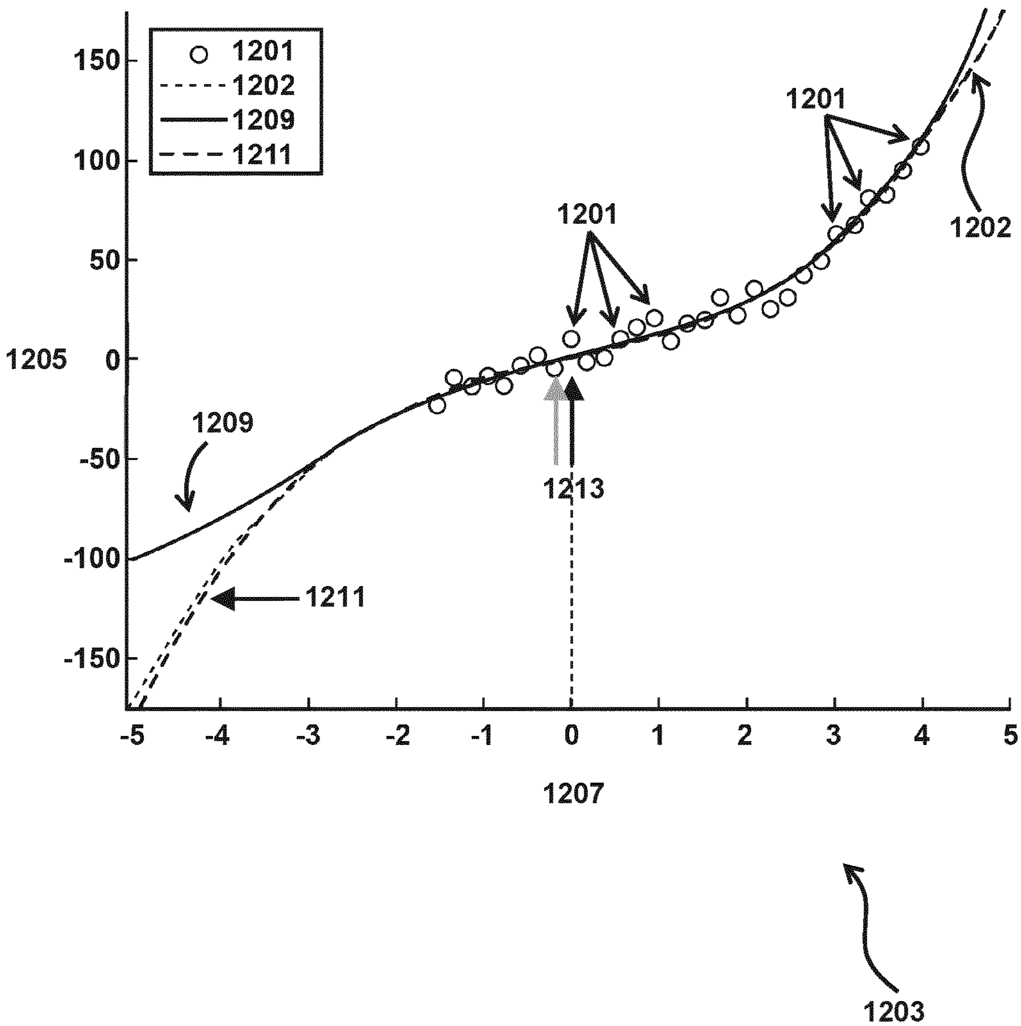
FIG. 12 illustrates a graphical interpretation of enforcing a known property of encoded input to generate output, according to an embodiment.

FIG. 12 illustrates aspects of how modular autoencoder model 700 (see FIG. 7) has an extended range of applicability for estimating parameters of interest for manufacturing and/or sensing (e.g., optical metrology) operations. Modular autoencoder model 700 (see FIG. 7) has an extended range of applicability for estimating parameters of interest for manufacturing and/or sensing (e.g., optical metrology) operations because it is configured to enforce known properties of inputs 711 (FIG. 7) in decoder portion 709 (FIG. 7), which can include one or more output models 706 (as described above). In some embodiments, decoder portion 709 is configured to generate an output 713 (FIG. 7) corresponding to an input 711 by decoding a low dimensional representation of input 711 while enforcing, during decoding (a result of enforcement during training), a known property of the encoded input 711 to generate output 713. Effectively, enforcement occurs originally during training After training, the enforcement becomes a property of the model. Strictly speaking during training a decoding is also performed, though. The known property is associated with a known physical relationship between the low dimensional representation in latent space 707 (FIG. 7) for input 711, and output 713. In some embodiments, the known property is a known symmetry property, a known non-symmetry property, and/or other known properties. In some embodiments, decoder portion 709 may be configured to enforce the known property at some intermediate decoding level (e.g., at the interface between common model 704 and output models 706), utilizing the modularity of model 700. A parameter of interest can be estimated based on output 713 and/or the low dimensional representation of input 711 in latent space 707 (as described herein). For example, in some embodiments, for the prediction model, with respect to the use of symmetries, the prediction model may be a selection mask (e.g., selection of the parameters from the latent space to be associated with the parameter of interest). This can still be represented as a neural network layer. However, it remains fixed during training (it becomes a fixed linear layer $\sigma$(W x+b) where each row in W contains only one value 1 and the other elements are set to 0, b contains only elements equal to 0 and $\sigma$(•) is identity).

In some embodiments, decoder portion 709 (which can include one or more output models 706 in some embodiments) is configured to enforce a known symmetry property and/or other properties of an encoded input during a training phase, such that modular autoencoder model 700 obeys the enforced known symmetry property (and/or other properties) during an inference phase to generate the output. Enforcing comprises penalizing differences between output 713 and an output that should be generated according to the known property using a penalty term in a cost function associated with decoder portion 709 (this can include one or more output models 706). The penalty term comprises a difference between decoded versions of the low dimensional representation of the input which are related to each other through physical priors. In some embodiments, the known property is a known symmetry property, and the penalty term comprises a difference between decoded versions of the low dimensional representation of input 711 which are reflected across, or rotated around, a point of symmetry, relative to each other. In some embodiments, one or more of the input models 702, encoder portion 705, decoder portion 709, one or more of the output models 706, prediction model 708, and/or other components of model 700 (see FIG. 7) are configured to be adjusted (e.g., trained or further trained) based on any differences between the decoded versions of the low dimensional representation.

By way of a non-limiting example, optical metrology platforms (e.g., apparatuses, tools, etc.) are configured to measure critical semiconductor stack parameters directly on product structures. To do so, machine learning methods are often applied on top of optical scatterometry data acquired using the optical metrology platform. These machine learning methods conceptually amount to supervised learning approaches, i.e. learning from labeled datasets. The success of such methods is dependent on the quality of the labels.

There are common approaches for obtaining labels. One approach uses self-reference targets, which are specifically designed targets for obtaining labeled data. A second approach relies on a tool of record in a semiconductor fab (typically a scanning electron microscope). Due to the competitive advantage of having freedom in design of a self-reference target, and due to the independence of competitive metrology solutions, the self-reference target approach is often preferred.

One of the primary challenges of using self-reference targets is the fact that they only provide very accurate relative labels. This means that within one target cluster, there is some unknown cluster bias, on top of which accurate labels are known. Determining this unknown cluster bias, and hence obtaining absolute labels, is important to the accuracy of self-reference target based manufacturing and/or inspection parameter recipes. The procedure of estimating the cluster bias is usually referred to as label correction.

For a linear signal (e.g., input 711 shown in FIG. 7 such as pupil images, etc.) as a function of the parameter of interest, this label correction problem is unsolvable. Hence, approaches to exploit non-linearity in the signal, (e.g., the pupil images and/or other inputs 711), are being explored. At present, there is no approach known to us that exploits physical assumptions regarding signal non-linearity, and/or direction in the signal-space.

A signal (e.g., input 711) of interest (e.g., from a metrology platform), such as an anti-symmetric cross-polarized pupil signal caused by overlay, is anti-symmetric (an odd-symmetric function) with regards to the stack parametrization, when all asymmetric parameters are negated simultaneously. More specifically, the signal may be anti-symmetric (an odd-symmetric function) around 0 overlay when all other asymmetric parameters are zero. This kind of domain knowledge can be embedded into model 700 (see FIG. 7) during the training phase, which adds physical interpretability to model 700. Moreover, the point of symmetry is of significance, as it defines the origin (the zero) of the model's parameterization, which can be exploited to calibrate absolute accuracy such that the appropriate corrected labels can be found. Model 700 is configured to exploit this and other physical understandings and embed it into model 700. In this example, the general pupil property that is exploited is the following:

$$I^a_{DE}(\theta_a) = -I^a_{DE}(-\theta_a)$$

where $I^a_{DE}$ represents antisymmetric normalized pupils and �� is the collection of asymmetric parameters.

Referring to modular autoencoder model 700 shown in FIGS. 10, and 11 (and FIG. 7), P (e.g., input 711) in this example, can be a pupil image ($P=I^a_{DE}$ for notational convenience), $f(P)$ encodes (e.g., by one or more input models 702 and/or common model 704) this pupil image into a compressed representation $\{\hat{\theta}_s,\hat{\theta}_a\}$, which is finally decoded by $g(\hat{\theta}_s,\hat{\theta}_a)$ to produce an approximate pupil $\hat{P}\approx P$. This model is trained in such a way that $\hat{ov} \subset \hat{\theta}_a$ approximates true overlay ov, i.e. one of the elements in $\hat{\theta}_a$ represents overlay. For self-reference targets this model can be trained using the following objective (e.g., cost function):

$$\underset{f,g,B}{\arg\min}\ \|P-\hat{P}\|^2 + \alpha\|ov-\hat{ov}\|^2,$$

where the true overlay is set to ov=L+B, with known labels L and unknown cluster biases B. In practice, this approach may be insufficient as there is some freedom to choose the cluster biases B. This effectively amounts to moving the origin of the parameterization $\{\hat{\theta}_s,\hat{\theta}_a\}$, which may be problematic, because absolute overlay estimation is desired. In order to reduce this ambiguity, another term is added to the objective (cost function) that embeds the symmetry properties of the signal (e.g., input 711) into the decoding model $g(\hat{\theta}_s,\hat{\theta}_a)$ (e.g., common model 704 and/or one or more output models 706):

$$\underset{f,g,B}{\arg\min}\ \|P-\hat{P}\|^2 + \alpha\|ov-\hat{ov}\|^2 + \beta\|g(\hat{\theta}_s,\hat{\theta}_a) + g(\hat{\theta}_s,\hat{\theta}_a)\|^2,$$

for any $\{\hat{\theta}_s,\hat{\theta}_a\}$. In practice, minimization of this cost function for any $\{\hat{\theta}_s,\hat{\theta}_a\}$ cannot be ensured, however, points from the process window can be sampled to ensure that the third terms is small for an arbitrarily large sample.

FIG. 12 illustrates a graphical interpretation of enforcing a known property of the encoded input 711 (FIG. 7) to generate output 713 (FIG. 7). The known property is associated with a known physical relationship between the low dimensional representation in latent space 707 (FIG. 7) for input 711, and output 713. In this example, the known property is a known symmetry property (e.g., a "symmetry prior"). FIG. 12 illustrates a sample of a signal (e.g., input 711) that may be available (dots 1201), which poorly samples the evolution of a semiconductor manufacturing and/or sensing process 1202, on a (input) signal 1205 versus parameter 1207 plot 1203. If knowledge about symmetry of process 1202 is not embedded, model 700 might end up estimating and/or predicting parameters 1207 that follow line 1209 in FIG. 12. Although line 1209 fits the data (dots 1201) very well, it does not represent process 1202 well outside of the sampled range. Embedding a known symmetry property into model 700 (FIG. 7), as shown by line 1211, causes model 700 to estimate and/or predict parameters 1207 that match process 1202 along a much wider range. Moreover, as mentioned before, the zero crossing 1213 or the point of symmetry is of significance. Clearly, in this example, data is significantly closer to the true origin with model 700 after adding the known symmetry property (prior).

Figure 13:
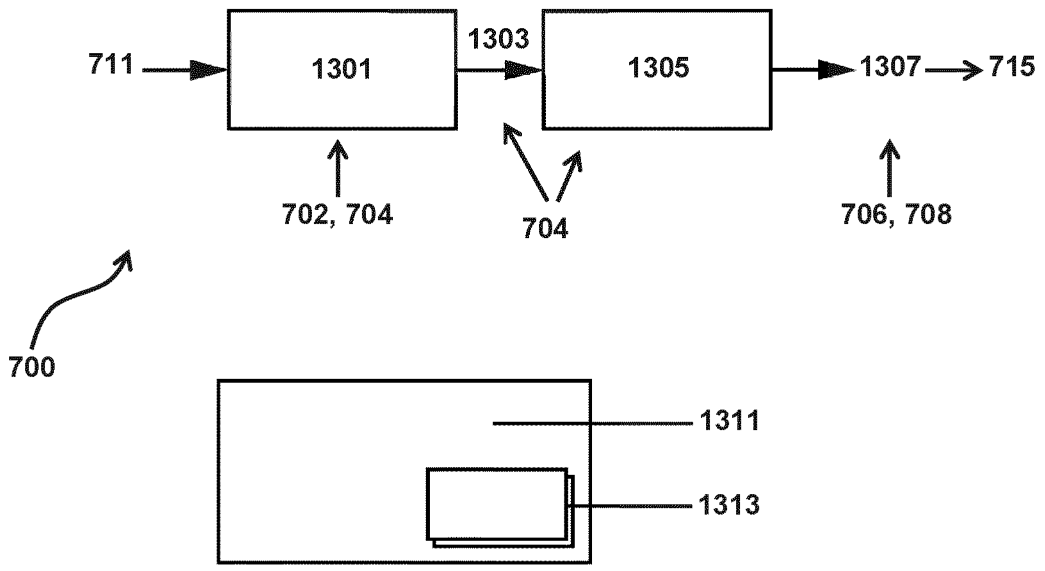
FIG. 13 illustrates an application of the modular autoencoder model for semi-supervised learning, according to an embodiment.

FIG. 13 illustrates an application of modular autoencoder model 700 (shown in FIG. 7) for semi-supervised learning. For example, this may be for in-device metrology and/or for other applications. Optical metrology platforms (e.g., apparatuses, tools, etc.) are often configured to infer physical parameters of the structures on a semiconductor wafer, from corresponding pupil images. A model associated with the optical metrology platform is usually trained and then used for inference (e.g., estimating and/or predicting parameters of interest). During training, training pupils are acquired and labeled using either self-reference targets or using critical dimension scanning electron microscope (SEM) data. From these labeled pupils, a mapping from pupils to the labels is learned by the model, which is then applied during inference. The availability of labeled pupils is limited because the SEM data is often expensive to obtain. This is partially due to the fact that the SEM measurements can be destructive to a semiconductor stack and because it is a slow metrology technique. As a result of this only a limited, yet expensive, training data set is available.

Pupil images are made up of a large number of pixels. Currently, the training step entails learning a mapping from this high-dimensional signal (e.g., input 711 shown in FIG. 7) to one or several parameter(s) of interest (e.g., 715 shown in FIG. 7). Due to the high dimensionality of the signal, a significant number of training images are needed, which means that a significant number of SEM measurements are also required. With respect to signal noise: a stack response signal spans a low dimensional space which becomes high dimensional when the observations are contaminated by noise (the noise spans the full space). The noise does not carry any information regarding the stack and, as such, acts only as a perturbation. This is a reason why the auto-encoder structure can be used, to learn the low dimensional representation of the stack contribution while also acting as a noise filter. The process changes the stack responses in non-trivial manners and, as such, there is a need to sample many places in the process window to be able to learn the behavior of the parameter throughout the process window.

Pupil images (e.g., inputs 711), as one example input, have a low signal complexity. This is due to the fact that a semiconductor stack can be described using a limited set of physical parameters. Advantageously, model 700 is configured to be trained in two or more stages, with different training datasets. In some embodiments, a pupil image signal and/or other inputs 711 are compressed in an unsupervised way, yielding a mapping from pupils (or whatever input is used) to an arbitrary, low-dimensional subspace (e.g., latent space 707 shown in FIG. 7). Next, using a smaller number of labeled pupils and/or other inputs 711, the mapping from the low-dimensional subspace to the parameter(s) of interest is learned. This can be performed using a reduced number of targets, because the mapping is simpler (lower in dimensionality), which helps mitigate the problems described above. This can be considered an application of semi-supervised learning. The general concept of a compression step 1301 followed by embedding 1303, a regression step 1305, and inference 1307 (e.g., 715 shown in FIG. 7) is depicted in FIG. 13. The compression step is trained on an unlabeled 1311 dataset and the regression step on a smaller, labeled 1313 dataset, as also depicted in FIG. 13.

Two primary approaches for training the structure shown in FIG. 13 (and in FIG. 7 and/or other figures) can be distinguished. First, the components of model 700 (e.g., one or more input models 702, common model 704, one or more output models 706, and/or prediction model 708) can be trained separately, in a sequential way. Second, they can be trained simultaneously. If the components of model 700 are trained sequentially, any unsupervised dimensionality reduction technique can be applied for the compression. For example, linear (principal component analysis—PCA, independent component analysis—ICA, . . . ) or nonlinear (autoencoders, t-distributed stochastic neighbor embedding—t-SNE, uniform manifold approximation and projection—UMAP, . . . ) techniques can be used. After the compression step, any regression technique can be applied to the embedding (e.g., linear regression, neural networks, . . . ). When training (e.g., two or more) components simultaneously, a neural network may be used for both steps. This is because most unsupervised learning techniques are not well suited to be modified into such a semi-supervised structure. An autoencoder can be used in the compression step and a forward neural network can be used in the regression step, for example. These can be trained simultaneously by choosing the optimization objective (cost function) in such a way that the regression step is only trained (i.e. penalized) for the labeled elements of the dataset, while the compression step is trained for any element of the dataset.

Figure 14:
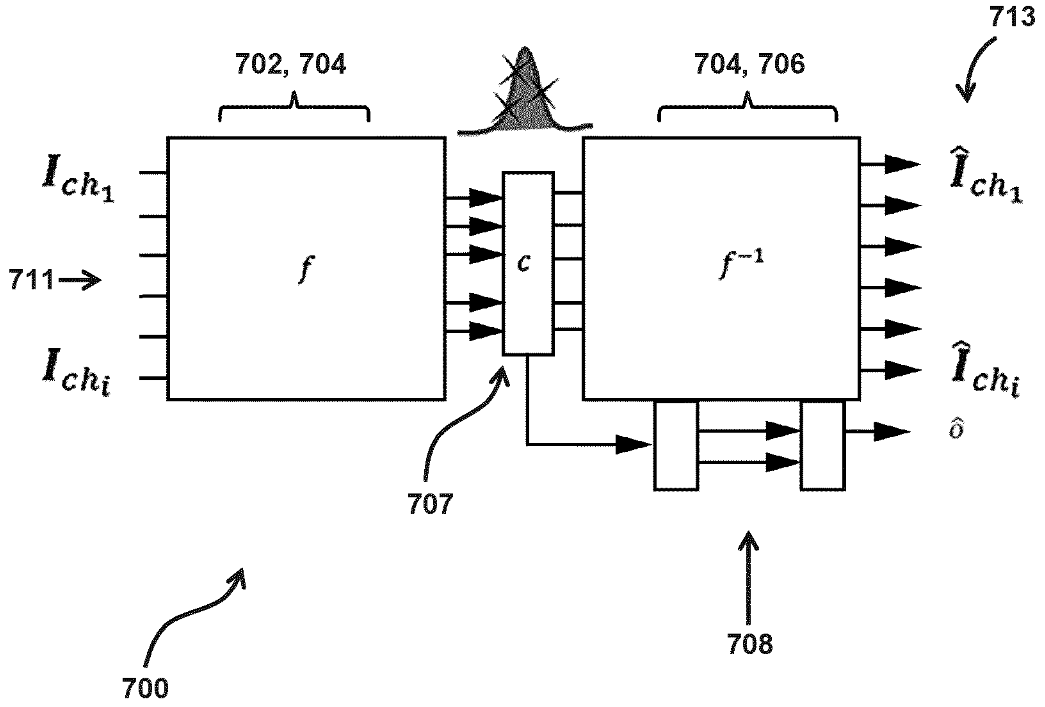
FIG. 14 illustrates how, in some embodiments, the modular autoencoder model is configured to include recursive deep leaning autoencoder structures.
Figure 15:
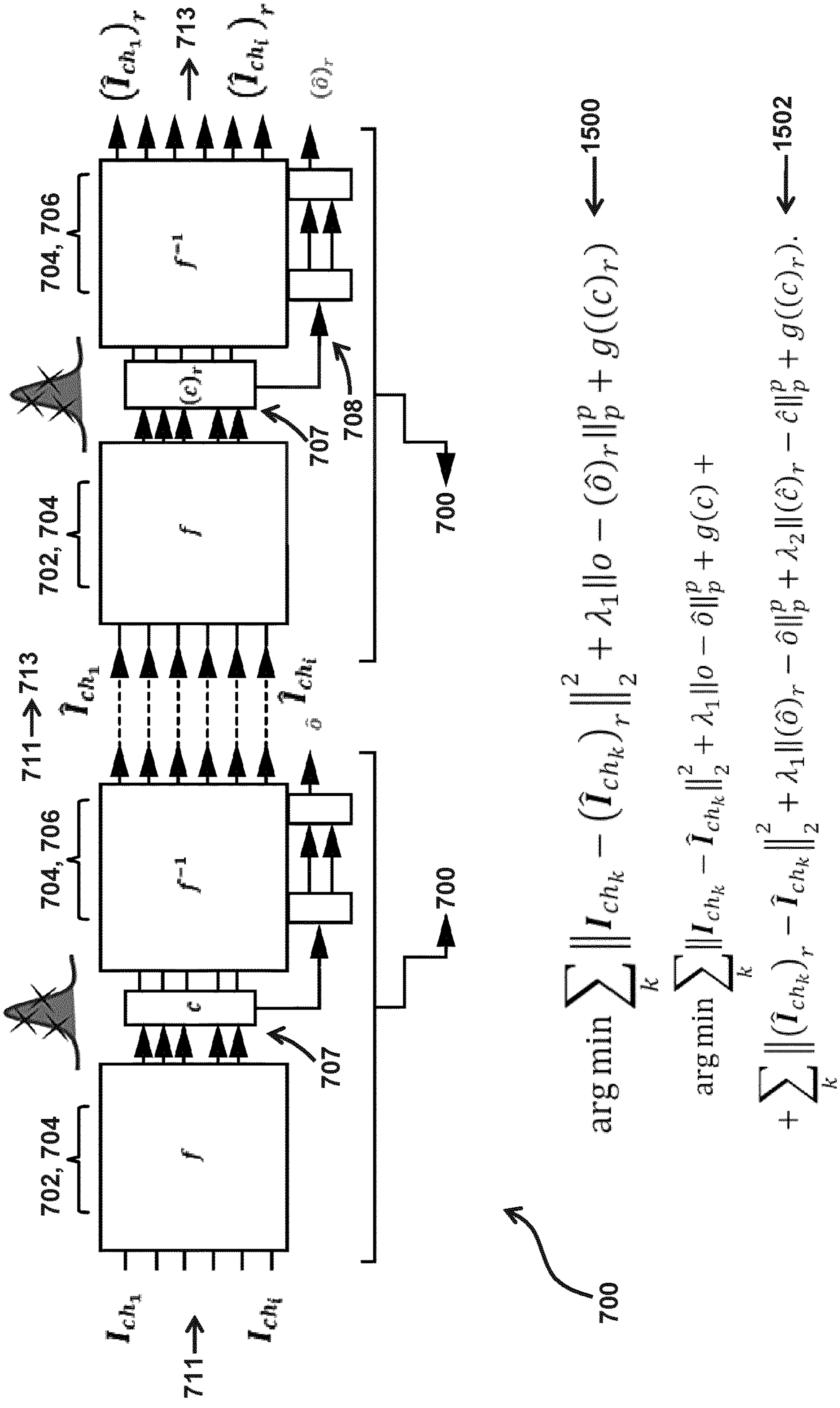
FIG. 15 also illustrates how, in some embodiments, the modular autoencoder model is configured to include recursive deep leaning autoencoder structures.

In some embodiments, modular autoencoder model 700 (FIG. 7) is configured to include recursive deep leaning autoencoder structures. FIGS. 14 and 15 illustrate examples of such structures. For example, in optical metrology for semiconductor devices, features on a wafer are excited using polarized light and the response (raw scattered light intensity and/or phase) is used to infer/measure the parameters of interest of the given features. Two classes of methods are often applied for the parameter inference. As describe above, data driven approaches rely on significant amount of gathered measurements and simplified models that map pupils to the parameters of interest, with labels obtained via carefully designed targets on the wafer or from third party measurements. The second class models the target response under the sensor explicitly (e.g., with the Jones model). This class uses physical models, electronic, and/or physical/electronic hybrid approaches to determine a stack parametrization that best fits the measurements.

Autoencoders may be used for data driven methods (as described herein). They have the advantage of creating a richer model, capable of modeling complex signals (inputs) while also performing complex parameter inference. A coupling of an autoencoder model with variational Bayesian priors (e.g., known properties about inputs) is also possible ensuring the continuity of the latent space (i.e. the dimensionality reduction space of the bottleneck in an autoencoder) and of the resulting generative model. A schematic representation of this concept is shown in FIG. 7, FIG. 11, etc., and described herein.

FIG. 14 follows the concepts described above. A mapping from an input 711 comprising (in this example) a set of intensities over several channels ($I_{ch1}, \ldots, I_{chi}$) to a compact representation c is performed by the encoding layers (e.g., one or more input models 702, and/or common model 704). The reverse of this, going from the compact representation $\hat{c}$ (e.g., in latent space 707) back to the intensity space ($\hat{I}_{ch1}, \ldots, \hat{I}_{chi}$), e.g., outputs 713, is done by the decoding layers (e.g., common model 704 and/or one or more output models 706). This creates a model (e.g., modular autoencoder model 700) configured to extract the relevant information from a large number of pixels (in the range of several 1000s), for example, and compress this to a space of several 10s of parameters. From this compressed representation a link to the parameters of interest $\hat{\sigma}$ (e.g., by prediction model 708) is made.

Model 700 can be trained with a Bayesian prior (e.g., known property about an input) applied on the latent representation c (to ensure that c follows a given distribution, e.g., a multivariate Gaussian) such that the representation c becomes continuous and not a point estimate. Effectively, such a prior also encodes mathematically that a small change in the parametrization c needs to be reflected by a similarly small change in the estimated intensities $\hat{I}$. Thus, if for a given input 711, $I_{chk}$, $\forall k \in [1, \ldots, i]$, a certain parametrization of the latent space may be obtained and a given estimate $\hat{I}_{chk}$ approximately equal to $I_{chk}$, and any change $\delta c$ in the latent space should be reflected by a proportional change in the estimates $\hat{I}_{chk}$. Such a mapping, producing a continuous latent space, may prevent a model such as model 700 from effectively learning to classify the data, a problem that neural networks with discrete latent spaces often run into.

Decoding layers (e.g., common model 704 and/or one or more output models 706) in an autoencoder model such as model 700 are able to provide a characterization of a signal (input) in a generative manner that is continuous and can generalize well (from a latent space to a pupil space), especially if variational priors (known properties about inputs) are used. In some embodiments, the prior is used to regularize the distribution of the latent space and affects mainly the generative part of the model. It does not affect in a significant way the manifold compression part of the model (the encoder, from a pupil space to the latent space, formed by one or more input models 702 and/or common model 704). As such, model 700 may be sub optimal in terms of generalization capabilities when applied for the task of direct parameter inference, since the encoder part of model 700 may not be trained to account for a continuous input space (although model 700 can be and/or is trained in this way).

In some embodiments, model 700 comprises a recursive model scheme for which the training of both the encoding layers (702, 704) and decoding layers (704, 706) benefits from one or more variational priors (prior knowledge about inputs) that are placed on the latent space c (e.g., 707). In FIG. 14, the encoding part (702, 704) of model 700 comprises the function $f(I_{ch1}, \ldots, I_{chi}) \rightarrow c$ that maps to the parametrization c of latent space 707. Similarly, the decoding part (704, 706) can be viewed as an approximation of the inverse of this function $f^{-1}(c) \rightarrow (\hat{I}_{ch1}, \ldots, \hat{I}_{chi})$. The variational prior (e.g., prior knowledge about an input) placed on latent space 707 ensures that model 700 learns a distribution for each of the latent variable, not a point estimate. As such, model 700 also learns the distribution of output data given the latent distribution.

In some embodiments, model 700 is configured to use the variational scheme (able to generate a continuous latent space that maps small variations in c to small variations in the predicted intensities $\hat{I}_{ch1}, \ldots, \hat{I}_{chi}$) in such a way that the encoding part $f$ can map small changes in the intensities $I_{ch1} \ldots, I_{chi}$, e.g., inputs 711, to similar changes in the latent representation c. This may be done by training modular autoencoder model 700 in a recursive way, making sure that the generated outputs 713, e.g., intensity estimates $\hat{I}_{ch1}, \ldots, \hat{I}_{chi}$, if passed as inputs 711 to the same model 700, generate valid latent representations c and valid decoded outputs 713 (e.g., intensity estimates).

FIG. 15 illustrates an unfolded version of this recursive scheme. This scheme can be extended for any number of recursion passes. (Note that this recursive scheme is different than the iterative operations described related to FIGS. 10 and 11.) FIG. 15 illustrates model 700 comprising two (or in general, r) distinct passes through the same model 700. The first pass takes a physical, measured, realization of the data and maps it to a given distribution in the latent space. From this distribution of the latent space samples can be drawn that are used to generate the output estimates $\hat{I}_{ch1}, \ldots, \hat{I}_{chi}$. These samples for the output estimates are then passed through model 700 again as synthetic inputs to ensure that the encoder part (702, 704) of model 700 maps them to a similar distribution in latent space 707.

Typically, for the training of the unfolded embodiment of model 700 shown in FIG. 15, the same input-output cost function 1500 can be used that is used for traditional (variational) autoencoders (see 1500 in FIG. 15). In cost function 1500, g is a regularization term that encodes the variational prior, o is a given parameter of interest label for which we want to find the prediction $(\hat{o})_r$, in a given norm p. More refined cost functions can also be devised for the training, by linking the internal state of the data between recursions. These may include cost function 1502 shown in FIG. 15, and/or other cost functions.

It should be noted that although the description herein often refers to a (single) latent space, this should not be considered limiting. The principles described herein may be applied with and/or to any nonzero number of latent spaces. The one or more latent spaces may be used in series (e.g., for analyzing data and/or making a first prediction, then a second, etc.), in parallel (e.g., for analyzing data and/or making predictions simultaneously), and/or in other ways.

Figure 16:
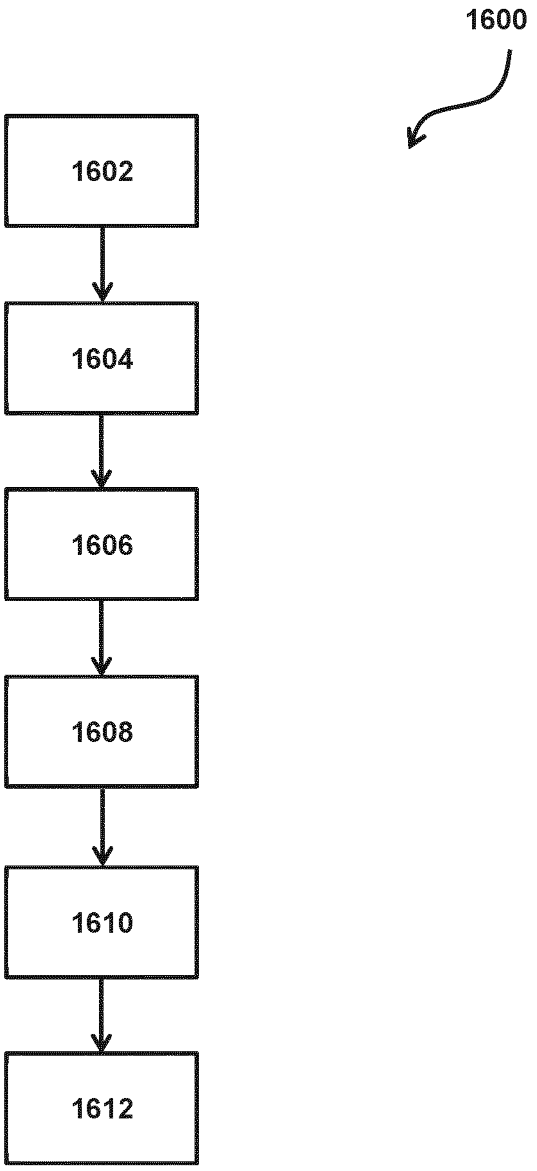
FIG. 16 illustrates a method for parameter estimation, according to an embodiment.

In some embodiments, one or more of the operations described herein may be combined into one or more specific methods. An example of one of these methods is illustrated in FIG. 16. FIG. 16 illustrates a method 1600 for parameter estimation. Method 1600 comprises training 1602 a modular autoencoder model (e.g., model 700 shown in FIG. 7 and described herein) for parameter estimation and/or prediction. This may include programming components of the model, inference, and/or other operations. Training may be performed with one or more of the operations described herein, for example. Method 1600 comprises processing 1604, with one or more input models (e.g., 702) of a modular autoencoder model, one or more inputs (e.g., 711) to a first level of dimensionality suitable for combination with other inputs. Method 1600 comprises combining 1606, with a common model (e.g., 704) of the modular autoencoder model, the processed inputs and reducing a dimensionality of the combined processed inputs to generate low dimensional data in a latent space. The low dimensional data in the latent space has a second level of resulting reduced dimensionality that is less than the first level. Method 1600 comprises expanding 1608, with the common model, the low dimensional data in the latent space into one or more expanded versions of the one or more inputs. The one or more expanded versions of the one or more inputs has increased dimensionality compared to the low dimensional data in the latent space. The one or more expanded versions of the one or more inputs is suitable for generating one or more different outputs (e.g., 713). Method 1600 comprises using 1610, with one or more output models (e.g., 706) of the modular autoencoder model, the one or more expanded versions of the one or more inputs to generate the one or more different outputs. The one or more different outputs are approximations of the one or more inputs. The one or more different outputs have the same or increased dimensionality compared to the expanded versions of the one or more inputs. Method 1600 comprises estimating 1612, with a prediction model (e.g., 708) of the modular autoencoder model, one or more parameters based on the low dimensional data in the latent space and/or the one or more outputs.

Other operations described herein may form separate methods, or they may be included in one or more steps (1602-1612) of method 1600. The operations described herein are intended to be illustrative. In some embodiments, a method may be accomplished with one or more additional operations not described, and/or without one or more of the operations discussed. Additionally, the order in which the operations of a given method are assembled and otherwise described herein is not intended to be limiting. In some embodiments, one or more portions of a given method may be implemented (e.g., by simulation, modeling, etc.) in one or more processing devices (e.g., one or more processors). The one or more processing devices may include one or more devices executing some or all of the operations of the operations described herein in response to instructions stored electronically on an electronic storage medium. The one or more processing devices may include one or more devices configured through hardware, firmware, and/or software to be specifically designed for execution of one or more of the operations of a given method, for example.

The principles described herein (e.g., utilizing the relatively lower dimensionality of a latent space in a trained parameterized model to predict and/or otherwise determine process information) may have multiple additional applications (e.g., in addition to and/or instead of the applications described above). For example, the present system(s) and method(s) may be used to harmonize data from different process sensors and/or tools that may be different, even for the same measured or imaged target.

Figure 17:
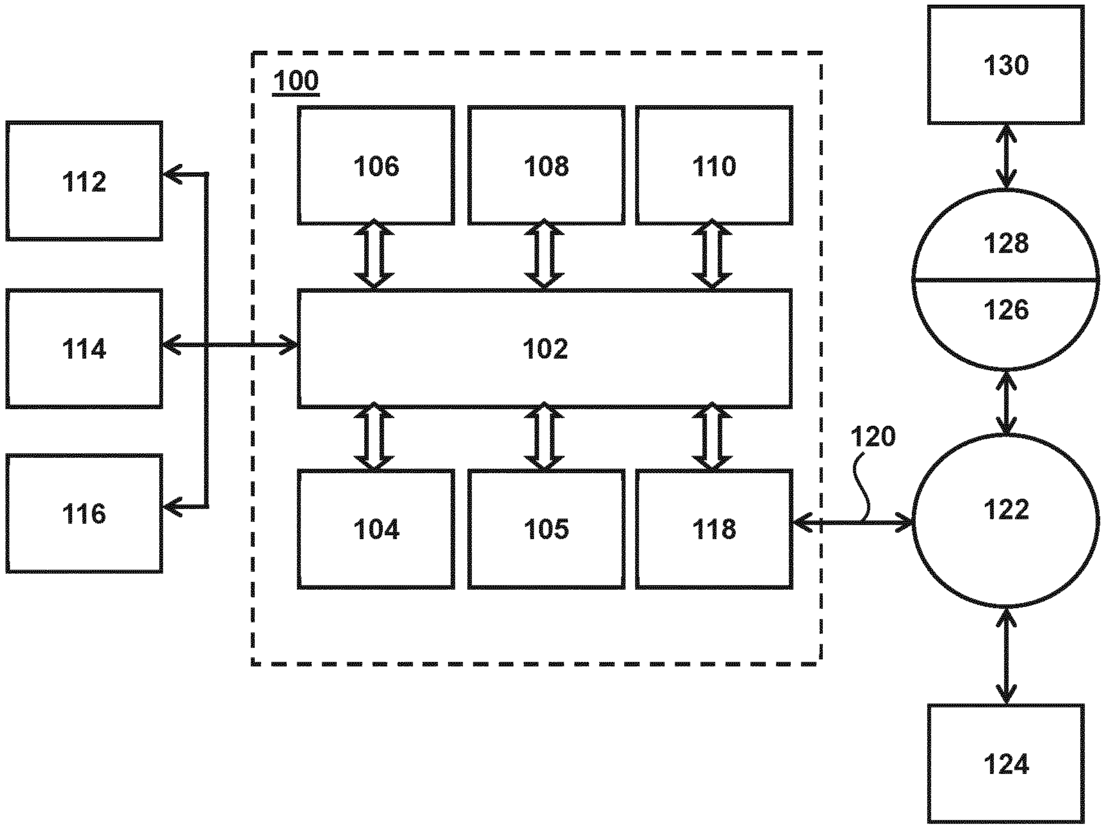
FIG. 17 is a block diagram of an example computer system, according to an embodiment.

FIG. 17 is a block diagram that illustrates a computer system 100 that can perform and/or assist in implementing the methods, flows, systems, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 18:
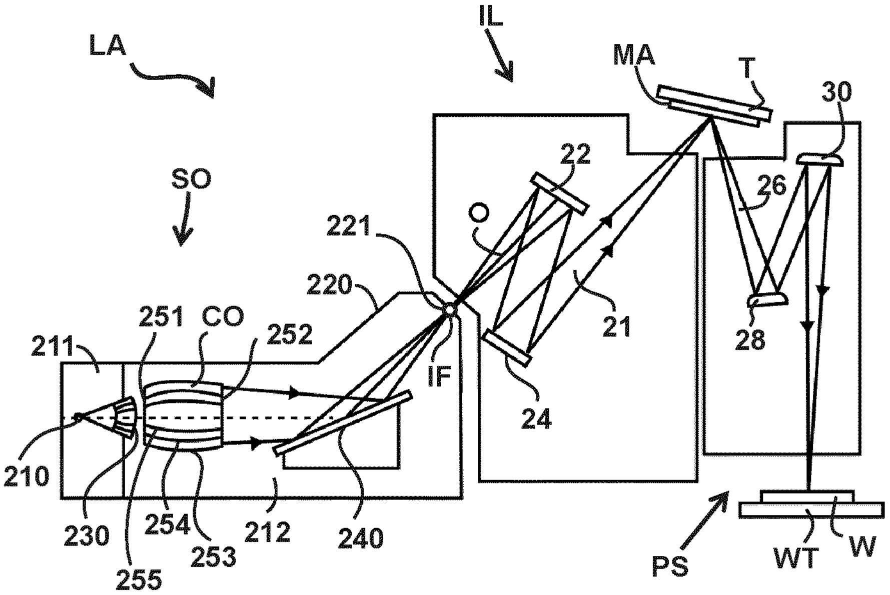
FIG. 18 is an alternative design for the lithography apparatus of FIG. 1, according to an embodiment.

FIG. 18 is a detailed view of an alternative design for the lithographic projection apparatus LA shown in FIG. 1. (FIG. 1 relates to DUV radiation because lenses are used and a transparent reticle is used, while FIG. 18 relates to a lithographic apparatus which uses EUV radiation because mirrors and a reflective reticle are used.) As shown in FIG. 18, the lithographic projection apparatus can include the source SO, the illumination system IL, and the projection system PS. The source SO is configured such that a vacuum environment can be maintained in an enclosing structure 220 of the source SO. An EUV (for example) radiation emitting plasma 210 may be formed by a discharge produced plasma source. EUV radiation may be produced by a gas or vapor, for example Xe gas, Li vapor or Sn vapor in which plasma 210 is created to emit radiation in the EUV range of the electromagnetic spectrum. The plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by plasma 210 is passed from a source chamber 211 into a collector chamber 212 via an optional gas barrier or contaminant trap 230 (in some cases also referred to as contaminant barrier or foil trap) which is positioned in or behind an opening in source chamber 211.

The contaminant trap 230 may include a channel structure. Chamber 211 may include a radiation collector CO which may be a grazing incidence collector, for example. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the line 'O'. The virtual source point IF is commonly referred to as the intermediate focus, and the source is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the radiation beam 21 at the patterning device MA, held by the support structure (table) T, a patterned beam 26 is formed and the patterned beam 26 is imaged by the projection system PS via reflective elements 28, 30 onto a substrate W held by the substrate table WT. More elements than shown may generally be present in illumination optics unit IL and projection system PS. The grating spectral filter 240 may optionally be present, depending upon the type of lithographic apparatus, for example. Further, there may be more mirrors present than those shown in the figures, for example there may be 1-6 additional reflective elements present in the projection system PS than shown in FIG. 18.

Collector optic CO, as illustrated in FIG. 18, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Further embodiments are disclosed in the subsequent list of numbered clauses:

1. A non-transitory computer readable medium having instructions thereon, the instructions configured to cause a computer to execute a modular autoencoder model for parameter estimation, the modular autoencoder model comprising:
   - one or more input models configured to process one or more inputs to a first level of dimensionality suitable for combination with other inputs;
   - a common model configured to:
     - combine the processed inputs and reduce a dimensionality of the combined processed inputs to generate low dimensional data in a latent space, the low dimensional data in the latent space having a second level of resulting reduced dimensionality that is less than the first level;
     - expand the low dimensional data in the latent space into one or more expanded versions of the one or more inputs, the one or more expanded versions of the one or more inputs having increased dimensionality compared to the low dimensional data in the latent space, the one or more expanded versions of the one or more inputs suitable for generating one or more different outputs;
   - one or more output models configured to use the one or more expanded versions of the one or more inputs to generate the one or more different outputs, the one or more different outputs being approximations of the one or more inputs, the one or more different outputs having the same or increased dimensionality compared to the expanded versions of the one or more inputs; and a prediction model configured to estimate one or more parameters based on the low dimensional data in the latent space and/or the one or more different outputs.

2. The medium of clause 1, wherein individual input models and/or output models comprise two or more sub-models, the two or more sub-models associated with different portions of a sensing operation and/or a manufacturing process.

3. The medium of any of the previous clauses, wherein an individual output model comprises the two or more sub-models, and the two or more sub-models comprise a sensor model and a stack model for a semiconductor sensor operation.

4. The medium of any of the previous clauses, wherein the one or more input models, the common model, and the one or more output models are separate from each other and correspond to process physics differences in different parts of a manufacturing process and/or a sensing operation such that each of the one or more input models, the common model, and/or the one or more output models can be trained together and/or separately, but individually configured based on the process physics for a corresponding part of the manufacturing process and/or sensing operation, apart from other models in the modular autoencoder model.

5. The medium of any of the previous clauses, wherein a quantity of the one or more input models, and a quantity of the one or more output models are determined based on process physics differences in different parts of a manufacturing process and/or a sensing operation.

6. The medium of any of the previous clauses, wherein the quantity of input models is different than the quantity of output models.

7. The medium of any of the previous clauses, wherein:
   - the common model comprises encoder-decoder architecture and/or variational encoder-decoder architecture;
   - processing the one or more inputs to the first level of dimensionality, and reducing the dimensionality of the combined processed inputs comprises encoding; and
   - expanding the low dimensional data in the latent space into the one or more expanded versions of the one or more inputs comprises decoding.

8. The medium of any of the previous clauses, wherein the modular autoencoder model is trained by comparing the one or more different outputs to corresponding inputs, and adjusting a parameterization of the one or more input models, the common model, and/or the one or more output models to reduce or minimize a difference between an output and a corresponding input.

9. The medium of any of any of the previous clauses, wherein the common model comprises an encoder and a decoder, and wherein the modular autoencoder model is trained by:
   - applying variation to the low dimensional data in the latent space such that the common model decodes a relatively more continuous latent space to generate a decoder signal;
   - recursively providing the decoder signal to the encoder to generate new low dimensional data;
   - comparing the new low dimensional data to the low dimensional data; and
   - adjusting one or more components of the modular autoencoder model based on the comparison to reduce or minimize a difference between the new low dimensional data and the low dimensional data.

10. The medium of any of the previous clauses, wherein:

the one or more parameters are semiconductor manufacturing process parameters;

the one or more input models and/or the one or more output models comprise dense feed-forward layers, convolutional layers, and/or residual network architecture of the modular autoencoder model;

the common model comprises feed forward and/or residual layers; and the prediction model comprises feed forward and/or residual layers.

11. A method for parameter estimation, the method comprising:

processing, with one or more input models of a modular autoencoder model, one or more inputs to a first level of dimensionality suitable for combination with other inputs;

combining, with a common model of the modular autoencoder model, the processed inputs and reducing a dimensionality of the combined processed inputs to generate low dimensional data in a latent space, the low dimensional data in the latent space having a second level of resulting reduced dimensionality that is less than the first level;

expanding, with the common model, the low dimensional data in the latent space into one or more expanded versions of the one or more inputs, the one or more expanded versions of the one or more inputs having increased dimensionality compared to the low dimensional data in the latent space, the one or more expanded versions of the one or more inputs suitable for generating one or more different outputs;

using, with one or more output models of the modular autoencoder model, the one or more expanded versions of the one or more inputs to generate the one or more different outputs, the one or more different outputs being approximations of the one or more inputs, the one or more different outputs having the same or increased dimensionality compared to the expanded versions of the one or more inputs; and estimating, with a prediction model of the modular autoencoder model, one or more parameters based on the low dimensional data in the latent space and/or the one or more outputs.

12. The method of any of the previous clauses, wherein individual input models and/or output models comprise two or more sub-models, the two or more sub-models associated with different portions of a sensing operation and/or a manufacturing process.

13. The method of any of the previous clauses, wherein an individual output model comprises the two or more sub-models, and the two or more sub-models comprise a sensor model and a stack model for a semiconductor sensor operation.

14. The method of any of the previous clauses, wherein the one or more input models, the common model, and the one or more output models are separate from each other and correspond to process physics differences in different parts of a manufacturing process and/or a sensing operation such that each of the one or more input models, the common model, and/or the one or more output models can be trained together and/or separately, but individually configured based on the process physics for a corresponding part of the manufacturing process and/or sensing operation, apart from other models in the modular autoencoder model.

15. The method of any of the previous clauses, further comprising determining a quantity of the one or more input models, and/or a quantity of the one or more output models, based on process physics differences in different parts of a manufacturing process and/or a sensing operation.

16. The method of any of the previous clauses, wherein the quantity of input models is different than the quantity of output models.

17. The method of any of the previous clauses, wherein:

the common model comprises encoder-decoder architecture and/or variational encoder-decoder architecture;

processing the one or more inputs to the first level of dimensionality, and reducing the dimensionality of the combined processed inputs comprises encoding; and expanding the low dimensional data in the latent space into the one or more expanded versions of the one or more inputs comprises decoding.

18. The method of any of the previous clauses, further comprising training the modular autoencoder model by comparing the one or more different outputs to corresponding inputs, and adjusting a parameterization of the one or more input models, the common model, and/or the one or more output models to reduce or minimize a difference between an output and a corresponding input.

19. The method of any of the previous clauses, wherein the common model comprises an encoder and a decoder, the method further comprising training the modular autoencoder model by:

applying variation to the low dimensional data in the latent space such that the common model decodes a relatively more continuous latent space to generate a decoder signal;

recursively providing the decoder signal to the encoder to generate new low dimensional data;

comparing the new low dimensional data to the low dimensional data; and adjusting one or more components of the modular autoencoder model based on the comparison to reduce or minimize a difference between the new low dimensional data and the low dimensional data.

20. The method of any of the previous clauses, wherein:

the one or more parameters are semiconductor manufacturing process parameters;

the one or more input models and/or the one or more output models comprise dense feed-forward layers, convolutional layers, and/or residual network architecture of the modular autoencoder model;

the common model comprises feed forward and/or residual layers; and the prediction model comprises feed forward and/or residual layers.

21. A system comprising:

one or more input models of a modular autoencoder model configured to process one or more inputs to a first level of dimensionality suitable for combination with other inputs;

a common model of the modular autoencoder model configured to:

combine the processed inputs and reduce a dimensionality of the combined processed inputs to generate low dimensional data in a latent space, the low dimensional data in the latent space having a second level of resulting reduced dimensionality that is less than the first level;

expand the low dimensional data in the latent space into one or more expanded versions of the one or more inputs, the one or more expanded versions of the one or more inputs having increased dimensionality compared to the low dimensional data in the latent space, the one or more expanded versions of the one or more inputs suitable for generating one or more different outputs;

one or more output models of the modular autoencoder model configured to use the one or more expanded versions of the one or more inputs to generate the one or more different outputs, the one or more different outputs being approximations of the one or more inputs, the one or more different outputs having the same or increased dimensionality compared to the expanded versions of the one or more inputs; and a prediction model of the modular autoencoder model configured to estimate one or more parameters based on the low dimensional data in the latent space and/or the one or more outputs.

22. The system of any of the previous clauses, wherein individual input models and/or output models comprise two or more sub-models, the two or more sub-models associated with different portions of a sensing operation and/or a manufacturing process.

23. The system of any of the previous clauses, wherein an individual output model comprises the two or more sub-models, and the two or more sub-models comprise a sensor model and a stack model for a semiconductor sensor operation.

24. The system of any of the previous clauses, wherein the one or more input models, the common model, and the one or more output models are separate from each other and correspond to process physics differences in different parts of a manufacturing process and/or a sensing operation such that each of the one or more input models, the common model, and/or the one or more output models can be trained together and/or separately, but individually configured based on the process physics for a corresponding part of the manufacturing process and/or sensing operation, apart from other models in the modular autoencoder model.

25. The system of any of the previous clauses, wherein a quantity of the one or more input models, and a quantity of the one or more output models are determined based on process physics differences in different parts of a manufacturing process and/or a sensing operation.

26. The system of any of the previous clauses, wherein the quantity of input models is different than the quantity of output models.

27. The system of any of the previous clauses, wherein:

the common model comprises encoder-decoder architecture and/or variational encoder-decoder architecture;

processing the one or more inputs to the first level of dimensionality, and reducing the dimensionality of the combined processed inputs comprises encoding; and expanding the low dimensional data in the latent space into the one or more expanded versions of the one or more inputs comprises decoding.

28. The system of any of the previous clauses, wherein the modular autoencoder model is trained by comparing the one or more different outputs to corresponding inputs, and adjusting a parameterization of the one or more input models, the common model, and/or the one or more output models to reduce or minimize a difference between an output and a corresponding input.

29. The system of any of the previous clauses, wherein the common model comprises an encoder and a decoder, and wherein the modular autoencoder model is trained by:

applying variation to the low dimensional data in the latent space such that the common model decodes a relatively more continuous latent space to generate a decoder signal;

recursively providing the decoder signal to the encoder to generate new low dimensional data;

comparing the new low dimensional data to the low dimensional data; and adjusting one or more components of the modular autoencoder model based on the comparison to reduce or minimize a difference between the new low dimensional data and the low dimensional data.

30. The system of any of the previous clauses, wherein:

the one or more parameters are semiconductor manufacturing process parameters;

the one or more input models and/or the one or more output models comprise dense feed-forward layers, convolutional layers, and/or residual network architecture of the modular autoencoder model;

the common model comprises feed forward and/or residual layers; and the prediction model comprises feed forward and/or residual layers.

31. A non-transitory computer readable medium having instructions thereon, the instructions configured to cause a computer to execute a machine-learning model for parameter estimation, the machine-learning model comprising:

one or more first models configured to process one or more inputs to a first level of dimensionality suitable for combination with other inputs;

a second model configured to:

combine the processed one or more inputs and reduce a dimensionality of the combined processed one or more inputs;

expand the combined processed one or more inputs into one or more recovered versions of the one or more inputs, the one or more recovered versions of the one or more inputs suitable for generating one or more different outputs;

one or more third models configured to use the one or more recovered versions of the one or more inputs to generate the one or more different outputs; and a fourth model configured to estimate a parameter based on the reduced dimensionality combined compressed inputs and the one or more different outputs.

32. The medium of any of the previous clauses, wherein individual models of the one or more third models comprise two or more sub-models, the two or more sub-models associated with different portions of a manufacturing process and/or sensing operation.

33. The medium of any of the previous clauses, wherein the two or more sub-models comprise a sensor model and a stack model for a semiconductor manufacturing process.

34. The medium of any of the previous clauses, wherein the one or more first models, the second model, and the one or more third models are separate from each other and correspond to process physics differences in different parts of a manufacturing process and/or sensing operation such that each of the one or more first models, the second model, and/or the one or more third models can be trained together and/or separately, but individually configured based on the process physics for a corresponding part of the manufacturing process and/or sensing operation, apart from other models in the machine-learning model.

35. The medium of any of the previous clauses, wherein a quantity of the one or more first models, and a quantity of the one or more third models are determined based on process physics differences in different parts of a manufacturing process and/or sensing operation.

36. The medium of any of the previous clauses, wherein the number of first models is different that the number of second models.

37. The medium of any of any of the previous clauses, wherein:

the second model comprises encoder-decoder architecture and/or variational encoder-decoder architecture;

compressing the one or more inputs comprises encoding; and expanding the combined compressed one or more inputs into one or more recovered versions of the one or more inputs comprises decoding.

38. The medium of any of the previous clauses, wherein the machine learning model is trained by comparing the one or more different outputs to corresponding inputs, and adjusting the one or more first models, the second model, and/or the one or more third models to reduce or minimize a difference between an output and a corresponding input.

39. The medium of any of the previous clauses, wherein the second model comprises an encoder and a decoder, and wherein the second model is trained by:

applying variation low dimensional data in a latent space such that the second model decodes a relatively more continuous latent space to generate a decoder signal;

recursively providing the decoder signal to the encoder to generate new low dimensional data;

comparing the new low dimensional data to the low dimensional data; and adjusting the second model based on the comparison to reduce or minimize a difference between the new low dimensional data and the low dimensional data.

40. The medium of any of the previous clauses, wherein:

the parameter is a semiconductor manufacturing process parameter;

the one or more first models and/or the one or more third models comprise dense feed-forward layers, convolutional layers, and/or residual network architecture of the machine-learning model;

the second model comprises feed forward and/or residual layers; and the fourth model comprises feed forward and/or residual layers.

41. A non-transitory computer readable medium having instructions thereon, the instructions configured to cause a computer to execute a modular autoencoder model for estimating parameters of interest from a combination of available channels of measurement data from an optical metrology platform by estimating retrievable quantities of information content using a subset of a plurality of input models based on the available channels, the instructions causing operations comprising:

causing the plurality of input models to compress a plurality of inputs based on the available channels such that the plurality of inputs are suitable for combination with each other; and causing a common model to combine the compressed inputs and generate low dimensional data in a latent space based on the combined compressed inputs, wherein the low dimensional data estimates the retrievable quantities, and wherein the low dimensional data in the latent space is configured to be used by one or more additional models to generate approximations of the plurality of inputs and/or estimate a parameter based on the low dimensional data.

42. The medium of any of the previous clauses, the instructions causing further operations comprising:

training the modular autoencoder model by:

iteratively varying a subset of compressed inputs to be combined by the common model and used to generate training low dimensional data;

comparing one or more training approximations and/or a training parameter generated or predicted based on the training low dimensional data to a corresponding reference; and adjusting one or more of the plurality of input models, the common model, and/or one or more of the additional models based on the comparison to reduce or minimize a difference between the one or more training approximations and/or the training parameter and the reference;

such that the common model is configured to combine the compressed inputs and generate the low dimensional data for generating the approximations and/or estimated parameter regardless of which ones of the plurality of inputs are combined by the common model.

43. The medium of any of the previous clauses, wherein variation for individual iterations is random, or wherein variation for individual iterations is varied in a statistically meaningful way.

44. The medium of any of the previous clauses, wherein variation for individual iterations is configured such that after a target number of iterations, each of the compressed inputs has been included in the subset of compressed inputs at least once.

45. The medium of any of the previous clauses, wherein iteratively varying a subset of compressed inputs combined by the common model and used to generate training low dimensional data comprises channel selection from among a set of possible available channels, the set of possible available channels associated with the optical metrology platform.

46. The medium of any of the previous clauses, wherein the iteratively varying, the comparing, and the adjusting, are repeated until an objective converges.

47. The medium of any of the previous clauses, wherein the iteratively varying, the comparing, and the adjusting are configured to reduce or eliminate bias that can occur for a combinatorial search across channels.

48. The medium of any of the previous clauses, wherein the one or more additional models comprises one or more output models configured to generate approximations of the one or more inputs, and a prediction model configured to estimate the parameter based on the low dimensional data, and wherein one or more of the plurality of input models, the common model, and/or the additional models are configured to be adjusted to reduce or minimize a difference between one or more training approximations, and/or a training manufacturing process parameter, and a corresponding reference.

49. The medium of any of the previous clauses, wherein the plurality of input models, the common model, and the one or more output models are separate from each other and correspond to process physics differences in different parts of a manufacturing process and/or sensing operation such that each of the plurality of input models, the common model, and/or the one or more output models can be trained together and/or separately, but individually configured based on the process physics for a corresponding part of the manufacturing process and/or sensing operation, apart from other models in the modular autoencoder model.

50. The medium of any of the previous clauses, wherein:

individual input models comprise a neural network block comprising dense feed-forward layers, convolutional layers, and/or residual network architecture of the modular autoencoder model; and the common model comprises a neural network block comprising feed forward and/or residual layers.

51. A method for estimating parameters of interest from a combination of available channels of measurement data from an optical metrology platform by estimating retrievable quantities of information content using a subset of a plurality of input models of a modular autoencoder model based on the available channels, the method comprising:

causing the plurality of input models to compress a plurality of inputs based on the available channels such that the plurality of inputs are suitable for combination with each other; and causing a common model of the modular autoencoder model to combine the compressed inputs and generate low dimensional data in a latent space based on the combined compressed inputs, wherein the low dimensional data estimates the retrievable quantities, and wherein the low dimensional data in the latent space is configured to be used by one or more additional models to generate approximations of the plurality of inputs and/or estimate a parameter based on the low dimensional data.

52. The method of any of the previous clauses, the method further comprising:

training the modular autoencoder model by:

iteratively varying a subset of compressed inputs to be combined by the common model and used to generate training low dimensional data;

comparing one or more training approximations and/or a training parameter generated or predicted based on the training low dimensional data to a corresponding reference; and adjusting one or more of the plurality of input models, the common model, and/or one or more of the additional models based on the comparison to reduce or minimize a difference between the one or more training approximations and/or the training parameter and the reference;

such that the common model is configured to combine the compressed inputs and generate the low dimensional data for generating the approximations and/or estimated parameter regardless of which ones of the plurality of inputs are combined by the common model.

53. The method of any of the previous clauses, wherein variation for individual iterations is random, or wherein variation for individual iterations is varied in a statistically meaningful way.

54. The method of any of the previous clauses, wherein variation for individual iterations is configured such that after a target number of iterations, each of the compressed inputs has been included in the subset of compressed inputs at least once.

55. The method of any of the previous clauses, wherein iteratively varying a subset of compressed inputs combined by the common model and used to generate training low dimensional data comprises channel selection from among a set of possible available channels, the set of possible available channels associated with the optical metrology platform.

56. The method of any of the previous clauses, wherein the iteratively varying, the comparing, and the adjusting, are repeated until an objective converges.

57. The method of any of the previous clauses, wherein the iteratively varying, the comparing, and the adjusting are configured to reduce or eliminate bias that can occur for a combinatorial search across channels.

58. The method of any of the previous clauses, wherein the one or more additional models comprises one or more output models configured to generate approximations of the one or more inputs, and a prediction model configured to estimate the parameter based on the low dimensional data, and wherein one or more of the plurality of input models, the common model, and/or the additional models are configured to be adjusted to reduce or minimize a difference between one or more training approximations, and/or a training manufacturing process parameter, and a corresponding reference.

59. The method of any of the previous clauses, wherein the plurality of input models, the common model, and the one or more output models are separate from each other and correspond to process physics differences in different parts of a manufacturing process and/or sensing operation such that each of the plurality of input models, the common model, and/or the one or more output models can be trained together and/or separately, but individually configured based on the process physics for a corresponding part of the manufacturing process and/or sensing operation, apart from other models in the modular autoencoder model.

60. The method of any of the previous clauses, wherein:

individual input models comprise a neural network block comprising dense feed-forward layers, convolutional layers, and/or residual network architecture of the modular autoencoder model; and the common model comprises a neural network block comprising feed forward and/or residual layers.

61. A system for estimating parameters of interest from a combination of available channels of measurement data from an optical metrology platform by estimating retrievable quantities of information content using a subset of a plurality of input models of a modular autoencoder model based on the available channels, the system comprising:

the plurality of input models, the plurality of input models configured to compress a plurality of inputs based on the available channels such that the plurality of inputs are suitable for combination with each other; and a common model of the modular autoencoder model configured to combine the compressed inputs and generate low dimensional data in a latent space based on the combined compressed inputs, wherein the low dimensional data estimates the retrievable quantities, and wherein the low dimensional data in the latent space is configured to be used by one or more additional models to generate approximations of the plurality of inputs and/or estimate a parameter based on the low dimensional data.

62. The system of any of the previous clauses, wherein the modular autoencoder model is configured to be trained by:

iteratively varying a subset of compressed inputs to be combined by the common model and used to generate training low dimensional data;

comparing one or more training approximations and/or a training parameter generated or predicted based on the training low dimensional data to a corresponding reference; and adjusting one or more of the plurality of input models, the common model, and/or one or more of the additional models based on the comparison to reduce or minimize a difference between the one or more training approximations and/or the training parameter and the reference;

such that the common model is configured to combine the compressed inputs and generate the low dimensional data for generating the approximations and/or estimated parameter regardless of which ones of the plurality of inputs are combined by the common model.

63. The system of any of the previous clauses, wherein variation for individual iterations is random, or wherein variation for individual iterations is varied in a statistically meaningful way.

64. The system of any of the previous clauses, wherein variation for individual iterations is configured such that after a target number of iterations, each of the compressed inputs has been included in the subset of compressed inputs at least once.

65. The system of any of the previous clauses, wherein iteratively varying a subset of compressed inputs combined by the common model and used to generate training low dimensional data comprises channel selection from among a set of possible available channels, the set of possible available channels associated with the optical metrology platform.

66. The system of any of the previous clauses, wherein the iteratively varying, the comparing, and the adjusting, are repeated until an objective converges.

67. The system of any of the previous clauses, wherein the iteratively varying, the comparing, and the adjusting are configured to reduce or eliminate bias that can occur for a combinatorial search across channels.

68. The system of any of the previous clauses, wherein the one or more additional models comprise one or more output models configured to generate approximations of the one or more inputs, and a prediction model configured to estimate the parameter based on the low dimensional data, and wherein one or more of the plurality of input models, the common model, and/or the additional models are configured to be adjusted to reduce or minimize a difference between one or more training approximations, and/or a training manufacturing process parameter, and a corresponding reference.

69. The system of any of the previous clauses, wherein the plurality of input models, the common model, and the one or more output models are separate from each other and correspond to process physics differences in different parts of a manufacturing process and/or sensing operation such that each of the plurality of input models, the common model, and/or the one or more output models can be trained together and/or separately, but individually configured based on the process physics for a corresponding part of the manufacturing process and/or sensing operation, apart from other models in the modular autoencoder model.

70. The system of any of the previous clauses, wherein:

individual input models comprise a neural network block comprising dense feed-forward layers, convolutional layers, and/or residual network architecture of the modular autoencoder model; and the common model comprises a neural network block comprising feed forward and/or residual layers.

71. A non-transitory computer readable medium having instructions thereon, the instructions configured to cause a computer to execute a modular autoencoder model for parameter estimation, the instructions causing operations comprising:

causing a plurality of input models to compress a plurality of inputs such that the plurality of inputs are suitable for combination with each other; and causing a common model to combine the compressed inputs and generate low dimensional data in a latent space based on the combined compressed inputs, the low dimensional data in the latent space configured to be used by one or more additional models to generate approximations of the one or more inputs and/or predict the parameter based on the low dimensional data, wherein the common model is configured to combine the compressed inputs and generate the low dimensional data regardless of which ones of the plurality of inputs are combined by the common model.

72. The medium of any of the previous clauses, the instructions causing further operations comprising:

training the modular autoencoder by:

iteratively varying a subset of compressed inputs to be combined by the common model and used to generate training low dimensional data;

comparing one or more training approximations and/or a training parameter generated or estimated based on the training low dimensional data to a corresponding reference; and adjusting one or more of the plurality of input models, the common model, and/or the additional models based on the comparison to reduce or minimize a difference between the one or more training approximations, and/or the training parameter, and the reference;

such that the common model is configured to combine the compressed inputs and generate the low dimensional data for generating the approximations and/or estimating a process parameter regardless of which ones of the plurality of inputs are combined by the common model.

73. The medium of any of the previous clauses, wherein variation for individual iterations is random, or wherein variation for individual iterations is varied in a statistically meaningful way.

74. The medium of any of the previous clauses, wherein variation for individual iterations is configured such that after a target number of iterations, each of the compressed inputs has been included in the subset of compressed inputs at least once.

75. The medium of any of the previous clauses, wherein the one or more additional models comprises one or more output models configured to generate approximations of the one or more inputs, and a prediction model configured to estimate a parameter based on the low dimensional data, and wherein adjusting one or more of the plurality of input models, the common model, and/or the additional models based on the comparison to reduce or minimize a difference between the one or more training approximations and/or the training parameter, and the reference, comprises adjusting at least one output model and/or the prediction model.

76. The medium of any of the previous clauses, wherein the plurality of input models, the common model, and the one or more output models are separate from each other and correspond to process physics differences in different parts of a manufacturing process and/or sensing operation such that each of the plurality of input models, the common model, and/or the one or more output models can be trained together and/or separately, but individually configured based on the process physics for a corresponding part of the manufacturing process and/or sensing operation, apart from other models in the modular autoencoder model.

77. The medium of any of the previous clauses, wherein iteratively varying a subset of compressed inputs combined by the common model and used to generate training low dimensional data comprises channel selection from among a set of possible channels, the set of possible channels associated with one or more aspects of a semiconductor manufacturing process and/or sensing operation.

78. The medium of any of the previous clauses, wherein the iteratively varying, the comparing, and the adjusting are repeated until an objective converges.

79. The medium of any of the previous clauses, wherein the iteratively varying, the comparing, and the adjusting are configured to reduce or eliminate bias relative to a bias that can occur for a combinatorial search across channels.

80. The medium of any of the previous clauses, wherein:

the parameter is a semiconductor manufacturing process parameter;

individual input models comprise a neural network block comprising dense feed-forward layers, convolutional layers, and/or residual network architecture of the modular autoencoder model; and the common model comprises a neural network block comprising feed forward and/or residual layers.

81. A non-transitory computer readable medium having instructions thereon, the instructions configured to cause a computer to execute a modular autoencoder model with an extended range of applicability for estimating parameters of interest for optical metrology operations by enforcing known properties of inputs to the modular autoencoder model in a decoder of the modular autoencoder model, the instructions causing operations comprising:

causing an encoder of the modular autoencoder model to encode an input to generate a low dimensional representation of the input in a latent space; and causing the decoder of the modular autoencoder model to generate an output corresponding to the input by decoding the low dimensional representation, wherein the decoder is configured to enforce, during decoding, a known property of the encoded input to generate the output, wherein the known property is associated with a known physical relationship between the low dimensional representation in the latent space and the output, and wherein a parameter of interest is estimated based on the output and/or the low dimensional representation of the input in the latent space.

82. The medium of any of the previous clauses, wherein enforcing comprises penalizing differences between the output and an output that should be generated according to the known property using a penalty term in a cost function associated with the decoder.

83. The medium of any of the previous clauses, wherein the penalty term comprises a difference between decoded versions of the low dimensional representation of the input which are related to each other through physical priors.

84. The medium of any of the previous clauses, wherein the known property is a known symmetry property, and wherein the penalty term comprises a difference between decoded versions of the low dimensional representation of the input which are reflected across, or rotated around, a point of symmetry, relative to each other.

85. The medium of any of the previous clauses, wherein the encoder and/or the decoder are configured to be adjusted based on any differences between the decoded versions of the low dimensional representation, wherein adjusting comprises adjusting at least one weight associated with a layer of the encoder and/or the decoder.

86. The medium of any of the previous clauses, wherein the input comprises a sensor signal associated with a sensing operation in a semiconductor manufacturing process, the low dimensional representation of the input is a compressed representation of the sensor signal, and the output is an approximation of the input sensor signal.

87. The medium of any of the previous clauses, wherein the sensor signal comprises a pupil image, and wherein an encoded representation of the pupil image is configured to be used to estimate overlay (as one example of many possible parameters of interest).

88. The medium of any of the previous clauses, wherein the instructions cause further operations comprising:

processing, with an input model of the modular autoencoder model, the input to a first level of dimensionality suitable for combination with other inputs, and providing the processed input to the encoder;

receiving, with an output model of the modular autoencoder model, an expanded version of the input from the decoder and generating an approximation of the input based on the expanded version; and estimating, with a prediction model of the modular autoencoder model, the parameter of interest based on the low dimensional representation of the input in the latent space and/or the output (the output comprising and/or being related to the approximation of the input).

89. The medium of any of the previous clauses, wherein the input model, the encoder/decoder, and the output model are separate from each other and correspond to process physics differences in different parts of a manufacturing process and/or a sensing operation such that each of the input model, the encoder/decoder, and/or the output model can be trained together and/or separately, but individually configured based on the process physics for a corresponding part of the manufacturing process and/or sensing operation, apart from other models in the modular autoencoder model.

90. The medium of any of the previous clauses, wherein the decoder is configured to enforce a known symmetry property of the encoded input during a training phase, such that the modular autoencoder model obeys the enforced known symmetry property during an inference phase.

91. A method for estimating, with a modular autoencoder model having an extended range of applicability, parameters of interest for optical metrology operations by enforcing known properties of inputs to the modular autoencoder model in a decoder of the modular autoencoder model, the instructions causing operations comprising:

causing an encoder of the modular autoencoder model to encode an input to generate a low dimensional representation of the input in a latent space; and causing the decoder of the modular autoencoder model to generate an output corresponding to the input by decoding the low dimensional representation, wherein the decoder is configured to enforce, during decoding, a known property of the encoded input to generate the output, wherein the known property is associated with a known physical relationship between the low dimensional representation in the latent space and the output, and wherein a parameter of interest is estimated based on the output and/or the low dimensional representation of the input in the latent space.

92. The method of any of the previous clauses, wherein enforcing comprises penalizing differences between the output and an output that should be generated according to the known property using a penalty term in a cost function associated with the decoder.

93. The method of any of the previous clauses, wherein the penalty term comprises a difference between decoded versions of the low dimensional representation of the input which are related to each other through physical priors.

94. The method of any of the previous clauses, wherein the known property is a known symmetry property, and wherein the penalty term comprises a difference between decoded versions of the low dimensional representation of the input which are reflected across, or rotated around, a point of symmetry, relative to each other.

95. The method of any of the previous clauses, wherein the encoder and/or the decoder are configured to be adjusted based on any differences between the decoded versions of the low dimensional representation, wherein adjusting comprises adjusting at least one weight associated with a layer of the encoder and/or the decoder.

96. The method of any of the previous clauses, wherein the input comprises a sensor signal associated with a sensing operation in a semiconductor manufacturing process, the low dimensional representation of the input is a compressed representation of the sensor signal, and the output is an approximation of the input sensor signal.

97. The method of any of the previous clauses, wherein the sensor signal comprises a pupil image, and wherein an encoded representation of the pupil image is configured to be used to estimate overlay (as one example of many possible parameters of interest).

98. The method of any of the previous clauses, the method further comprising:

processing, with an input model of the modular autoencoder model, the input to a first level of dimensionality suitable for combination with other inputs, and providing the processed input to the encoder;

receiving, with an output model of the modular autoencoder model, an expanded version of the input from the decoder and generating an approximation of the input based on the expanded version; and estimating, with a prediction model of the modular autoencoder model, the parameter of interest based on the low dimensional representation of the input in the latent space and/or the output (the output comprising and/or being related to the approximation of the input).

99. The method of any of the previous clauses, wherein the input model, the encoder/decoder, and the output model are separate from each other and correspond to process physics differences in different parts of a manufacturing process and/or a sensing operation such that each of the input model, the encoder/decoder, and/or the output model can be trained together and/or separately, but individually configured based on the process physics for a corresponding part of the manufacturing process and/or sensing operation, apart from other models in the modular autoencoder model.

100. The method of any of the previous clauses, wherein the decoder is configured to enforce a known symmetry property of the encoded input during a training phase, such that the modular autoencoder model obeys the enforced known symmetry property during an inference phase.

101. A system configured to execute a modular autoencoder model with an extended range of applicability for estimating parameters of interest for optical metrology operations by enforcing known properties of inputs to the modular autoencoder model in a decoder of the modular autoencoder model, the system comprising:

an encoder of the modular autoencoder model configured to encode an input to generate a low dimensional representation of the input in a latent space; and the decoder of the modular autoencoder model, the decoder configured to generate an output corresponding to the input by decoding the low dimensional representation, wherein the decoder is configured to enforce, during decoding, a known property of the encoded input to generate the output, wherein the known property is associated with a known physical relationship between the low dimensional representation in the latent space and the output, and wherein a parameter of interest is estimated based on the output and/or the low dimensional representation of the input in the latent space.

102. The system of any of the previous clauses, wherein enforcing comprises penalizing differences between the output and an output that should be generated according to the known property using a penalty term in a cost function associated with the decoder.

103. The system of any of the previous clauses, wherein the penalty term comprises a difference between decoded versions of the low dimensional representation of the input which are related to each other through physical priors.

104. The system of any of the previous clauses, wherein the known property is a known symmetry property, and wherein the penalty term comprises a difference between decoded versions of the low dimensional representation of the input which are reflected across, or rotated around, a point of symmetry, relative to each other.

105. The system of any of the previous clauses, wherein the encoder and/or the decoder are configured to be adjusted based on any differences between the decoded versions of the low dimensional representation, wherein adjusting comprises adjusting at least one weight associated with a layer of the encoder and/or the decoder.

106. The system of any of the previous clauses, wherein the input comprises a sensor signal associated with a sensing operation in a semiconductor manufacturing process, the low dimensional representation of the input is a compressed representation of the sensor signal, and the output is an approximation of the input sensor signal.

107. The system of any of the previous clauses, wherein the sensor signal comprises a pupil image, and wherein an encoded representation of the pupil image is configured to be used to estimate overlay (as one example of many possible parameters of interest).

108. The system of any of the previous clauses, further comprising:

an input model of the modular autoencoder model configured to process the input to a first level of dimensionality suitable for combination with other inputs, and provide the processed input to the encoder;

an output model of the modular autoencoder model configured to receive an expanded version of the input from the decoder and generate an approximation of the input based on the expanded version; and a prediction model of the modular autoencoder model configured to estimate the parameter of interest based on the low dimensional representation of the input in the latent space.

109. The system of any of the previous clauses, wherein the input model, the encoder/decoder, and the output model are separate from each other and correspond to process physics differences in different parts of a manufacturing process and/or a sensing operation such that each of the input model, the encoder/decoder, and/or the output model can be trained together and/or separately, but individually configured based on the process physics for a corresponding part of the manufacturing process and/or sensing operation, apart from other models in the modular autoencoder model.

110. The system of any of the previous clauses, wherein the decoder is configured to enforce a known symmetry property of the encoded input during a training phase, such that the modular autoencoder model obeys the enforced known symmetry property during an inference phase.

111. A non-transitory computer readable medium having instructions thereon, the instructions configured to cause a computer to execute a modular autoencoder model, the modular autoencoder model configured to generate an output based on an input, the instructions causing operations comprising:

causing an encoder of the modular autoencoder model to encode the input to generate a low dimensional representation of the input in a latent space; and causing a decoder of the modular autoencoder model to generate the output by decoding the low dimensional representation, wherein the decoder is configured to enforce, during decoding, a known property of the encoded input to generate the output, the known property associated with a known physical relationship between the low dimensional representation in the latent space and the output.

112. The medium of any of the previous clauses, wherein enforcing comprises penalizing differences between the output and an output that should be generated according to the known property using a penalty term in a cost function associated with the decoder.

113. The medium of any of the previous clauses, wherein the penalty term comprises a difference between decoded versions of the low dimensional representation of the input which are which are related to each other through physical priors.

114. The medium of any of the previous clauses, wherein the encoder and/or the decoder are configured to be adjusted based on any differences between the decoded versions of the low dimensional representation, wherein adjusting comprises adjusting at least one weight associated with a layer of the encoder and/or the decoder.

115. The medium of any of the previous clauses, wherein the input comprises a sensor signal associated with a sensing operation in a semiconductor manufacturing process, the low dimensional representation of the input is a compressed representation of the sensor signal, and the output is an approximation of the input sensor signal.

116. The medium of any of the previous clauses, wherein the sensor signal comprises a pupil image, and wherein an encoded representation of the pupil image is configured to be used to estimate overlay (as one example of many possible parameters of interest).

117. The medium of any of the previous clauses, wherein the modular autoencoder model further comprises:

an input model configured to process the input to a first level of dimensionality suitable for combination with other inputs, and provide the processed input to the encoder;

an output model configured to receive an expanded version of the input from the decoder and generate the approximation of the input based on the expanded version; and a prediction model configured to estimate a manufacturing process parameter based on the low dimensional representation of the input in the latent space.

118. The medium of any of the previous clauses, wherein:

the parameter is a semiconductor manufacturing process parameter;

the input model comprises a neural network block comprising dense feed-forward layers, convolutional layers, and/or residual network architecture of the modular autoencoder model;

the encoder and/or decoder comprises a neural network block comprising feed forward and/or residual layers; and the prediction model comprises a neural network block comprising feed forward and/or residual layers.

119. The medium of any of the previous clauses, wherein the input model, the encoder/decoder, and the output model are separate from each other and correspond to process physics differences in different parts of a manufacturing process and/or a sensing operation such that each of the input model, the encoder/decoder, and/or the output model can be trained together and/or separately, but individually configured based on the process physics for a corresponding part of the manufacturing process and/or sensing operation, apart from other models in the modular autoencoder model.

120. The medium of any of the previous clauses, wherein the decoder is configured to enforce a known symmetry property of the encoded input during a training phase, such that the modular autoencoder model obeys the enforced known symmetry property during an inference phase.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers, and/or metrology systems. In addition, the combination and sub-combinations of disclosed elements may comprise separate embodiments. For example, predicting a complex electric field image and determining a metrology metric such as overlay may be performed by the same parameterized model and/or different parameterized models. These features may comprise separate embodiments, and/or these features may be used together in the same embodiment.

Although specific reference may be made in this text to embodiments of the invention in the context of a metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography. While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A non-transitory computer readable medium having instructions thereon, the instructions configured to cause a computer to execute a modular autoencoder model for estimating parameters of interest from a combination of available channels of measurement data from an optical metrology platform by estimating retrievable quantities of information content using a subset of a plurality of input models based on the available channels, the instructions causing operations comprising:

causing the plurality of input models to compress a plurality of inputs based on the available channels such that the plurality of inputs are suitable for combination with each other; and causing a common model to combine the compressed inputs and generate low dimensional data in a latent space based on the combined compressed inputs, wherein the low dimensional data estimates the retrievable quantities, and wherein the low dimensional data in the latent space is configured to be used by one or more additional models to generate approximations of the plurality of inputs and/or estimate a parameter based on the low dimensional data.

2. The medium of claim 1, the instructions causing further operations comprising:

training the modular autoencoder model by:

iteratively varying a subset of compressed inputs to be combined by the common model and used to generate training low dimensional data;

comparing one or more training approximations and/or a training parameter generated or predicted based on the training low dimensional data to a corresponding reference; and adjusting one or more of the plurality of input models, the common model, and/or one or more of the additional models based on the comparison to reduce or minimize a difference between the one or more training approximations and/or the training parameter and the reference;

such that the common model is configured to combine the compressed inputs and generate the low dimensional data for generating the approximations and/or estimated parameter regardless of which ones of the plurality of inputs are combined by the common model.

3. The medium of claim 2, wherein variation for individual iterations is random or is varied in a statistically meaningful way.

4. A method for estimating parameters of interest from a combination of available channels of measurement data from an optical metrology platform by estimating retrievable quantities of information content using a subset of a plurality of input models of a modular autoencoder model based on the available channels, the method comprising:

causing the plurality of input models to compress a plurality of inputs based on the available channels such that the plurality of inputs are suitable for combination with each other; and causing a common model of the modular autoencoder model to combine the compressed inputs and generate low dimensional data in a latent space based on the combined compressed inputs, wherein the low dimensional data estimates the retrievable quantities, and wherein the low dimensional data in the latent space is configured to be used by one or more additional models to generate approximations of the plurality of inputs and/or estimate a parameter based on the low dimensional data.

5. The method of claim 4, the method further comprising:

training the modular autoencoder model by:

iteratively varying a subset of compressed inputs to be combined by the common model and used to generate training low dimensional data;

comparing one or more training approximations and/or a training parameter generated or predicted based on the training low dimensional data to a corresponding reference; and adjusting one or more of the plurality of input models, the common model, and/or one or more of the additional models based on the comparison to reduce or minimize a difference between the one or more training approximations and/or the training parameter and the reference;

such that the common model is configured to combine the compressed inputs and generate the low dimensional data for generating the approximations and/or estimated parameter regardless of which ones of the plurality of inputs are combined by the common model.

6. The method of claim 5, wherein variation for individual iterations is random or is varied in a statistically meaningful way.

7. The method of claim 5, wherein variation for individual iterations is configured such that after a target number of iterations, each of the compressed inputs has been included in the subset of compressed inputs at least once.

8. The method of claim 5, wherein the iteratively varying a subset of compressed inputs combined by the common model and used to generate training low dimensional data comprises channel selection from among a set of possible available channels, the set of possible available channels associated with the optical metrology platform.

9. The method of claim 5, wherein the iteratively varying, the comparing, and the adjusting, are repeated until an objective converges.

10. The method of claim 5, wherein the iteratively varying, the comparing, and the adjusting are configured to reduce or eliminate bias that occurs for a combinatorial search across channels.

11. The method of claim 4, wherein:

the one or more additional models comprises one or more output models configured to generate approximations of the one or more inputs, and a prediction model configured to estimate the parameter based on the low dimensional data, and one or more of the plurality of input models, the common model, and/or the additional models are configured to be adjusted to reduce or minimize a difference between one or more training approximations, and/or a training manufacturing process parameter, and a corresponding reference.

12. The method of claim 11, wherein the plurality of input models, the common model, and the one or more output models are separate from each other and correspond to process physics differences in different parts of a manufacturing process and/or sensing operation such that each of the plurality of input models, the common model, and/or the one or more output models are training together but individually configured based on the process physics for a corresponding part of the manufacturing process and/or sensing operation, apart from other models in the modular autoencoder model.

13. The method claim 4, wherein:

individual input models comprise a neural network block comprising dense feed-forward layers, convolutional layers, and/or residual network architecture of the modular autoencoder model; and the common model comprises a neural network block comprising feed forward and/or residual layers.

14. A system for estimating parameters of interest from a combination of available channels of measurement data from an optical metrology platform by estimating retrievable quantities of information content using a subset of a plurality of input models of a modular autoencoder model based on the available channels, the system comprising:

the plurality of input models, the plurality of input models configured to compress a plurality of inputs based on the available channels such that the plurality of inputs are suitable for combination with each other; and a common model of the modular autoencoder model configured to combine the compressed inputs and generate low dimensional data in a latent space based on the combined compressed inputs, wherein the low dimensional data estimates the retrievable quantities, and wherein the low dimensional data in the latent space is configured to be used by one or more additional models to generate approximations of the plurality of inputs and/or estimate a parameter based on the low dimensional data.

15. A non-transitory computer readable medium having instructions thereon, the instructions configured to cause a computer to execute a modular autoencoder model for parameter estimation, the instructions causing operations comprising:

causing a plurality of input models to compress a plurality of inputs such that the plurality of inputs are suitable for combination with each other; and causing a common model to combine the compressed inputs and generate low dimensional data in a latent space based on the combined compressed inputs, the low dimensional data in the latent space configured to be used by one or more additional models to generate the approximations of the one or more inputs and/or predict the parameter based on the low dimensional data, wherein the common model is configured to combine the compressed inputs and generate the low dimensional data regardless of which ones of the plurality of inputs are combined by the common model.

* * * * *